US008705273B2

(12) United States Patent
Kim et al.

(10) Patent No.: US 8,705,273 B2
(45) Date of Patent: Apr. 22, 2014

(54) NEGATIVE VOLTAGE GENERATOR, DECODER, NONVOLATILE MEMORY DEVICE AND MEMORY SYSTEM USING NEGATIVE VOLTAGE

(75) Inventors: Moosung Kim, Yongin-si (KR); Jaewoo Im, Hwaseong-si (KR); Jae-Duk Yu, Seoul (KR); Kitae Park, Seongnam-si (KR); Ohsuk Kwon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 173 days.

(21) Appl. No.: 13/323,868

(22) Filed: Dec. 13, 2011

(65) Prior Publication Data

US 2012/0155168 A1  Jun. 21, 2012

Related U.S. Application Data

(60) Provisional application No. 61/488,695, filed on Mar. 3, 2011.

(30) Foreign Application Priority Data

Dec. 20, 2010  (KR) .......... 10-2010-0130812
Mar. 2, 2011  (KR) .......... 10-2011-0018584
Apr. 4, 2011  (KR) .......... 10-2011-0030803

(51) Int. Cl.
  *G11C 16/04*  (2006.01)
(52) U.S. Cl.
  USPC .................................................. 365/185.03
(58) Field of Classification Search
  USPC .................................................. 365/185.03
  See application file for complete search history.

(56) References Cited

U.S. PATENT DOCUMENTS

| 6,240,033 | B1 * | 5/2001 | Yang et al. ............. 365/225.7 |
| 7,082,077 | B2 * | 7/2006 | Kato .................. 365/189.03 |
| 7,212,426 | B2 | 5/2007 | Park et al |
| 7,212,434 | B2 | 5/2007 | Umezawa |
| 7,545,678 | B2 | 6/2009 | Lee et al. |
| 7,593,259 | B2 | 9/2009 | Kim |
| 7,649,785 | B2 | 1/2010 | Byeon |
| 8,248,852 | B2 * | 8/2012 | Kim et al. ............. 365/185.11 |
| 2007/0146052 | A1 | 6/2007 | Byeon |
| 2009/0259803 | A1 | 10/2009 | Oh et al. |
| 2009/0306583 | A1 | 12/2009 | Boukhny |
| 2010/0013458 | A1 | 1/2010 | Lany et al. |
| 2010/0078701 | A1 | 4/2010 | Shim et al. |
| 2010/0110815 | A1 | 5/2010 | Lee et al. |

(Continued)

FOREIGN PATENT DOCUMENTS

JP  2002184192  6/2002
JP  2005317138  11/2005

(Continued)

*Primary Examiner* — Hoai V Ho
*Assistant Examiner* — Pablo Huerta
(74) *Attorney, Agent, or Firm* — Volentine & Whitt, PLLC

(57) ABSTRACT

A negative voltage generator includes a direct current voltage generator configured to generate a direct current voltage, a reference voltage generator configured to generate a reference voltage, an oscillator configured to generate an oscillation clock, a charge pump configured to generate a negative voltage in response to a pump clock, and a voltage detector. The voltage detector is configured to detect the negative voltage by comparing a division voltage, obtained by voltage dividing the direct current voltage, with the reference voltage, and to generate the pump clock corresponding to the detected negative voltage based on the oscillation clock.

23 Claims, 73 Drawing Sheets

(56) References Cited

U.S. PATENT DOCUMENTS

| | | |
|---|---|---|
| 2010/0117141 A1 | 5/2010 | Shin et al. |
| 2010/0140685 A1 | 6/2010 | Kang et al. |
| 2010/0213527 A1 | 8/2010 | Shim et al. |
| 2010/0224929 A1 | 9/2010 | Jeong et al. |
| 2010/0229001 A1 | 9/2010 | Park et al. |
| 2010/0229007 A1 | 9/2010 | Park |
| 2010/0259983 A1 | 10/2010 | Yoon et al. |
| 2010/0315875 A1 | 12/2010 | Kim et al. |
| 2010/0322000 A1 | 12/2010 | Shim et al. |
| 2011/0018036 A1 | 1/2011 | Hwang et al. |
| 2011/0051520 A1 | 3/2011 | Kim |
| 2011/0096602 A1* | 4/2011 | Kim et al. ............... 365/185.11 |
| 2013/0010539 A1* | 1/2013 | Shim et al. ............... 365/185.11 |

FOREIGN PATENT DOCUMENTS

| | | |
|---|---|---|
| JP | 2010503944 | 2/2010 |
| KR | 100648553 | 11/2006 |
| KR | 1020080095593 A | 10/2008 |
| KR | 1020090074763 A | 7/2009 |
| KR | 1020100044802 A | 4/2010 |
| KR | 1020100049924 A | 5/2010 |

* cited by examiner

Fig. 36

NEGATIVE VOLTAGE GENERATOR, DECODER, NONVOLATILE MEMORY DEVICE AND MEMORY SYSTEM USING NEGATIVE VOLTAGE

CROSS-REFERENCE TO RELATED APPLICATIONS

A claim of priority under 35 U.S.C §119 is made to U.S. Provisional Application No. 61/488,695 filed Mar. 3, 2011, and to Korean Patent Application Nos. 10-2010-0130812 filed Dec. 20, 2010, 10-2011-0018584 filed Mar. 2, 2011 and 10-2011-0030803 filed Apr. 4, 2011, the entireties of which are incorporated by reference herein.

BACKGROUND

Exemplary embodiments relate to a negative voltage generator, a decoder which utilizes a negative voltage, a nonvolatile memory device, and a memory system.

Semiconductor memory devices are a vital microelectronic component commonly found in digital logic systems, such as computers, and microprocessor-based applications ranging from satellites to consumer electronics. As such, advances in the fabrication of semiconductor memory devices, including process enhancements and circuit-design-related developments that allow scaling to higher memory densities and faster operating speeds, help establish performance standards for other digital logic families.

Semiconductor memory devices are generally categorized as either volatile memory devices or nonvolatile memory devices. Unlike volatile memory devices, nonvolatile memories are capable of retaining storing data in the absence of supplied power. Nonvolatile memory devices, which include permanent and reprogrammable storage modes, are commonly used for program and microcode storage in a wide variety of applications including computers, avionics, telecommunications, and consumer electronics. An example of a nonvolatile memory device is a flash memory device.

Recently, in response to increasing demand for higher density memory devices, multi-bit (or multi-level) memory devices have been developed in which multiple bits (i.e., two or more bits) are stored in each memory cell. A multi-bit flash memory is an example of such a device.

SUMMARY

One aspect of embodiments of the inventive concept is directed to a negative voltage generator which includes a direct current voltage generator configured to generate a direct current voltage, a reference voltage generator configured to generate a reference voltage, an oscillator configured to generate an oscillation clock, a charge pump configured to generate a negative voltage in response to a pump clock, and a voltage detector configured to detect the negative voltage by comparing a division voltage, obtained by voltage division of the direct current voltage, with the reference voltage and to generate the pump clock corresponding to the detected negative voltage based on the oscillation clock.

Another aspect of embodiments of the inventive concept is directed to a nonvolatile memory device which includes a voltage generator circuit including a high voltage generator configured to generate a high voltage and a negative voltage generator configured to generate a negative voltage and a well voltage, and at least one circuit including at least one switch configured to output one of the high voltage and the well voltage in response to an enable signal for applying the negative voltage to a line corresponding to a word line supplied with the negative voltage. The high voltage generator and the negative voltage generator are configured to operate in response to independent oscillation clocks, respectively.

Still another aspect of embodiments of the inventive concept is directed to a row decoder which includes a block word line, a pull-up circuit configured to apply a high voltage to the block word line in response to a voltage transfer enable signal, a pull-down circuit configured to be shut off from the block word line in response to the voltage transfer enable signal and to apply a well voltage to the block word line in response to an inverted version of the voltage transfer enable signal, and a voltage transfer circuit configured to connect a plurality of selection lines with a plurality of word lines based on a voltage of the block word line. Each of the pull-up circuit and the pull-down circuit is formed of at least one n-type active region formed within a p-type well and the p-type well is included within a deep n-type well.

Still another aspect of embodiments of the inventive concept is directed to a nonvolatile memory device which includes at least one first voltage applying pass circuit configured to apply a positive voltage to a first line, and at least one second voltage applying pass circuit configured to apply a negative voltage to a second line. When the negative voltage is applied to the second line, the negative voltage is applied to a well in which the at least one second voltage applying pass circuit is formed.

Still another aspect of embodiments of the inventive concept is directed to a nonvolatile memory device which includes a low voltage generator configured to generate a low voltage in response to a first trim code, a negative voltage generator configured to generate a negative voltage in response to a second trim code, a code converter configured to convert an input read code into one of the first trim code and the second trim code, and a code generator configured to generate the read code.

Still another aspect of embodiments of the inventive concept is directed to a read voltage generating method of a nonvolatile memory device which includes generating a temperature code corresponding to a temperature, correcting a read code using the temperature code, converting the corrected read code into one of a low voltage trim code and a negative trim code, and generating a read voltage in response to the converted read code.

Still another aspect of embodiments of the inventive concept is directed to a memory system which includes a nonvolatile memory device, and a memory controller configured to control the nonvolatile memory device. The nonvolatile memory device includes a negative voltage generator configured to generator a negative voltage, and at least one row decoder. The at least one row decoder includes a pull-up circuit configured to apply a high voltage to a block word line in response to a voltage transfer enable signal, and a pull-down circuit configured to be shut off from the block word line in response to the voltage transfer enable signal and to apply a well voltage to the block word line in response to an inverted version of the voltage transfer enable signal. Each of the pull-up circuit and the pull-down circuit is formed of at least one n-type active region formed within a p-type well and the p-type well is included within a deep n-type well. When the negative voltage is supplied to at least one word line, the well voltage is the negative voltage.

Still another aspect of embodiments of the inventive concept is directed to a program method of a nonvolatile memory device which includes reading first page data from selected memory cells, and programming second page data in the selected memory cells based on the read first page data. At least one of memory cells each having a threshold voltage corresponding to a first negative program state at the reading is programmed to a second negative program state during the programming.

Still another aspect of embodiments of the inventive concept is directed to a nonvolatile memory device including a cell array including a plurality of memory cells arranged at intersections of a plurality of word lines and a plurality of bit lines, a voltage generating circuit configured to provide a word line voltage to the plurality of word lines, an input/output circuit configured to write or read data in or from selected memory cells and connected with the plurality of bit lines, and a control logic configured to control the voltage generating part or the input/output circuit such that selected ones of the plurality of memory cells are programmed to a second negative program state from a first negative program state.

BRIEF DESCRIPTION OF THE FIGURES

The above and other objects and features will become apparent from the following description with reference to the following figures, wherein like reference numerals refer to like parts throughout the various figures unless otherwise specified.

FIG. 36 is a diagram illustrating a nonvolatile memory device according to an exemplary embodiment of the inventive concept.

DETAILED DESCRIPTION

Figure 1:
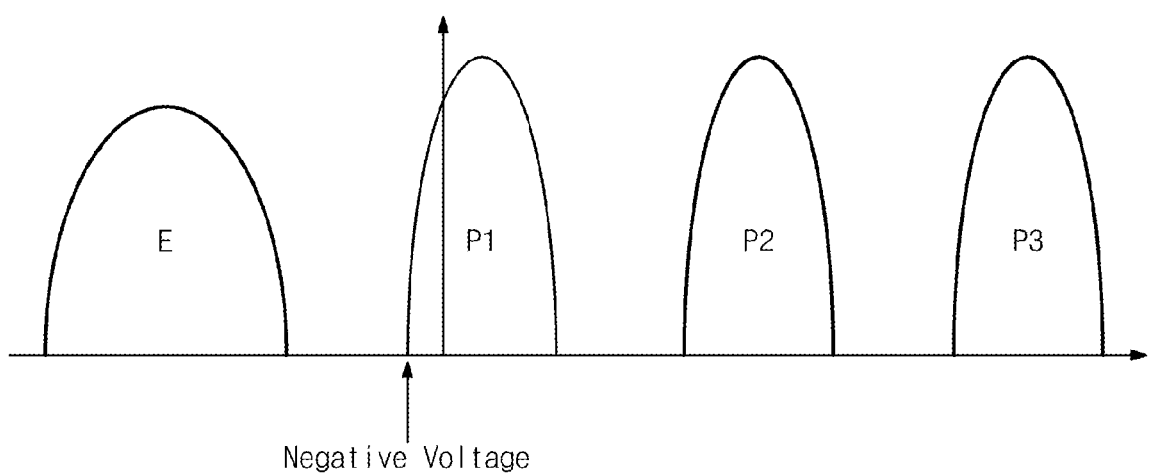
FIG. 1 is a diagram showing threshold voltage distributions of a nonvolatile memory device according to an exemplary embodiment of the inventive concept.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

A nonvolatile memory device according to an exemplary embodiment of the inventive concept may be a NAND flash memory, a vertical NAND flash memory, a NOR flash memory, a resistive random access memory (RRAM), a phase-change RAM (PRAM), a magnetoresistive RAM (MRAM), a ferroelectric RAM (FRAM), a spin transfer torque RAM (STT-RAM), or the like. Below, for ease of description, a nonvolatile memory device is assumed to be a NAND flash memory device.

FIG. 1 is a diagram showing threshold voltage distributions of a nonvolatile memory device according to an exemplary embodiment of the inventive concept. Referring to FIG. 1, a threshold voltage distribution includes an erase state E and program states P1, P2, and P3. Each of the erase state E and the program states P1, P2, and P3 is used to store 2-bit data, i.e., each is assigned a respective two-bit storage value. For example, the erase state is used to store '11', a first program state P1 to store '01', a second program state P2 to store '00', and a third program state P3 to store '10'. However, the states E, P1, P2, and P3 are not limited thereto.

Parameters determining a read/write speed, reliability, and a lifetime of a nonvolatile memory device include a threshold voltage window, a distance between threshold voltages, and a read pass voltage magnitude. Herein, the distance between threshold voltages indicates a difference between an upper limit of a previous program state and a lower limit of an adjacent program state. Meanwhile, the read pass voltage magnitude is a value which exceeds an upper limit of a threshold voltage of a program (e.g., P3) having the largest threshold voltage distribution and minimizes read disturbance.

As will be explained below, an embodiment of the inventive concept can maintain a sensing margin by distributing a portion of a program state's threshold voltages below 0V and by securing a sufficient distance between threshold voltages. An example of this is illustrated in FIG. 1, where a portion of a first program state P1 is distributed below 0V. That is, a verification voltage of the first program state P1 is a negative voltage. In this embodiment, a lower limit of an erase state E may be −4V. Further, since a read pass voltage is relatively low according to an embodiment of the inventive concept, a read disturbance can be minimized.

In case of a threshold voltage distribution illustrated in FIG. 1, a part of the first program state P1 is distributed below 0V. However, a threshold voltage distribution of the inventive concept is not limited thereto. A threshold voltage distribution according to an exemplary embodiment of the inventive concept may be formed such that a part or all of at least one program state is distributed below 0V.

A nonvolatile memory providing a negative voltage to a word line is disclosed in U.S. Publication No. 2011-0051520, the entirety of which is incorporated by reference herein.

Figure 2:
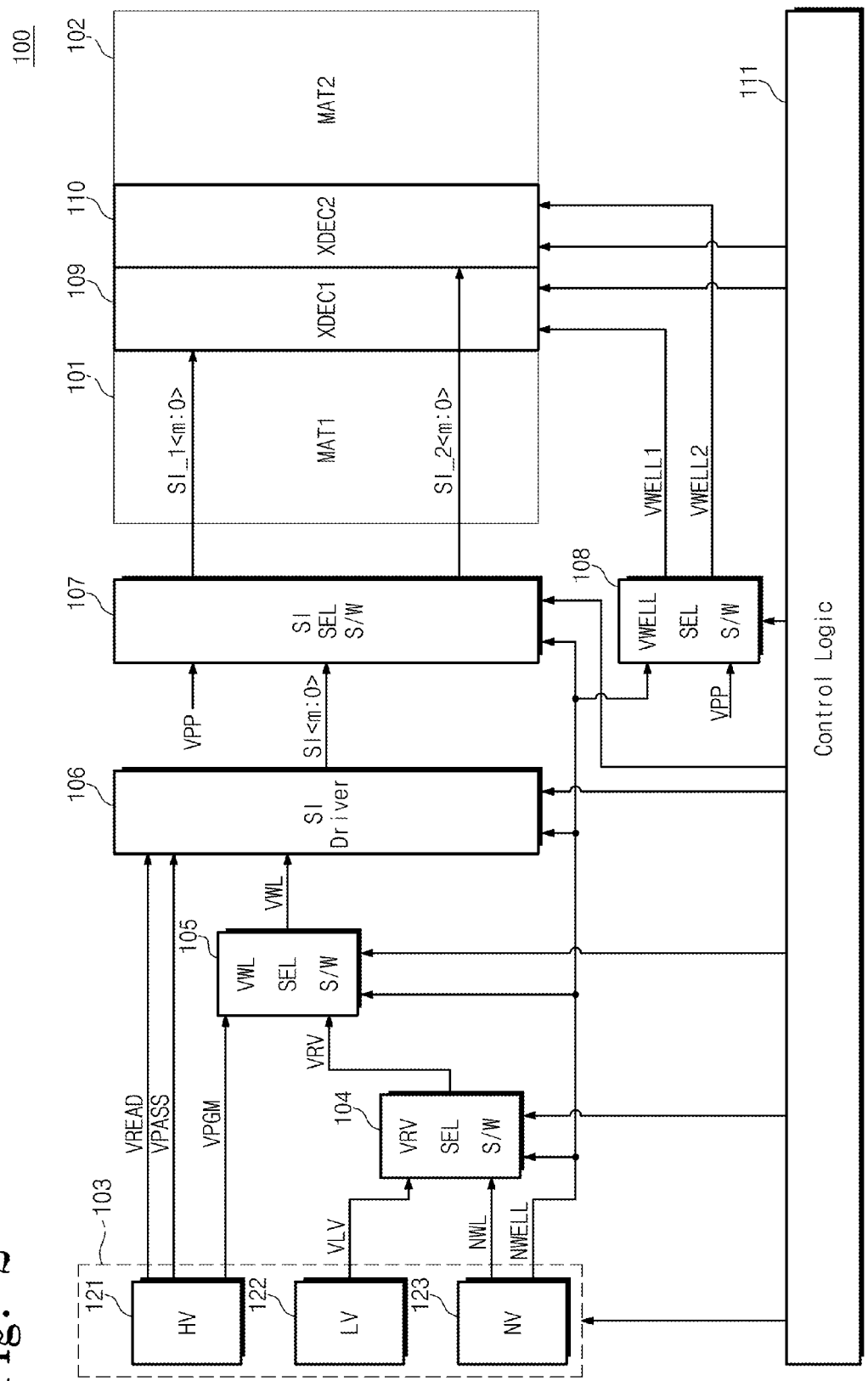
FIG. 2 a diagram showing a nonvolatile memory device according to an exemplary embodiment of the inventive concept.

FIG. 2 a diagram showing a nonvolatile memory device according to an exemplary embodiment of the inventive concept. Referring to FIG. 2, a nonvolatile memory device 100 includes first and second mats 101 and 102, a voltage generator circuit 103, a read verification voltage selecting switch circuit 104, a word line voltage selecting switch circuit 105, a selection line driver 106, a selection line selecting switch circuit 107, a well voltage selecting switch circuit 108, first and second row decoders 109 and 110, and control logic 111.

Each of the first and second mats 101 and 102 includes a plurality of memory blocks (not shown). Each of the plurality of memory blocks includes a plurality of memory cells. Herein, each of the plurality of memory cells can store 2 or more bits of data. Below, for convenience of explanation, it is assumed that each of the plurality of memory cells stores 2-bit data.

The voltage generator circuit 103 generates voltages needed for an operation of the nonvolatile memory device 100, and includes a high voltage generator 121, a low voltage generator 122, and a negative voltage generator 153. The high voltage generator 121 generates a high voltage VPP, an erase voltage VERS, a program voltage VPGM, a pass voltage VPASS, and a read pass voltage VREAD. The low voltage generator 122 generates a peri-voltage VRV. Herein, the pen-voltage VRV is a voltage which is higher than 0V and lower than the read pass voltage VREAD. The negative voltage generator 123 generates a negative NWL applied to a selected word line and a negative voltage NWELL for a well voltage applied to a well of a circuit to which the negative voltage NWL is applied.

The read verification voltage selecting switch circuit 104 selects any one of the pen-voltage VLV and the negative voltage NWL as a read verification voltage VRV. Herein, the read verification voltage VRV is a voltage associated with a read operation, that is, a read voltage or a verification voltage. In this embodiment, when the negative voltage NWL is applied to the read verification voltage selecting switch circuit 104, a well of the read verification voltage selecting switch circuit 104 is implemented to receive the negative voltage NWELL. When a positive voltage is applied to the read verification voltage selecting switch circuit 104, the well of the read verification voltage selecting switch circuit 104 is implemented to receive a ground voltage (e.g., 0V).

The word line voltage selecting switch circuit 105 selects any one of the program voltage VPGM and the read verification voltage VRV as a word line voltage VWL. In this embodiment, when the read verification voltage VRV is a negative voltage, a well including the word line voltage selecting switch circuit 105 is implemented to receive the negative well voltage NWELL. That is, when a read voltage is a negative voltage or a verification voltage is a negative voltage, a well of the word line voltage selecting switch circuit 105 is supplied with the negative well voltage NWELL.

The selection line driver 106 receives any one of the pass voltage VPASS and the read voltage VREAD or the word line voltage VWL for application to corresponding selection lines SI<m:0> (m being a natural number). In this embodiment, when the word line voltage VWL is a negative voltage, a well of the selection line driver 106 is implemented to receive the negative voltage NWELL.

The selection line selecting switch circuit 107 receives a high voltage VPP and connects a plurality of selection lines SI<m:0> with ones of first selection lines SI_1<m:0> or second selection lines SI_2<m:0> in response to an input address. In this embodiment, when a negative voltage is applied to at least one of the plurality of selection lines SI<m:0>, a well of the selection line selecting switch circuit 107 is implemented to receive the negative voltage NWELL.

The well voltage selecting switch circuit 108 receives the high voltage VPP and the negative voltage NWELL, and selects whether the negative voltage NWELL is applied to the first row decoder 109 or to the second row decoder 110, in response to well voltage selection signals WS1 and WS2. Herein, a voltage applied to a well of the first row decoder 109 is a first well voltage VWELL1, and a voltage applied to a well of the second row decoder 110 is a second well voltage VWELL2.

Each of the first and second row decoders 109 and 110 selects one of a plurality of memory blocks included in a corresponding one of the first and second mats 101 and 102 in response to an input address.

The first row decoder 109 receives bias voltages from the plurality of first selection lines SI_1<m:0>, and transfers the bias voltages to corresponding word lines of a selected memory block of the first mat 101. Herein, the bias voltages include the program voltage VPGM, the read voltage VR, a verification voltage VF, a pass voltage VPASS, a read pass voltage VREAD, an erase voltage VERS, and the like.

The second row decoder 110 receives bias voltages from the plurality of second selection lines SI_2<m:0>, and transfers the bias voltages to corresponding word lines of a selected memory block of the second mat 101.

In this embodiment, a well (not shown) of the first row decoder 109 is isolated from a well (not shown) of the second row decoder 110. The well of the first row decoder 109 is supplied with the first well voltage VWELL1, and the well of the second row decoder 110 is supplied with the second well voltage VWELL2.

In this embodiment, when one of the bias voltages is a negative voltage, a corresponding one of the first and second well voltages VWELL1 and VWELL2 is a negative voltage. For example, when a negative voltage is applied to a word line, selected by an input address, in a selected memory block of the first mat 101, the first well voltage VWELL1 is a negative voltage.

Meanwhile, the first row decoder 109 and the second row decoder illustrated in FIG. 2 are located between the first mat 101 and the second mat 102. However, locations of the row decoders according to the inventive concept are not limited thereto. As examples, row decoders locations according to the inventive concept are disclosed in U.S. Publication No. 2011-0096602, the entirety of which is incorporated by reference herein.

The control logic 111 controls an overall operation of the nonvolatile memory device 100. The control logic 111 analyzes control signals and a command provided from an external device, and controls the voltage generator circuit 103, the read verification voltage selecting switch circuit 104, the word line voltage selecting switch circuit 105, the selection line driver 106, the selection line selecting switch circuit 107, and the well voltage selecting switch circuit 108 in response to the analyzed result.

The nonvolatile memory device 100 according to an exemplary embodiment of the inventive concept may be configured such that a negative voltage NWL is applied to a selected word line via the read verification voltage selecting switch circuit 104, the word line voltage selecting switch circuit 105, and the selection line driver 106 under the control of the control logic 111. Further, the nonvolatile memory device 100 according to an exemplary embodiment of the inventive concept may be configured such that the negative voltage NWELL is applied to a well in which circuits supplied with the negative voltage NWL are formed.

High Voltage Generator

Figure 3:
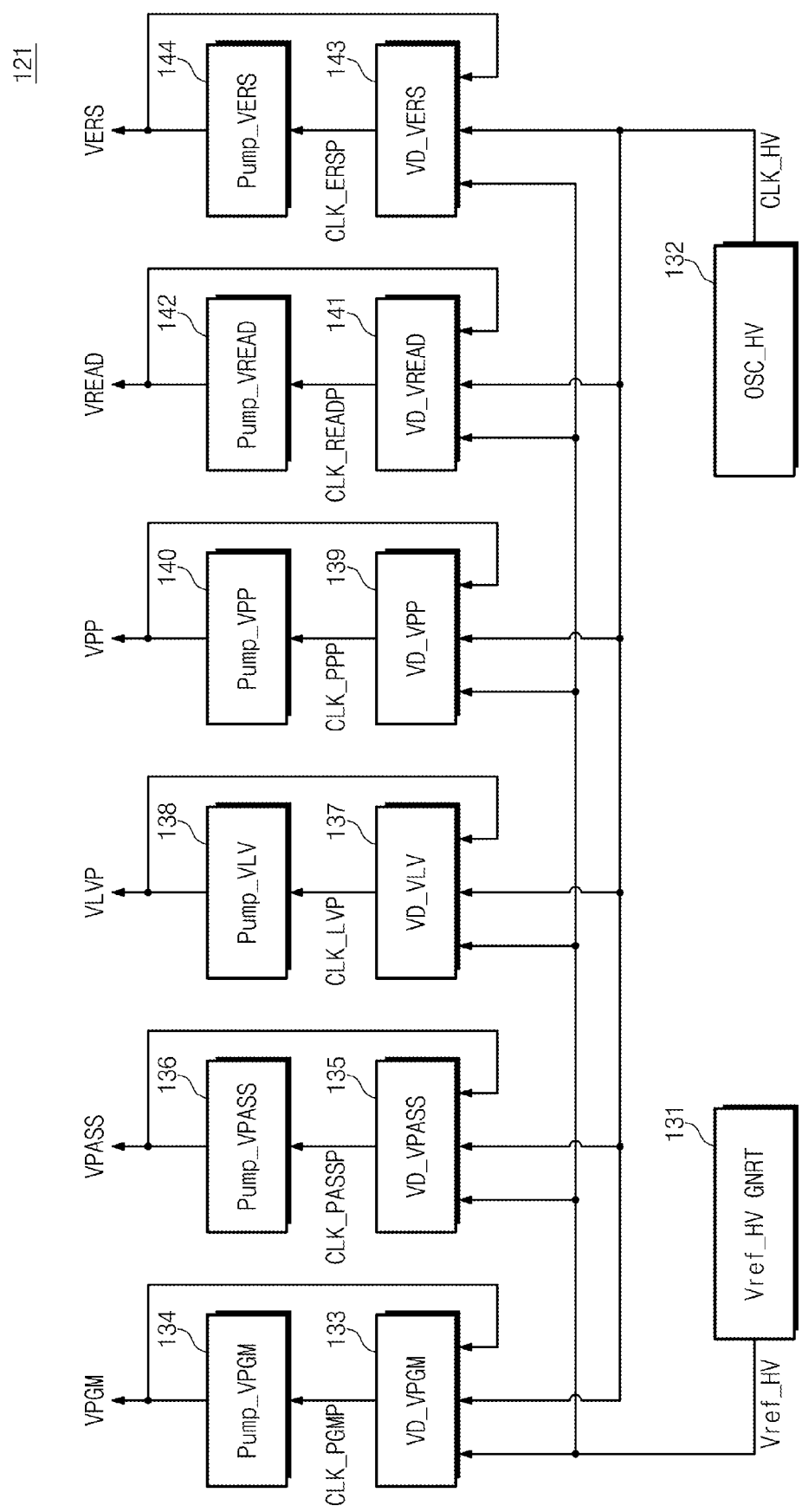
FIG. 3 is a diagram showing an example of a high voltage generator illustrated in FIG. 2.

FIG. 3 is a diagram showing an example of a high voltage generator illustrated in FIG. 2. Referring to FIG. 3, a high voltage generator 121 includes a reference voltage generator 131 for a high voltage, an oscillator 132 for a high voltage, a program voltage detector 133, a program voltage pump 134, a pass voltage detector 135, a pass voltage pump 136, a peri-voltage detector 137, a peri-voltage pump 138, a high voltage detector 139, a high voltage pump 140, a read pass voltage detector 141, a read pass voltage pump 142, an erase voltage detector 143, and an erase voltage pump 144.

A switch SW0_H is connected with a gate of the transistor HM0_H for a high voltage, a switch SW1_H is connected with a gate of the transistor HM1_H for a high voltage, and a switch SW2_H is connected with a gate of the transistor HM2_H for a high voltage.

The switches SW0_H to SW2_H receive trim codes TRM0_H to TRM2_H and a high voltage VPP, and transfer corresponding voltages to gates of corresponding transistors for a high voltage in response to input trim codes TRM0_H to TRM2_H.

A depletion transistor DM3_H is connected between the resistor R2_H and the comparison node NC_H. The depletion transistor DM3_H prevents at least one low voltage transistor of the comparison part 154 from being broken down due to the program voltage VPGM.

The current pass forming part 153 is connected between the comparison node NC_H and a ground terminal, and forms an active current path in response to an enable signal for a program voltage PGM_EN. The current pass forming part 153 includes a resistor R1_H and an NMOS transistor NM_H. Herein, one end of the resistor R₁_H is connected with the comparison node NC_H. The NMOS transistor NM_H is connected between the other end of the resistor R1_H1 and a ground terminal, and has a gate connected to receive a voltage corresponding to the enable signal for a program voltage PGM_EN.

The comparison part 154 compares a reference voltage for a high voltage Vref_HV and a voltage of a comparison node NC_H to generate a clock for a program voltage CLK_PGMP. The comparison part 154 includes a comparator 156 and a logic part 157. The comparator 156 includes a positive input terminal receiving the reference voltage for a high voltage Vref_HV and a negative input terminal receiving a voltage of the comparison node NC_H. In this embodiment, the comparator 156 is implemented by a differential amplifier. The logic part 157 generates the clock for a program voltage CLK_PGMP by ANDing an output of the comparator 156, the enable signal for a program voltage PGM_EN, and the clock for a high voltage CLK_HV.

The control part 155 controls activation of the power supply part 151 and the current path forming part 153 in response to the enable signal for programming PGM_EN. The control part 155 includes a first inverter 158 and a second inverter 159. The first inverter 158 inverts the enable signal for programming PGM_EN, and an output of the first inverter 158 is applied to a gate of the first depletion transistor DM1_H of the power supply part 151. The second inverter 159 inverts an output of the first inverter 158. An output of the second inverter 159 is applied to a gate of the NMOS transistor NM_H of the current path forming part 153.

A voltage detector 133 for a program voltage shown in FIG. 3 has been described above in connection with FIG. 4. It is noted that the remaining voltage detectors 133, 135, 137, 139, 141, and 143 of FIG. 3 are similarly configured.

Low Voltage Generator

Figure 5:
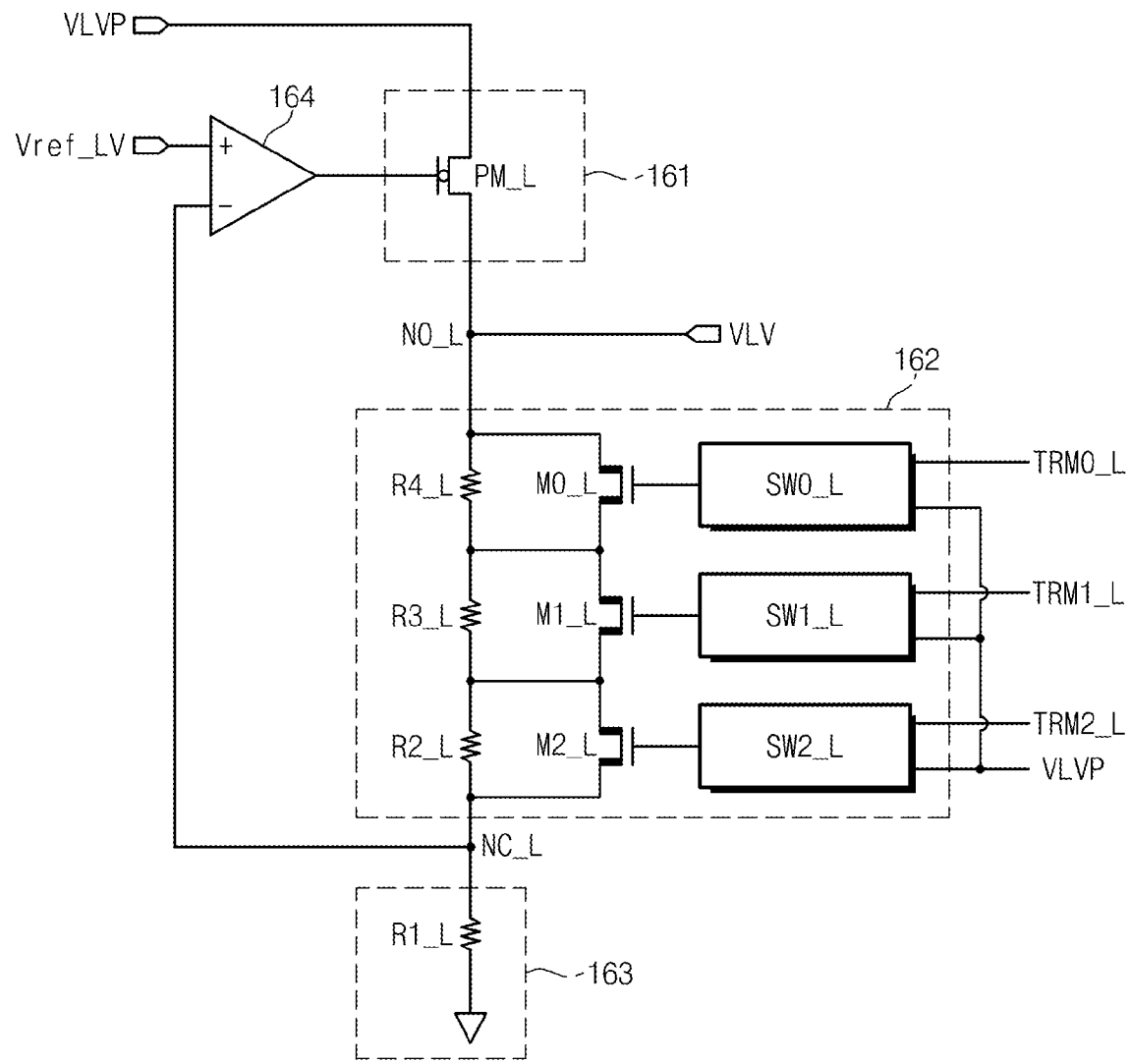
FIG. 5 is a diagram showing an example of a low voltage generator illustrated in FIG. 2.

FIG. 5 is a diagram showing an example of a low voltage generator illustrated in FIG. 2. Referring to FIG. 5, a low voltage generator 122 includes a power supply part 161, a voltage dividing part 162, a bias current part 163, and a comparison part 164.

The power supply voltage 161 decides a supply of a pump voltage for a peri-voltage VLVP applied from a high voltage 121 (refer to FIG. 2). The power supply voltage 161 includes a PMOS transistor PM_L.

The voltage dividing part 162 is connected between an output node NO_L and a comparison node NC_L, and outputs a peri-voltage VLV to the output node NO_L by dividing the pump voltage for a peri-voltage VLVP according to a trim code.

The voltage dividing part 162 includes a plurality of serially-connected resistors R2_L to R4_L, transistors M0_L to M2_L connected in parallel with the plurality of resistors R2_L to R4_L, respectively, and switches SW0_L to SW2_L connected with gates of the transistors M0_L to M2_L, respectively. The plurality of resistors R2_L to R4_L is shorted according trim codes TRM0_L to TRM2_L, respectively. In FIG. 5, there are exemplarily illustrated three (3) resistors R2_L to R4_L which may be shorted according to a trim code. However, the inventive concept is not limited thereto. The voltage dividing part according to an exemplary embodiment of the inventive concept can include at least one resistor capable of being shorted according to at least one trim code.

Each of the switches SW0_L to SW2_L receives a corresponding one of trim codes TRM0_L to TRM2_L and the pump voltage for a peri-voltage VLVP, and provides a voltage corresponding to a trim code to a gate of a corresponding transistor.

The bias current part 163 is connected between the comparison node NC_L and a ground terminal, and drains a constant current at an activation of the low voltage generator 122. The bias current part 163 includes a resistor R1_L.

The comparison part 164 compares a voltage of the comparison node NC_L and the reference voltage for a low voltage Vref_LV to decide an activation of the power supply part 161. For example, the comparison part 164 continues to activate the power supply part 161 when the voltage of the comparison node NC_L is not identical to the reference voltage for a low voltage Vref_LV. The comparison part 164 includes a positive input terminal receiving a voltage of the comparison node NC_L and a negative input terminal receiving the reference voltage for a low voltage Vref_LV.

Trim Code Generator

Figure 6:
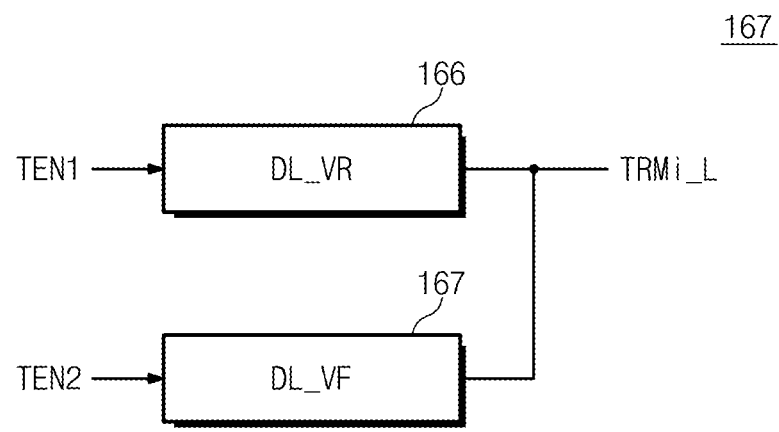
FIG. 6 is a diagram showing a trim code generator according to an embodiment of the inventive concept.

FIG. 6 is a diagram showing a trim code generator according to an embodiment of the inventive concept. Referring to FIG. 6, a trim code generator 165 includes a first data latch 166 and a second data latch 167.

For convenience of explanation, it is assumed that the first data latch 166 latches data on a read voltage, and the second data latch 167 latches data on a verification voltage. To generate a read voltage using a low voltage generator 122 (refer to FIG. 5), the first data latch 166 outputs latched data as an ith trim code (TRMi_L) (i being an integer of 1 or more) in response to a first trim code enable signal TEN1. On the other hand, to generate a verification voltage using the low voltage generator 122, the second data latch 167 outputs latched data as an ith trim code (TRMi_L) in response to a second trim code enable signal TEN2.

Figure 7:
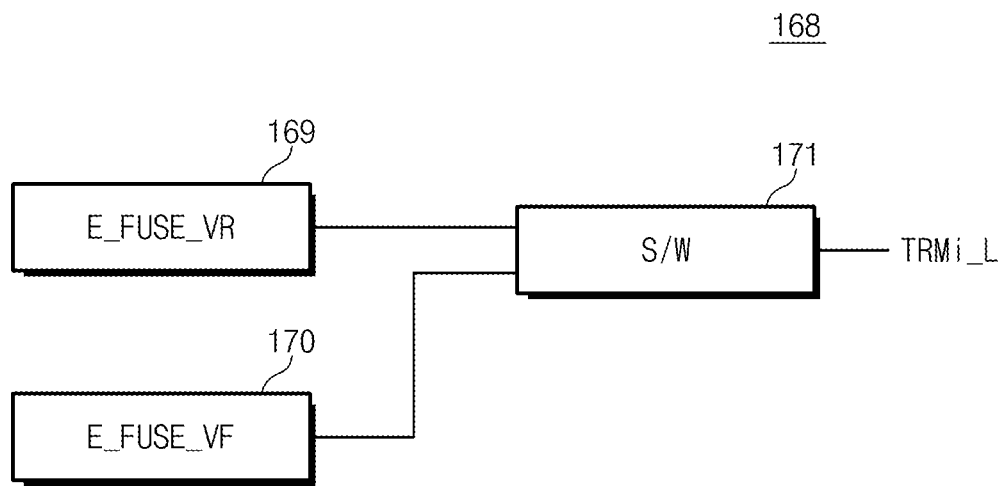
FIG. 7 is a diagram showing a trim code generator according to another embodiment of the inventive concept.

FIG. 7 is a diagram showing a trim code generator according to a another embodiment of the inventive concept. Referring to FIG. 7, a trim code generator 168 includes a first E-fuse 169, a second E-fuse 170, and a switch 171.

For convenience of explanation, it is assumed that the first E-fuse 169 stores an E-fuse value corresponding to a read voltage and the second E-fuse 170 stores an E-fuse value corresponding to a verification voltage. To generate a read voltage using a low voltage generator 122 (refer to FIG. 5), the switch 171 decides a turn-on state according to an E-fuse value of the first E-fuse 169, and outputs corresponding data as an ith trim code TRMi_L (i being an integer of 1 or more). On the other hand, to generate a verification voltage using the low voltage generator 122, the switch 171 decides a turn-on state according to an E-fuse value of the second E-fuse 170, and outputs corresponding data as an ith trim code TRMi_L.

Trim Switch

Figure 8:
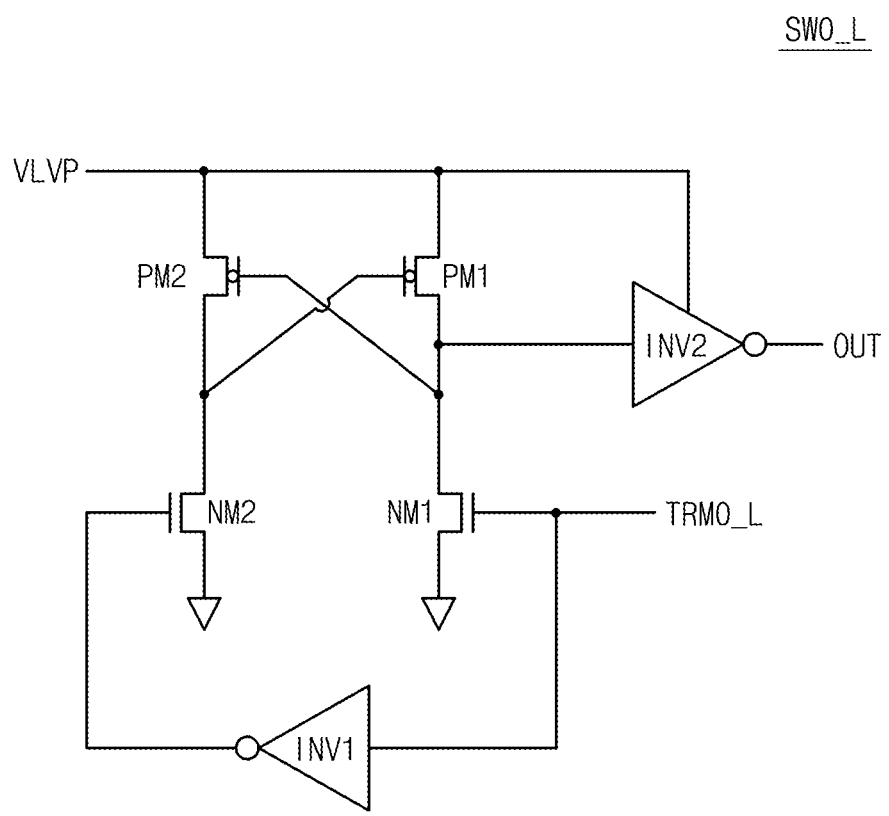
FIG. 8 is a diagram showing an example of a switch illustrated in FIG. 5.

FIG. 8 is a diagram showing an example of a switch SW0_L illustrated in FIG. 5. Referring to FIG. 8, a trim switch SW0_L includes first and second PMOS transistors PM1 and PM2, first and second NMOS transistors NM1 and NM2, and first and second inverters INV1 and INV2. The trim switch LV_SW0 is a level shifter which converts a level of a trim code TRM0_1 into a pump voltage for a peri-voltage VLVP. Herein, the trim code TRM0_L has a level of a power supply voltage VDD, which is lower than the pump voltage VLVP for a peri-voltage. Configurations of the second and third switches SW1_L and SW2_L shown in FIG. 5 are the same as or substantially the same as that of the first switch SW0_L.

First Embodiment of Negative Voltage Generator

Figure 9:
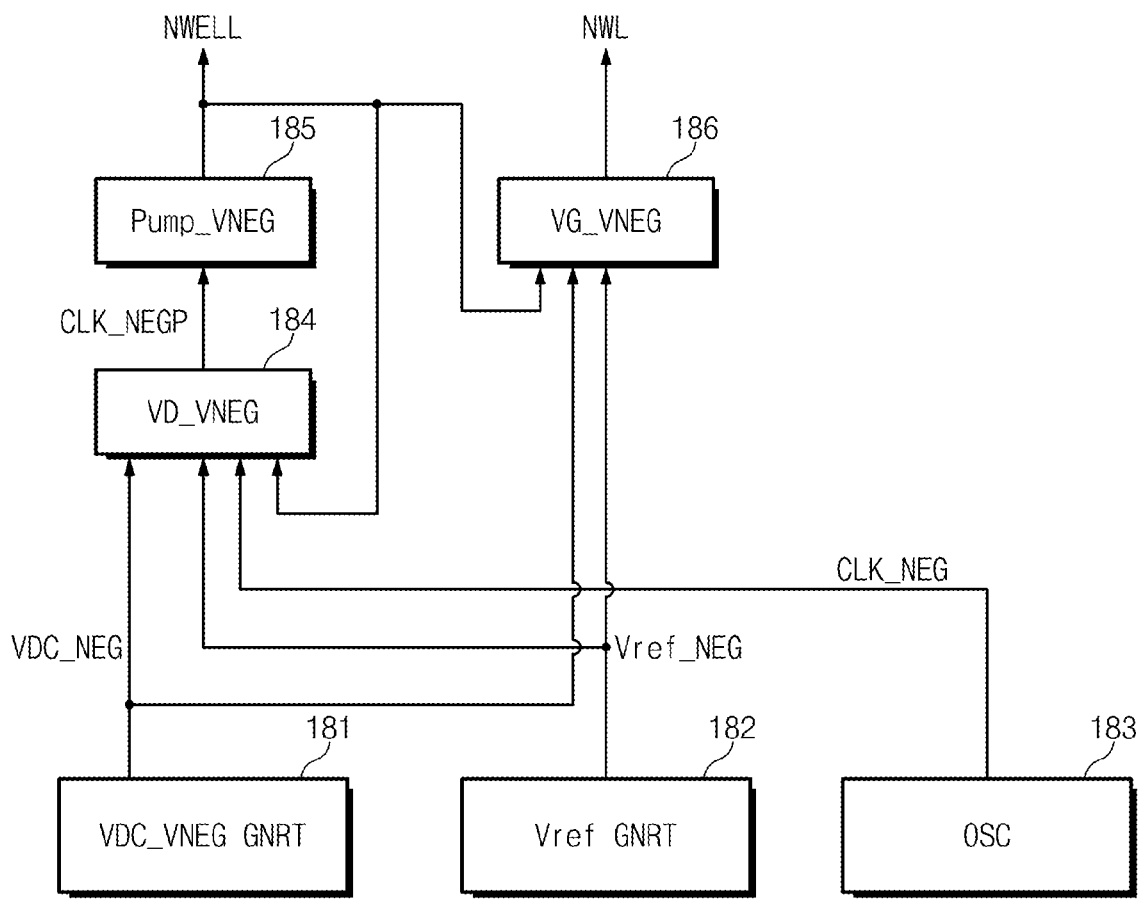
FIG. 9 is a diagram showing a negative voltage generator in FIG. 2 according to the first embodiment of the inventive concept.

FIG. 9 is a diagram showing a negative voltage generator in FIG. 2 according to the first embodiment of the inventive concept. Referring to FIG. 9, a negative voltage generator 123 includes a direct current (DC) voltage generator 181, a reference voltage generator 182, an oscillator 183, a negative voltage detector 184, a negative voltage pump 185, and a negative voltage generator 186 for a word line.

The DC voltage generator 181 generates a DC voltage VDC_NEG. Herein the DC voltage VDC_NEG is a source voltage for generating the negative voltage NWELL, wherein the negative voltage NWELL is generated by voltage divison the source voltage.

The reference voltage generator 182 generates a reference voltage Vref_NEG. Herein the reference voltage Vref_NEG may be used to control generating of a clock of a negative voltage pump CLK_NEGP.

The oscillator 182 oscillates a clock for a negative voltage CLK_NEG. In this embodiment, the clock for a negative voltage CLK_NEG may be 30 ns. Herein, the oscillator 183 is independent from an oscillator 132 of a high voltage generator 121 in FIG. 3. In another embodiment, the oscillator 183 may be the oscillator 183 of the high voltage generator 132 in FIG. 3.

The negative voltage detector 184 receives the DC voltage VDC_NEG, a reference voltage Vref_NEG, the clock for a negative voltage CLK_NEG, and detects a negative voltage NWELL for a well voltage to generate a clock for a negative voltage pump CLK_NEGP.

The negative voltage pump 185 generates the negative voltage NWELL for a well voltage in response to the clock for a negative voltage pump CLK_NEGP. Meanwhile, the negative voltage for a well voltage NWELL is easily varied due to external causes, and in particular, is affected by capacitances of wells. For this reason, it is necessary to stably apply a negative voltage to a word line.

The negative voltage generator 186 for a word line receives the negative voltage NWELL for a well voltage from the negative voltage pump 185, the DC voltage VDC_NEG, and the reference voltage Vref_NEG, and generates a negative voltage NWL to be applied to a word line. Herein, the negative voltage for a well voltage NWELL is applied to a well which has a circuit (not shown) supplied with a negative voltage, and the negative voltage NWL is applied to at least one word line and at least one line (e.g., a selection line) corresponding to the at least one word line.

Negative Voltage Device

Figure 10:
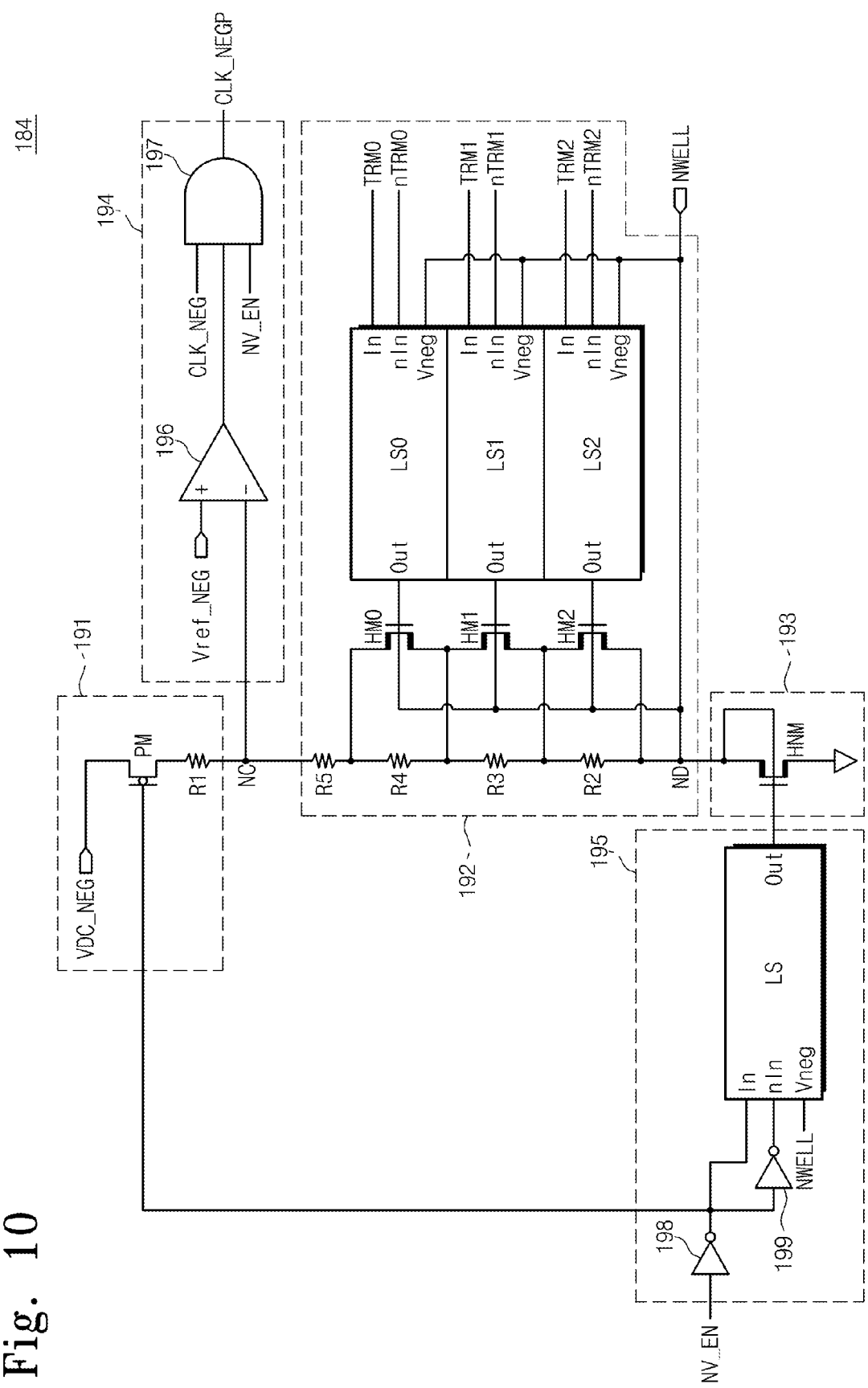
FIG. 10 is a diagram showing an example of a negative voltage generator 184 illustrated in FIG. 9.

FIG. 10 is a diagram showing an example of a negative voltage generator 184 illustrated in FIG. 9. Referring to FIG. 10, a negative voltage generator 184 includes a power supply part 191, a voltage dividing part 192, a discharge part 193, a comparison part 194, and a control part 195.

The power supply part 191 controls a supply of a DC voltage VDC_NEG in response to a negative voltage enable signal NV_EN. The power supply part 191 includes a PMOS transistor PM and a resistor R1. A gate of the PMOS transistor PM is connected to receive an inverted negative voltage enable signal NV_EN. The resistor R1 is connected between an end of the PMOS transistor PM and a comparison node NC, and drains a current corresponding to a voltage difference between the DC voltage VDC_NEG and a voltage of the comparison node VC into an active current path.

The voltage dividing part 192 voltage divides the DC voltage VDC_NEG using a plurality of serially-connected resistors R2 to R5. The voltage dividing part 192 includes a plurality of resistors R2 to R5, transistors for a high voltage HM0 to HM2, and level shifters LS0 to LS2.

The plurality of resistors R2 to R5 is connected in series. The resistors R2, R3, and R4 among the plurality of resistors R2 to R5 may be shorted according to corresponding trim codes TRM0 to TRM2 and nTRM0 to nTRM2. In the example of FIG. 10, three (3) resistors R2, R3, and R4 capable of being shorted according to a trim code. However, the inventive concept is not limited thereto. The inventive concept includes at least one resistor which can be shorted according to at least one trim code.

The first high voltage transistor HM0 is connected in parallel with the resistor R4, the second high voltage transistor HM1 is connected in parallel with the resistor R3, and the third high voltage transistor HM2 is connected in parallel with the resistor R2. Wells of the first to third transistors for a high voltage HM0 to HM2 are supplied with a negative voltage NWELL for a well voltage.

The first level shifter LS0 includes a positive input terminal In receiving a trim code TRM0, a negative input terminal nIn receiving an inverted trim code nTRM0, a well voltage input terminal Vneg receiving a negative voltage for a well voltage NWELL, and an output terminal Out outputting a level corresponding to the trim code TRM0.

The output terminal Out of the first level shifter LS0 is connected with a gate of the first high voltage transistor HM0. The second and third level shifters LS1 and LS2 may be configured the same as the first level shifter LS0.

The discharge part 193 discharges a negative voltage NWELL of a detection node ND in response to an inverted negative voltage enable signal NV_EN. The discharge part 193 is connected between the detection node ND and a ground terminal. In this embodiment, the discharge part 193 includes an NMOS transistor HNM. Herein, the NMOS transistor HNM may be a high voltage transistor. A body of the NMOS transistor HNM is connected with the detection node ND.

The comparison part 194 compares a reference voltage for a negative voltage Vref_NV and a voltage of the comparison node NC to generate a clock for a negative voltage CLK_NEGP. The comparison part 194 includes a comparator 196 and a logic part 197. The comparator 196 includes a comparator 196 and a logic part 197. The comparator 196 includes a positive input terminal receiving the reference voltage for a negative voltage Vref_NEG and a negative input terminal receiving a voltage of the comparison node NC. In this embodiment, the comparator 196 is implemented by a differential amplifier. The logic part 197 generates a clock for a negative voltage CLK_NEGP by executing a logical AND of the clock for a negative voltage CLK_NEG, an output of the comparator 196, and a negative voltage enable signal NV_EN.

The control part 195 decides activations of the power supply part 191 and the discharge part 193 in response to the negative voltage enable signal NV_EN. The control part 195 includes a first inverter 198, a second inverter 199, and a level shifter LS. The first inverter 198 inverts the negative voltage enable signal NV_EN. An output of the first inverter 198 is applied to a gate of the PMOS transistor PM of the power supply part 191. The second inverter 199 inverts an output of the first inverter 198. The level shifter LS converts an output level of the second inverter 199 into a level for a high voltage. The output of the second inverter 199 converted into a level for a high voltage is applied to a gate of the NMOS transistor HNM of the discharge part 193.

The level shifter LS includes a positive input terminal In receiving an output of the second inverter 199, a negative input terminal nIn receiving an output of the first inverter 198, a well voltage input terminal Vneg receiving a negative voltage for a well voltage NWELL, and an output terminal Out. The level shifter LS is implemented in the same manner as the first level shifter LS0 of the voltage dividing part 192.

Level Shifter

Figure 11:
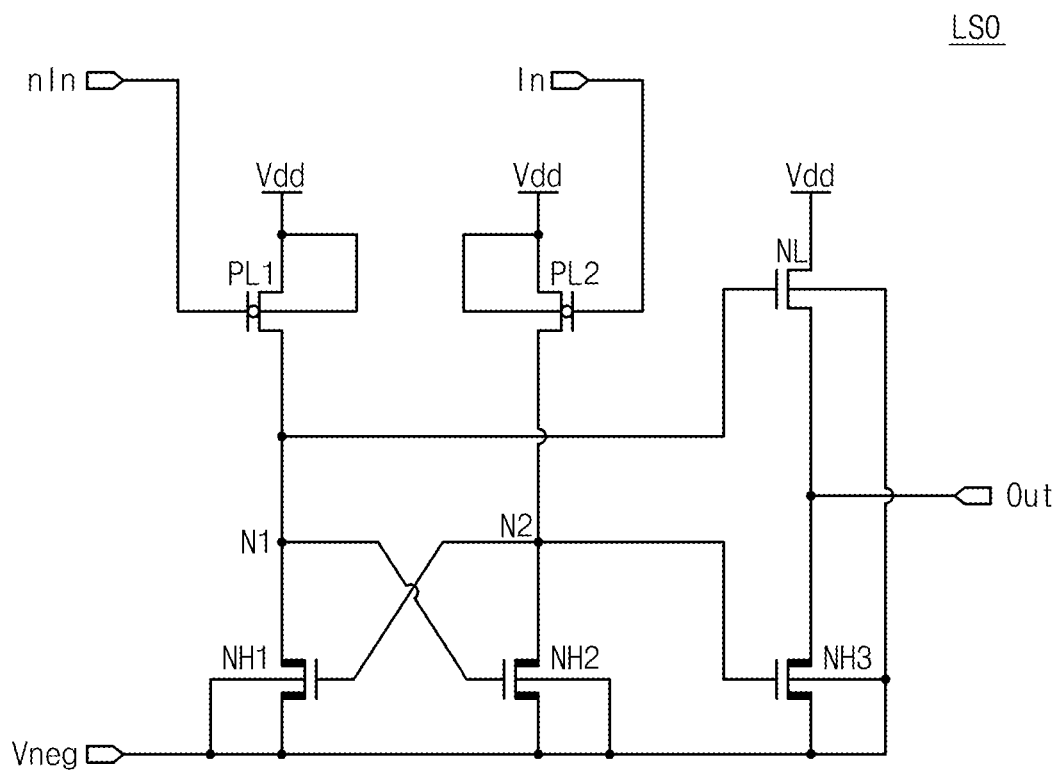
FIG. 11 is a diagram showing an example of a first level shifter illustrated in FIG. 10.

FIG. 11 is a diagram showing an example of first level shifter illustrated in FIG. 10. Referring to FIG. 11, a first level shifter LS0 includes low voltage PMOS transistors PL1 and PL2, an NMOS transistor NL, and high voltage NMOS transistors NH1, NH2, and NH3.

The first PMOS low voltage transistor PL1 and the first NMOS high voltage transistor NH1 are connected in series between a power supply terminal Vdd and a well voltage terminal Vneg, the second PMOS low voltage transistor PL2 and the second NMOS high voltage transistor NH2 are connected in series between the power supply terminal Vdd and the well voltage terminal Vneg, and an NMOS transistor NL and the third NMOS high voltage transistor NH3 are connected in series between the power supply terminal Vdd and the well voltage terminal Vneg.

A gate of the first PMOS low voltage transistor PL1 is connected to a negative input terminal nIn, a gate of the second PMOS low voltage transistor PL2 is connected to a positive input terminal In, and a gate of the NMOS low voltage transistor NL3 is connected to a first node N1. Bodies of the first and second Low voltage PMOS transistors PL1 and PL2 are connected with corresponding sources. In this embodiment, the NMOS transistor NL is a high voltage transistor.

A gate of the first NMOS high voltage transistor NH1 is connected to a second node N2, a gate of the second NMOS high voltage transistor NH2 is connected to the first node N1, and a gate of the third NMOS high voltage transistor NH3 is connected to the second node N2. A body of each of the first to third High voltage NMOS transistors NH1, NH2, and NH3 is connected with a corresponding source. That is, a body of each of the first to third High voltage NMOS transistors NH1, NH2, and NH3 is connected with a well voltage terminal Vneg.

Below, an operation of the first level shifter LS0 will be described.

First, it is assumed that a power supply voltage VDD corresponding to '1' is applied to the positive input terminal In, 0V corresponding to '0' is applied to the negative input terminal nIn, and −2V (a negative voltage for a well voltage NWELL) is applied to the well voltage terminal Vneg. Since 0V is applied to a gate of the first PMOS low voltage transistor PL1, the first PMOS low voltage transistor PL1 is turned on. Since a power supply voltage VDD is applied to a gate of the second PMOS low voltage transistor PL2, the second PMOS low voltage transistor PL2 is turned off. Under this condition, the first node N1 goes to the power supply voltage VDD. Since the first node N1 goes to the power supply voltage VDD, the NMOS transistor NL is turned on, so that the output terminal Out is set to the power supply voltage VDD.

On the other hand, it is assumed that 0V corresponding to '0' is applied to the positive input terminal In, the power supply voltage VDD corresponding to '1' is applied to the negative input terminal nIn, and −2V (a negative voltage for a well voltage NWELL) is applied to the well voltage terminal Vneg.

Since the power supply voltage VDD is applied to a gate of the first PMOS low voltage transistor PL1, the first PMOS low voltage transistor PL1 is turned off. Since 0V is applied to a gate of the second PMOS low voltage transistor PL2, the second PMOS low voltage transistor PL2 is turned on. Under this condition, the second node N2 goes to the power supply voltage VDD. Since the second node N2 goes to the power supply voltage VDD, the third NMOS high voltage transistor NH3 is turned on, so that the output terminal Out is set to −2V.

In FIG. 11, the level shifter LS0 includes a pull-up circuit implemented by low voltage PMOS transistors PL1 and PL2. However, the inventive concept is not limited thereto. The pull-up circuit of the level shifter according to the inventive concept can be implemented by at least one high voltage PMOS transistor.

In FIG. 11, the level shifter LS0 includes a pull-down circuit implemented by high voltage NMOS transistors NH1 to NH3. However, the inventive concept is not limited thereto. The pull-down circuit of the level shifter according to the inventive concept can be implemented by at least one low voltage NMOS transistor.

Negative Voltage Generator for Word Line

Figure 12:
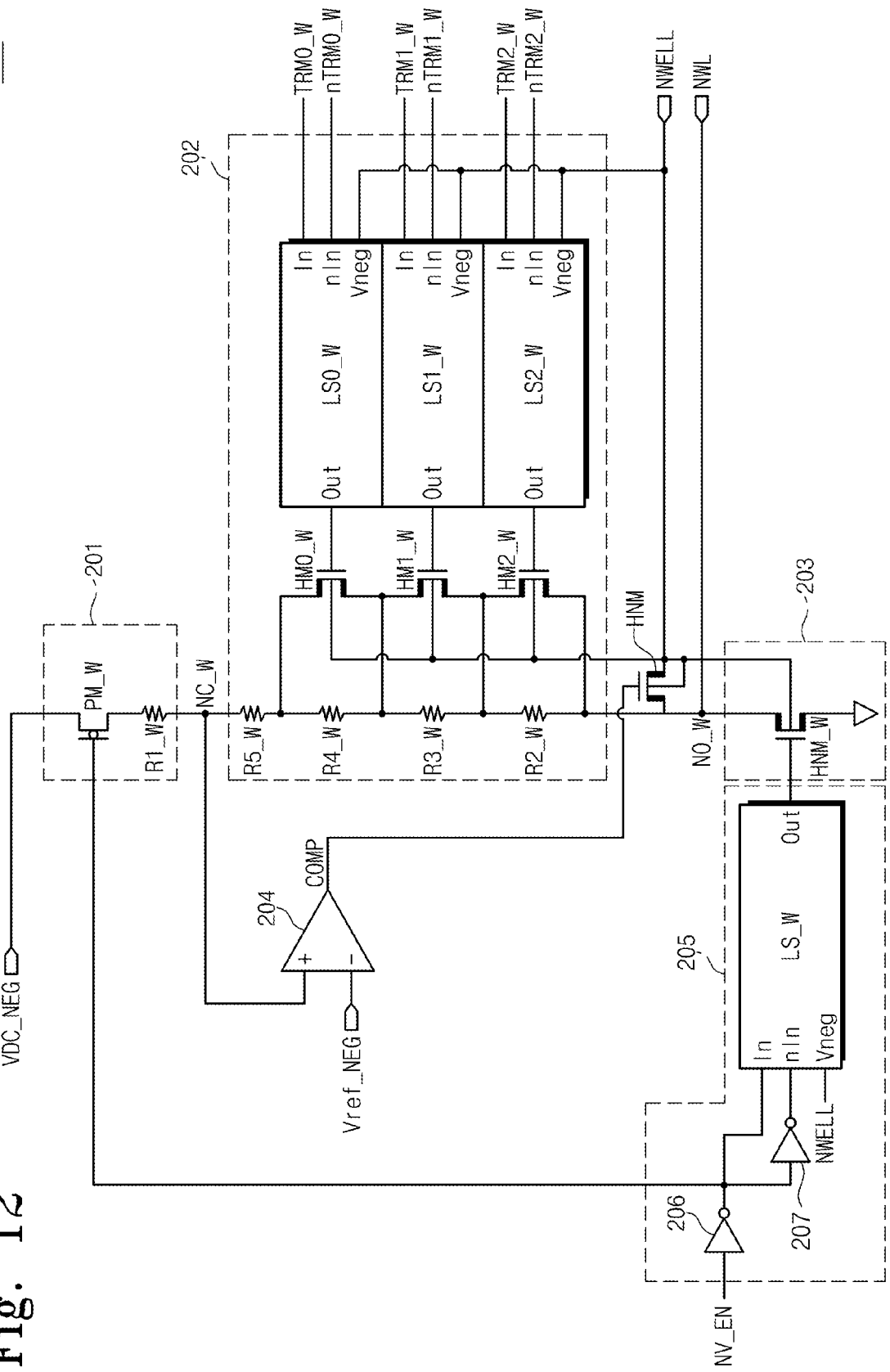
FIG. 12 is a diagram showing an example of a negative voltage generator for a word line illustrated in FIG. 9.

FIG. 12 is a diagram showing an example of a negative voltage generator for a word line illustrated in FIG. 9. Referring to FIG. 12, a negative voltage generator for a word line 186 includes a power supply part 201, a voltage dividing part 202, a discharge part 203, a comparison part 204, a control part 205, and a high voltage transistor HNM.

The power supply part 201 controls an activation of the power supply part 201 in response to a negative voltage enable signal NV_EN. The power supply part 201 includes a PMOS transistor PM_W and a resistor R1_W. A gate of the PMOS transistor PM_W is connected to receive a signal deciding a supply of a DC voltage VDC_NEG. Herein, the input signal is an inverted the negative voltage enable signal NV_EN. The resistor R1_W is connected between an end of the PMOS transistor PM_W and a comparison node NC, and drains a current corresponding to a voltage difference between the DC voltage VDC_NEG and a voltage of the comparison node VC into an active current path at an activation of the power supply part 201. At this time, a constant current flows.

The voltage dividing part 202 voltage divides the DC voltage VDC_NEG using a plurality of serially-connected resistors R2_W to R5_W connected in series between the comparison node NC_W and an output node NO_W. The voltage dividing part 202 includes a plurality of resistors R2_W to R5_W, transistors for a high voltage HM0_W to HM2_W, and level shifters LS0_W to LS2_W.

The plurality of resistors R2_W to R5_W is connected in series. Resistors R2_W, R3_W, and R4_W among the plurality of resistors R2_W to R5_W may be shorted according to corresponding trim codes TRM0_W to TRM2_W. In the example of FIG. 12, three (3) resistors R2_W, R3_W, and R4_W capable of being shorted according to a trim code. However, the inventive concept is not limited thereto. The inventive concept includes at least one resistor which can be shorted according to at least one trim code.

The first high voltage transistor HM0_W is connected in parallel with the resistor R4_W, the second high voltage transistor HM1_W is connected in parallel with the resistor R3_W, and the third high voltage transistor HM2_W is connected in parallel with the resistor R2_W. Wells of the first to third transistors for a high voltage HM0_W to HM2_W are supplied with a negative voltage for a well voltage NWELL.

The first level shifter LS0_W includes a positive input terminal In receiving a trim code TRM0_W, a negative input terminal nIn receiving an inverted trim code nTRM0_W, a well voltage input terminal Vneg receiving a negative voltage for a well voltage NWELL, and an output terminal Out outputting a converted level corresponding to the trim code TRM0_W. The output terminal Out of the first level shifter LS0_W is connected with a gate of the first high voltage transistor HM0_W. The first level shifter LS0_W is implemented in the same manner as a first level shifter LS0 in FIG. 11. The second and third level shifters LS1_W and LS2_W may have the same configuration as the first level shifter LS0_W.

The discharge part 203 discharges a negative voltage NWL of an output node NO_W in response to an inverted version of a negative voltage enable signal NV_EN. The discharge part 203 is connected between the output node NO_W and a ground terminal. In this embodiment, the discharge part 203 includes an NMOS transistor HNM_W. Herein, the NMOS transistor HNM_W may be a high voltage transistor. A body of the NMOS transistor HNM_W is connected to receive a voltage for a negative voltage pump NWELL.

The comparison part 204 compares a reference voltage for a negative voltage Vref_NV and a voltage of the comparison node NC_W and provides a comparison result to a gate of a PMOS high voltage transistor HVM. The comparison part 204 includes a positive input terminal receiving the reference voltage for a negative voltage Vref_NEG and a negative input terminal receiving a voltage of the comparison node NC_W. In this embodiment, the comparison part 204 is implemented by a differential amplifier.

The control part 205 decides an activation of the discharge part 203 in response to the negative voltage enable signal NV_EN. The control part 205 includes a first inverter 206, a second inverter 207, and a level shifter LS_W. The first inverter 206 inverts the negative voltage enable signal NV_EN. The second inverter 207 inverts an output of the first inverter 206. The level shifter LS_W converts an output level of the second inverter 199 into a level suitable for operating an NMOS high voltage transistor. The output of the second inverter 207 converted into a level for a high voltage is applied to a gate of the NMOS transistor HNM_W of the discharge part 203.

The level shifter LS_W includes a positive input terminal In receiving an output of the second inverter 207, a negative input terminal nIn receiving an output of the first inverter 206, a well voltage input terminal Vneg receiving a negative voltage for a well voltage NWELL, and an output terminal Out. The level shifter LS_W is implemented in the same manner as the first level shifter LS0_W of the voltage dividing part 202.

The high voltage transistor HNM is connected between a voltage for a negative voltage pump NWELL and a negative voltage NWL. The high voltage transistor HNM electrically connects a voltage NWELL for a negative voltage pump and a negative voltage NWL according to a comparison value COMP of the comparison part 204.

The negative voltage generator for a word line 186 according to the embodiment of the inventive concept may generate the negative voltage NWL by resistance dividing the DC voltage VDC_NEG.

Second Embodiment of Negative Voltage Generator

As illustrated in FIG. 9, a negative voltage generator 123 includes a negative voltage generator for a word line 186 which generates a negative voltage NWL applied to a word line. However, there is no need for the negative voltage generator 123 to include the negative voltage generator for a word line 186.

Figure 13:
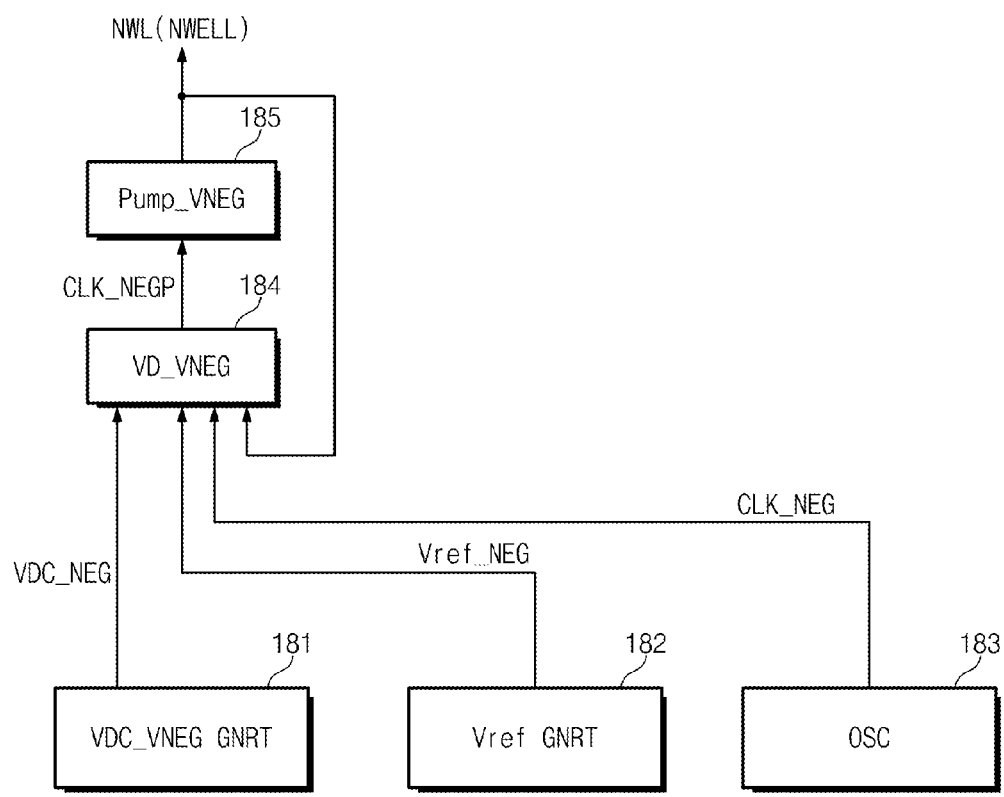
FIG. 13 is a diagram showing a negative voltage generator in FIG. 2 according to the second embodiment of the inventive concept.

FIG. 13 is a diagram showing a negative voltage generator in FIG. 2 according to the second embodiment of the inventive concept. Referring to FIG. 13, a negative voltage generator 123_1 includes a DC voltage generator 181, a reference voltage generator 182, an oscillator 183, a negative voltage detector 184, and a negative voltage pump 185. The negative voltage generator 123_1 is the same as that 123 in FIG. 9 except that a negative voltage generator for a word line is removed. That is, an output voltage of the negative voltage pump 185 is supplied in common to a well and a word line.

Read Verification Voltage Selecting Switch Circuit

Figure 14:
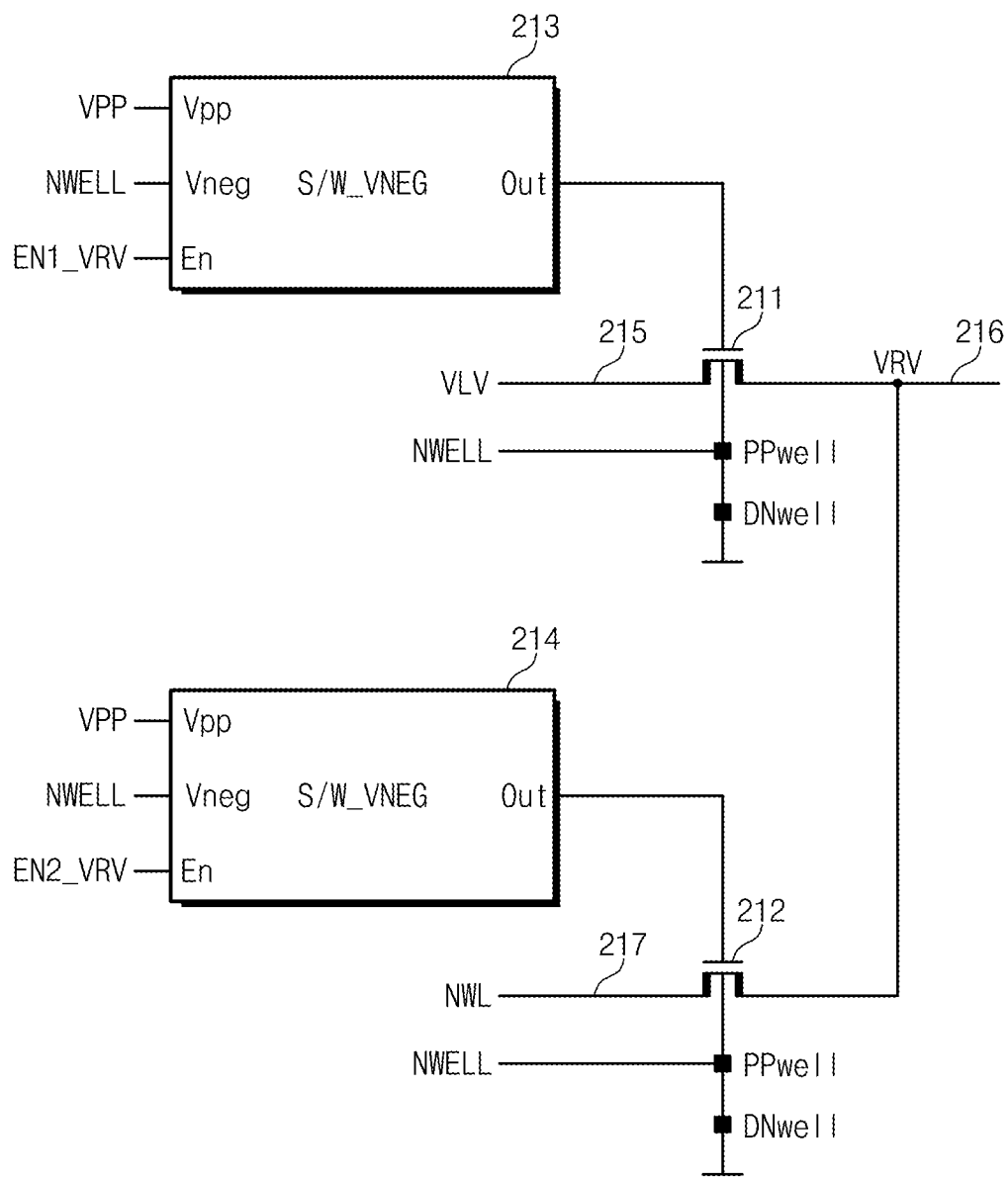
FIG. 14 is a diagram showing an example of a read verification voltage selecting switch circuit in FIG. 2.

FIG. 14 is a diagram showing an example of a read verification voltage selecting switch circuit in FIG. 2. Referring to FIG. 14, a read verification voltage selecting switch circuit 104 includes a peri-voltage selection transistor 211, a negative voltage selection transistor 212, a peri-voltage selection switch 213, and a negative voltage selection switch 214.

The peri-voltage selection transistor 211 is connected between a line 215 supplied with a peri-voltage VLV and a line supplied with a read verification voltage VRV. The peri-voltage selection transistor 211 is turned on or off in response to a first enable signal EN1_VRV. Herein, a well of the peri-voltage selection transistor 211 is a p-type well included in a deep n-type well and is supplied with a negative voltage for a well voltage NWELL.

The negative voltage selection transistor 212 is connected between a line 217 supplied with a negative voltage NWL and a line 216 supplied with a read verification voltage VRV. The negative voltage selection transistor 212 is turned on or off in response to a second enable signal EN2_VRV. Herein, a well of the negative voltage selection transistor 212 is a p-type well included in a deep n-type well and is supplied with a negative voltage for a well voltage NWELL.

The peri-voltage selection switch 213 controls an activation of the peri-voltage selection transistor 211 in response to the first enable signal EN1_VRV. The peri-voltage selection switch 213 includes a high voltage terminal Vpp receiving a high voltage VPP, a well voltage terminal receiving a negative voltage for a well voltage NWELL, an enable terminal En receiving an enable signal EN1_VRV, and an output terminal Out outputting a signal corresponding to the enable signal EN1_VRV.

The negative voltage selection switch 214 controls an activation of negative voltage selection transistor 212 in response to the second enable signal EN2_VRV. The negative voltage selection switch 214 includes a high voltage terminal Vpp receiving a high voltage VPP, a well voltage terminal receiving a negative voltage for a well voltage NWELL, an enable terminal En receiving an enable signal EN1_VRV, and an output terminal Out outputting a signal corresponding to the enable signal EN1_VRV. The negative voltage selection switch 214 is implemented in the same manner as the peri-voltage selection switch 213.

The read verification voltage selecting switch circuit 104 according to the embodiment of the inventive concept may select one of the peri-voltage VLV and the negative voltage NWL corresponding to the enable signals EN1_VRV and EN2_VRV as the read verification voltage VRV, and supply the selected read verification voltage VRV to a corresponding line 216.

Peri-Voltage Selection Switch Circuit

Figure 15:
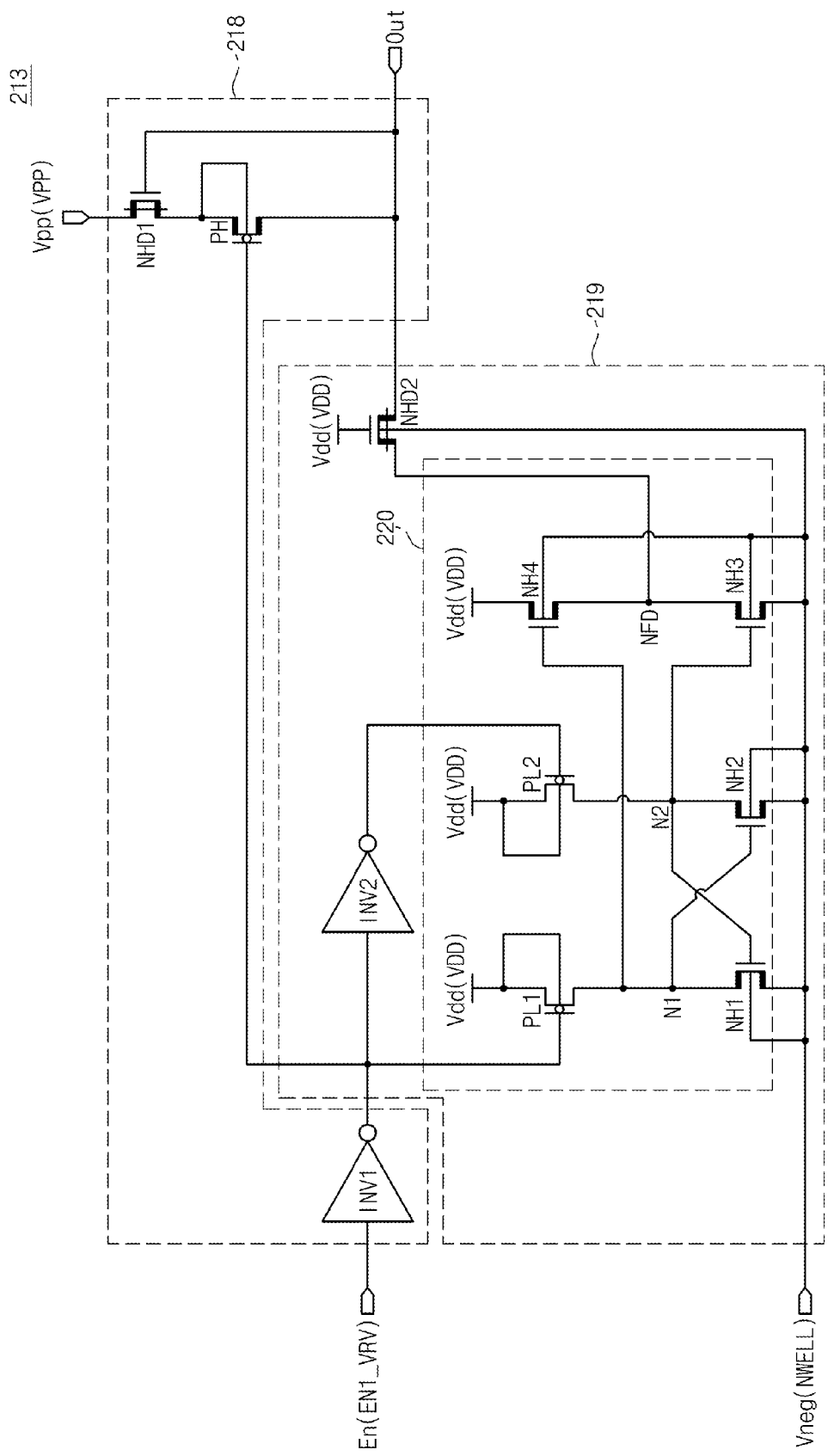
FIG. 15 is a diagram showing an example of a peri-voltage selection switch illustrated in FIG. 14.

FIG. 15 is a diagram showing a peri-voltage selection switch illustrated in FIG. 14. Referring to FIG. 15, a peri-voltage selection switch 213 includes a pull-up circuit 218 and a pull-down circuit 219.

The pull-up circuit 214 outputs a high voltage VPP of a high voltage terminal Vpp to an output terminal Out in response to an enable signal EN1_VRV input to an enable terminal En. The pull-up circuit 214 includes a depletion transistor NHD1, a PMOS high voltage transistor PH, and a first inverter INV1. The depletion transistor NHD1 has a drain connected with the high voltage terminal Vpp and a gate connected with the output terminal Out. The PMOS high voltage transistor PH has a source connected with a source of the depletion transistor NHD1, a drain connected with the output terminal Out, and a gate connected to receive an inverted first enable signal EN1_VRV. The first inverter INV1 inverts the first enable signal EN1_VRV input to the enable terminal En.

The pull-up circuit 218 applies the high voltage VPP to the output terminal Out in response to the first enable signal EN1_VRV having a high level. Below, an operation of outputting the high voltage VPP to the output terminal Out will be more fully described.

If the first enable signal EN1_VRV having a high level is input, the first inverter INV1 outputs a low-level signal. The PMOS high voltage transistor PH is turned on by the low-level signal. At this time, assuming that an initial level of the output terminal Out is 0V, the depletion transistor NHD1 applies a threshold voltage (e.g., about 2V) of a depletion transistor to the output terminal Out in response to a gate voltage of 0V. This means that a voltage of the output terminal Out increases. At the same time, the increased voltage of the output terminal Out is fed back to a gate of the depletion transistor NHD1. Again, the depletion transistor NHD1 increases a voltage of the output terminal Out in response to a feedback voltage. The depletion transistor NHD1 prevents a voltage of the output terminal Out from increasing sharply. The voltage of the output terminal Out increases up to the high voltage VPP via iteration of the above-described operation.

On the other hand, if the first enable signal EN1_VRV having a low level is input, the first inverter INV1 outputs a high-level signal. The PMOS high voltage transistor PH is turned off by the high-level signal. The pull-down circuit 219 outputs a negative voltage for a well voltage NWELL of a well voltage terminal Vneg to the output terminal Out in response to the first enable signal EN1_VRV input to the enable terminal En. Further, when the high voltage VPP is applied to the output terminal Out, the pull-down circuit 219 electrically isolates the output terminal Out from a well of a first read verification voltage selecting switch circuit 163.

The pull-down circuit 219 includes first and second inverters INV1 and INV2, a second depletion transistor NHD2, and a level shifter 220. The first inverter INV1 inverts the first enable signal EN1_VRV input to the enable terminal En. The second inverter INV2 inverts an output of the first inverter INV1. The second depletion transistor NHD2 is connected between the output terminal Out and a blocking node NFD. The second depletion transistor NHD2 electrically isolates the pull-down circuit 219 from the output terminal Out in response to the first enable signal EN1_VRV having a high level.

Isolation of the pull-down circuit 219 from the output terminal Out in response to the first enable signal EN1_VRV having a high level may be accomplished as follows. The first invert INV1 outputs a low-level signal in response to the first enable signal EN1_VRV having a high level. A first PMOS low voltage transistor PL1 is turned on in response to a low-level signal output from the first inverter INV1. This enables a power supply voltage VDD of a power supply terminal Vdd to be applied to a gate of a third NMOS high voltage transistor NH3. Accordingly, the third NMOS high voltage transistor NH3 is turned on. This means that the power supply voltage VDD is applied to the blocking node NFD. At this time, if a voltage of the blocking node NFD increases by a threshold voltage of a second depletion transistor NHD2, the pull-down circuit 219 is electrically isolated from the output terminal Out in response to the first enable signal EN1_VRV having a high level.

The level shifter 220 responds to the first enable signal EN1_VRV input to the enable terminal En to determine whether to apply the power supply voltage VDD to the blocking node NFD or a negative voltage for a well voltage NWELL input to a well voltage terminal Vneg to the blocking node NFD.

The level shifter 220 includes Low voltage PMOS transistors PL1 and PL2 and High voltage NMOS transistors NH1, NH2, NH3, and NH4.

The first PMOS low voltage transistor PL1 and the first NMOS high voltage transistor NH1 are connected in series between a power supply terminal Vdd and a well voltage terminal Vneg. The second PMOS low voltage transistor PL2 and the second NMOS high voltage transistor NH2 are connected in series between the power supply terminal Vdd and the well voltage terminal Vneg. The fourth NMOS high voltage transistor NH4 and the third NMOS high voltage transistor NH3 are connected in series between the power supply terminal Vdd and the well voltage terminal Vneg.

A gate of the first PMOS low voltage transistor PL1 is connected with an output of the first inverter INV1, and a gate of the second PMOS low voltage transistor PL2 is connected with an output of the second inverter INV2. A gate of the third NMOS high voltage transistor NH4 is connected to a first node N1. Bodies of the first and second Low voltage PMOS transistors PL1 and PL2 are connected with corresponding sources. A body of the fourth NMOS high voltage transistor NH4 is connected with a corresponding source.

A gate of the first NMOS high voltage transistor NH1 is connected to a second node N2, a gate of the second NMOS high voltage transistor NH2 is connected to the first node N1, and a gate of the third NMOS high voltage transistor NH3 is connected to the second node N2. Bodies of the first to third High voltage NMOS transistors NH1, NH2, and NH3 are connected with corresponding bodies. That is, the bodies of the first to third High voltage NMOS transistors NH1, NH2, and NH3 are connected with a well voltage terminal Vneg.

Below, an operation of a level shifter 220 will be more fully described.

When the first enable signal EN1_VRV input to the enable terminal En has a high level, the first inverter INV1 outputs a low-level signal, and the second inverter INV2 outputs a high-level signal. Since a low-level signal is applied to a gate of the first PMOS low voltage transistor PL1, the first PMOS low voltage transistor PL1 is turned on. Since a high-level signal is applied to a gate of the second PMOS low voltage transistor PL2, the second PMOS low voltage transistor PL2 is turned off. According to conditions, the first node N1 is set to a power supply voltage VDD. This means that the fourth NMOS high voltage transistor NH4 is turned on. Accordingly, a voltage of the blocking node NFD goes to the power supply voltage VDD.

When the first enable signal EN1_VRV input to the enable terminal En has a low level, the first inverter INV1 outputs a high-level signal, and the second inverter INV2 outputs a low-level signal. Since a high-level signal is applied to a gate of the first PMOS low voltage transistor PL1, the first PMOS low voltage transistor PL1 is turned off. Since a low-level signal is applied to a gate of the second PMOS low voltage transistor PL2, the second PMOS low voltage transistor PL2 is turned on. According to conditions, the second node N2 is set to the power supply voltage VDD. This means that the third NMOS high voltage transistor NH2 is turned on. Accordingly, a voltage of the blocking node NFD goes to a negative voltage for a well voltage NWELL input to the well voltage terminal Vneg.

The level shifter 220 according to an exemplary embodiment of the inventive concept is implemented in the same manner as a level shifter LS0 in FIG. 11.

The peri-voltage selection switch 213 according to the embodiment of the inventive concept may supply the high voltage VPP or the negative voltage for a well voltage NWELL to the gate of the peri-voltage selection transistor 211 (refer to FIG. 14).

Word Line Voltage Selecting Switch Circuit

Figure 16:
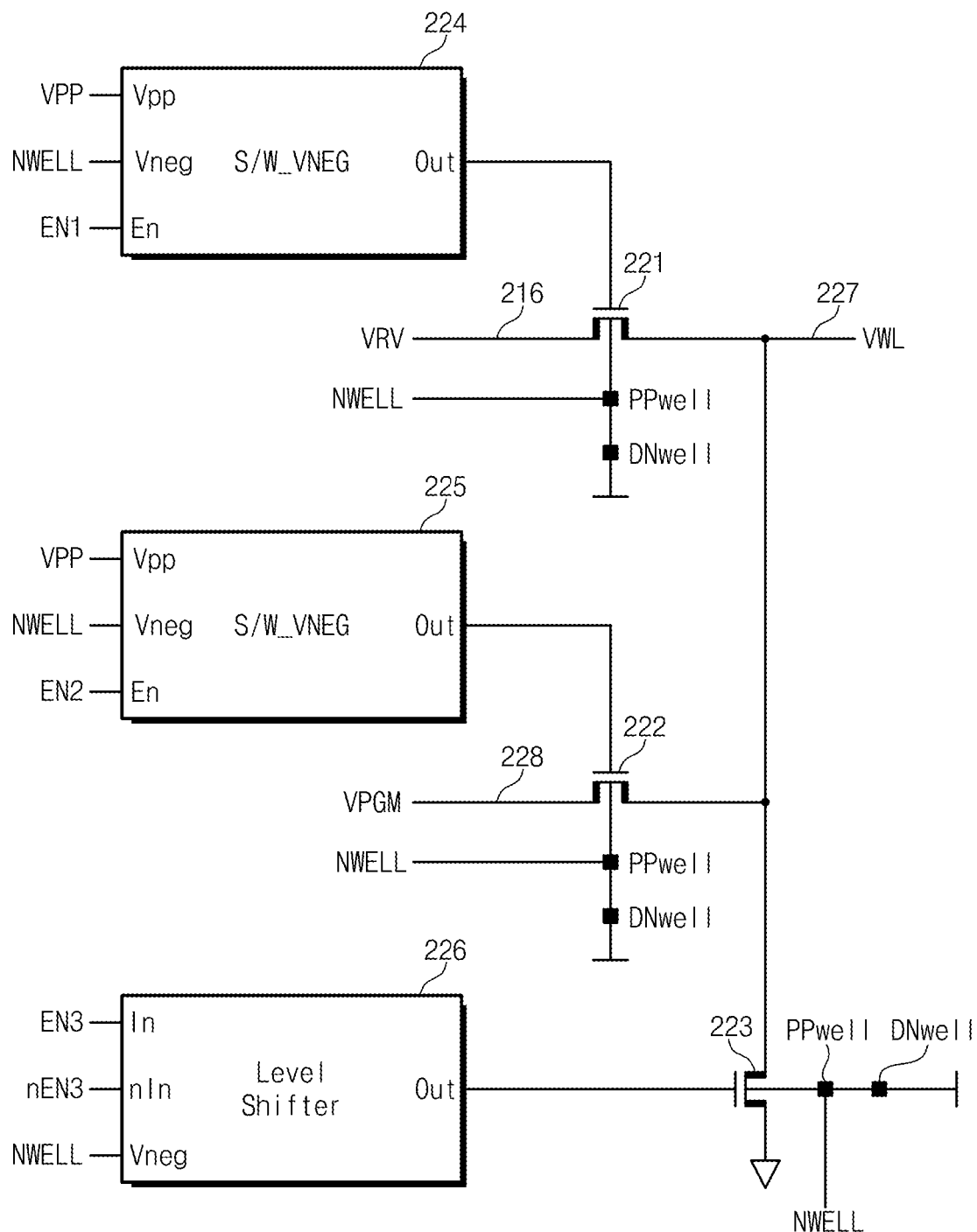
FIG. 16 is a diagram showing an example of a word line voltage selecting switch circuit in FIG. 2.

FIG. 16 is a diagram showing an example of a word line voltage selecting switch circuit in FIG. 2. Referring to FIG. 16, a word line voltage selecting switch circuit 105 includes a read voltage selection transistor 221, a program voltage selection transistor 222, a discharge selection switch 223, a read verification voltage selection switch 224, a program voltage selection switch 225, and a level shifter 226.

The read voltage selection transistor 221 is connected between a line 216 supplied with a read verification voltage VRV and a line 227 supplied with a word line voltage VWL. Herein, the read verification voltage VRV is a read voltage or a verification voltage. The read voltage selection transistor 221 is turned on in response to a first enable signal EN1. A well of the read voltage selection transistor 221 is a p-type well included in a deep n-type well, and is supplied with a negative voltage for a well voltage NWELL.

The program voltage selection transistor 222 is connected between a line 228 supplied with a program voltage VPGM and a line 227 supplied with the word line voltage VWL. The program voltage selection transistor 222 is turned on in response to a second enable signal EN2. A well of the program voltage selection transistor 222 is a p-type well included in a deep n-type well, and is supplied with a negative voltage for a well voltage NWELL.

The discharge selection switch 223 responds to a third enable signal EN3 and decides a discharge of a line 227 supplied with the word line voltage VWL. The discharge selection switch 223 is connected between the line 227 and a ground terminal. A well of the discharge selection switch 223 is a p-type well included in a deep n-type well, and is supplied with a negative voltage for a well voltage NWELL.

The read verification voltage selection switch 224 decides an activation of the read voltage selection transistor 221 in response to the first enable signal EN1. The read verification voltage selection switch 224 includes a high voltage terminal Vpp receiving a high voltage VPP, a well voltage terminal receiving the negative voltage for a well voltage NWELL, an enable terminal En receiving the enable signal EN1, and an output terminal Out outputting a signal corresponding to the enable signal EN1. The read verification voltage selection switch 224 is implemented in the same manner as a peri-voltage selecting switch 213 in FIG. 21.

The program voltage selection switch 225 controls an activation of the program voltage selection transistor 222 in response to the second enable signal EN2. The program voltage selection switch 225 includes a high voltage terminal Vpp receiving the high voltage VPP, a well voltage terminal receiving the negative voltage for a well voltage NWELL, an enable terminal En receiving the enable signal EN1, and an output terminal Out outputting a signal corresponding to the enable signal EN1. The program voltage selection switch 225 is implemented in the same manner as a peri-voltage selecting switch 213 in FIG. 21.

The level shifter 226 converts a level of the third enable signal EN3 and provides the result to a gate of the discharge selection transistor 223. The level shifter 226 includes a positive input terminal In receiving the third enable signal EN3, a negative input terminal nIn receiving an inverted version of the third enable signal EN3, a well voltage terminal receiving the negative voltage for a well voltage NWELL, and an output terminal Out outputting a converted level corresponding to the third enable signal EN3. The level shifter 226 is implemented in the same manner as a level shifter LS0 in FIG. 11.

The word line voltage selecting switch circuit 105 according to the embodiment of the inventive concept may select one of the read verification voltage VRV and the program voltage VPGM corresponding to the enable signals EN1~EN3 and nEN3 as the word line voltage VWL, and supply the selected word line voltage VWL to a corresponding line 227.

Word Line Voltage Selecting Operation

Figure 17:
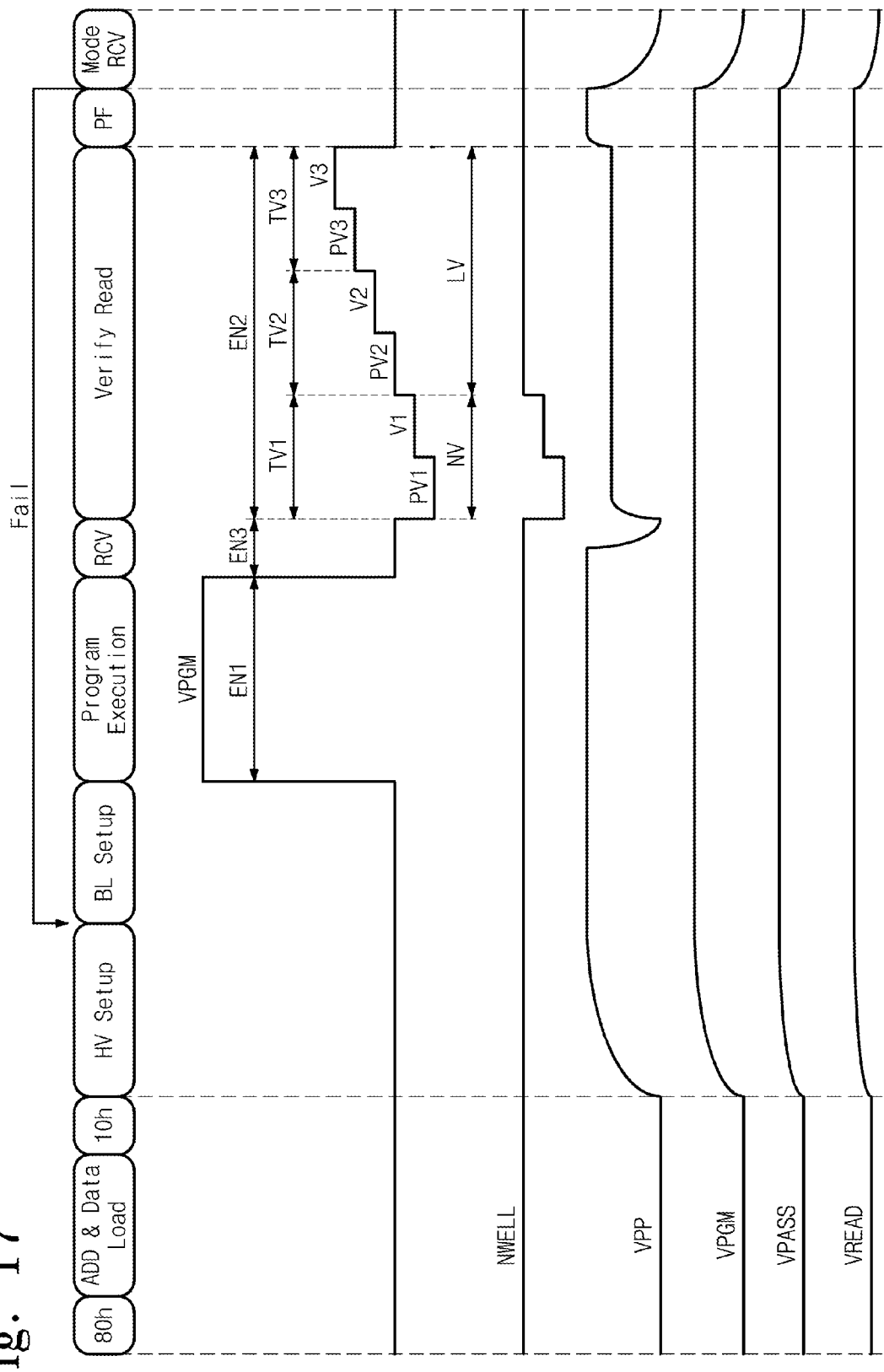
FIG. 17 is a timing diagram of a word line voltage selecting operation of a word line voltage selecting switch circuit in FIG. 16 during a program operation.

FIG. 17 is a timing diagram of a word line voltage selecting operation of a word line voltage selecting switch circuit shown in FIG. 16 during a program operation. Referring to FIGS. 16 and 17, a word line voltage selecting operation of a word line voltage selecting switch circuit 105 is performed as follows. A program operation illustrated in FIG. 17 may be performed by a 2-step verification operation.

After an input of a program operation command 80h, an address ADDR corresponding to a page for writing data and data to be written are loaded. After data loading is completed, a page program operation command 10h is received. A high voltage generator 121 (refer to FIG. 2) is activated in response to the page program operation command 10h. Accordingly, at a high voltage setup period, the high voltage generator 121 generates a high voltage VPP, a program voltage VPGM, a pass voltage VPASS, a read pass voltage VREAD. Further, the high voltage generator 121 may generate the read pass voltage VREAD prior to a verification read period following the page program operation command 10h.

At a bit line setup period, an input/output circuit (not shown) applies a bit line program voltage (e.g., a ground voltage) or a bit line inhibition voltage (e.g., a power supply voltage) to a bit line according to input data at a first program loop. From a second program loop, together with the bit line program voltage and the bit line inhibition voltage, a bit line forcing voltage (e.g., 1V) is applied to a bit line according to a previously performed 2-step verification result. Herein, the bit line forcing voltage is applied to a bit line corresponding to a memory cell which has passed at a pre-verification operation of a 2-step verification operation and has failed at a 2-step verification period.

At a program execution period, a word line voltage selecting switch circuit 105 selects the program voltage VPGM as a word line voltage VWL in response to a first enable signal EN1. The selected word line voltage VWL is applied to a word line corresponding to the input address ADDR.

At a recovery period, the word line voltage selecting switch circuit 105 discharges a word line voltage VWL of at least one line 227 (refer to FIG. 16) corresponding to a selected word line in response to a third enable signal EN3. Afterwards, a verification read operation is performed.

At a verification read period, a first word line voltage selecting switch circuit 105 selects the read verification voltage VRV as a word line voltage VWL in response to a second enable signal EN2. Herein, the read verification voltage VRV may be a negative voltage or a low voltage.

The verification read period illustrated in FIG. 17 includes a first verification period TV1 for verifying a first verification voltage V1, a second verification period TV2 for verifying a second verification voltage V2, and a third verification period TV3 for verifying a third verification voltage V3.

The first verification period TV1 includes a first step verification period verifying by a first pre-verification voltage PV1 and a second step verification period verifying by a first verification voltage V1. At the first verification period, the first pre-verification voltage PV1 and the first verification voltage V1 are a negative voltage. At the first verification period TV1, a negative voltage generator 123 (refer to FIG. 2) is activated to generate a negative voltage for a well voltage NWELL.

The second verification period TV2 includes a first step verification period verifying by a second pre-verification voltage PV2 and a second step verification period verifying by a second verification voltage V2. The third verification period TV3 includes a first step verification period verifying by a third pre-verification voltage PV3 and a second step verification period verifying by a second verification voltage V3. At the second and third verification periods TV2 and TV3, a low voltage generator 122 (refer to FIG. 2) generates voltages PV2, V2, PV3, and V3 by the read verification voltage VRV.

In this embodiment, the first verification period TV1, the second verification period TV2, and the third verification period TV3 may have the same execution time.

In another embodiment, at least one of the first verification period TV1, the second verification period TV2, and the third verification period TV3 may be executed during a different time. Variations of program periods are disclosed in U.S. Pat. No. 7,139,192, the entirety of which is incorporated by reference herein.

If a 2-step verification operation is all completed, a pass/fail on a verification operation is checked. If a verification operation is failed, a program voltage pump 134 (refer to FIG. 3) increases the program voltage VPGM by a predetermined value. Further, in each 2-step verification operation, after a bit line forcing voltage is applied to bit lines corresponding to memory cells failed at a pre-verification period and passed at a second step verification period, program execution is again made. If a verification operation is successful, voltages of overall lines are discharged.

The program method according to the embodiment of the inventive concept may perform a 2-step verification operation by the negative voltages PV1 and V1.

Figure 18:
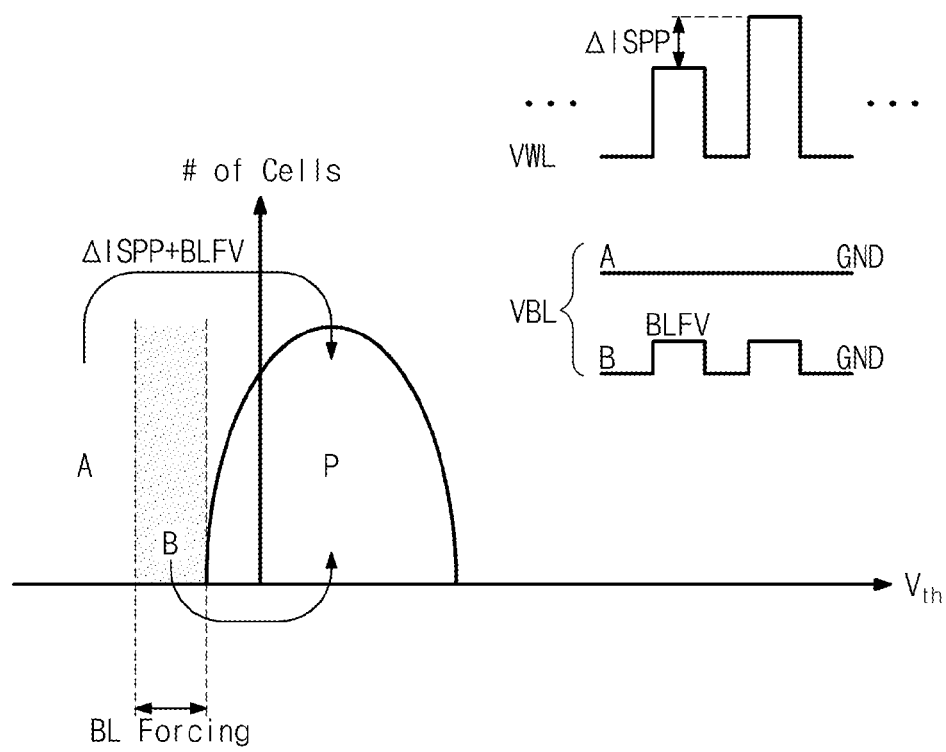
FIG. 18 is a diagram for describing a 2-step verification operation illustrated in FIG. 17.

FIG. 18 is a diagram for describing a 2-step verification operation illustrated in FIG. 17. Referring to FIG. 18, bit line forcing is not made with respect to memory cells A, threshold voltages of which are not included in a predetermined range adjacent to a target program state P. On the other hand, bit line forcing is made with respect to memory cells B, threshold voltages of which are included in the predetermined range adjacent to the target program state P.

Assuming thduring a program operation of the inventive concept is performed in an incremental step pulse program (ISPP) manner, a word line voltage VWL has a program voltage ISPP which is increased by a predetermined increment ΔISPP according to iteration of program loops. Herein, the word line voltage VWL is applied to a selected word line connected with the memory cells A not included within the predetermined range and the memory cells B included within the predetermined range.

During a program operation, a bit line voltage VBL is any one of a bit line program voltage BLPV (e.g., a ground voltage), a bit line forcing voltage BLFV, and a bit line program inhibition voltage (e.g., a power supply voltage). Herein, the bit line forcing voltage BLFV is higher in level than the bit line program voltage BLPV and lower in level than the bit line program inhibition voltage.

Cells to be programmed include memory cells connected with bit lines supplied with the bit line program voltage BLPV and memory cells connected with bit lines supplied with the bit line forcing voltage BLFV. Memory cells connected with bit lines supplied with the bit line program inhibition voltage are program-inhibited memory cells.

Referring to FIG. 18, during a program operation, the bit line program voltage BLPV is applied to bit lines connected with memory cells A not included in a predetermined range, and the bit line forcing voltage BLFV is applied to bit lines connected with memory cells B included in the predetermined range. That is, a program voltage is applied to bit lines corresponding to the memory cells A, and a bit line forcing voltage is applied to bit lines corresponding to the memory cells B.

As a program loop increases, during a program operation, memory cells A slowly programmed experience a word line voltage ISPP, while memory cells B rapidly programed experience a value of (ISPP-BLFV).

The memory cells A slowly programmed further experience by the bit line forcing voltage BLFV as compared with the memory cells B rapidly programmed. Accordingly, the memory cells A slowly programmed can reduce a loop number by a voltage increment corresponding to the bit line forcing voltage BLFV.

For example, assuming that the bit line program voltage BLPV is 0V and the bit line forcing voltage BLFV is 1V, in case of the memory cells B rapidly programmed, a program operation is executed under the condition that a program voltage is applied to a word line and the bit line forcing voltage BLFV of 1V is applied to a bit line. On the other hand, in case of the memory cells A slowly programmed, a program operation is executed under the condition that a program voltage is applied to a word line and 0V is applied to a bit line. As compared with the memory cells B rapidly programmed, about 1V is further applied to the memory cells A slowly programmed. Assuming that 0.3V increases according to a program loop iteration, a program loop may be reduced by three or four times.

In this embodiment, although the memory cells A slowly programmed enter the predetermined range at a next program loop, bit line forcing on the memory cells A is not made until they reach a target program state P. However, the inventive concept is not limited thereto. In another embodiment, if the memory cells A slowly programmed enter the predetermined range at a next program loop, bit line forcing on the memory cells A is made.

A nonvolatile memory device according to an exemplary embodiment of the inventive concept reduces a loop number by not performing bit line forcing with respect to memory cells slowly programmed during a program operation.

An operation of judging slow memory cells A and fast memory cells B, that is, deciding bit line forcing of memory cells, may be made from a pre-verification and a second step verification period. For example, memory cells passed at a pre-verification operation and failed at a second step verification period are judged as fast memory cells B. If a pre-verification operation is failed, memory cells are judged as slow memory cells A.

A program operation according to an exemplary embodiment of the inventive concept is not limited to the 2-step verification operation. For example, program operation according to an exemplary embodiment of the inventive concept may instead be performed using a 1-step verification operation.

Figure 19:
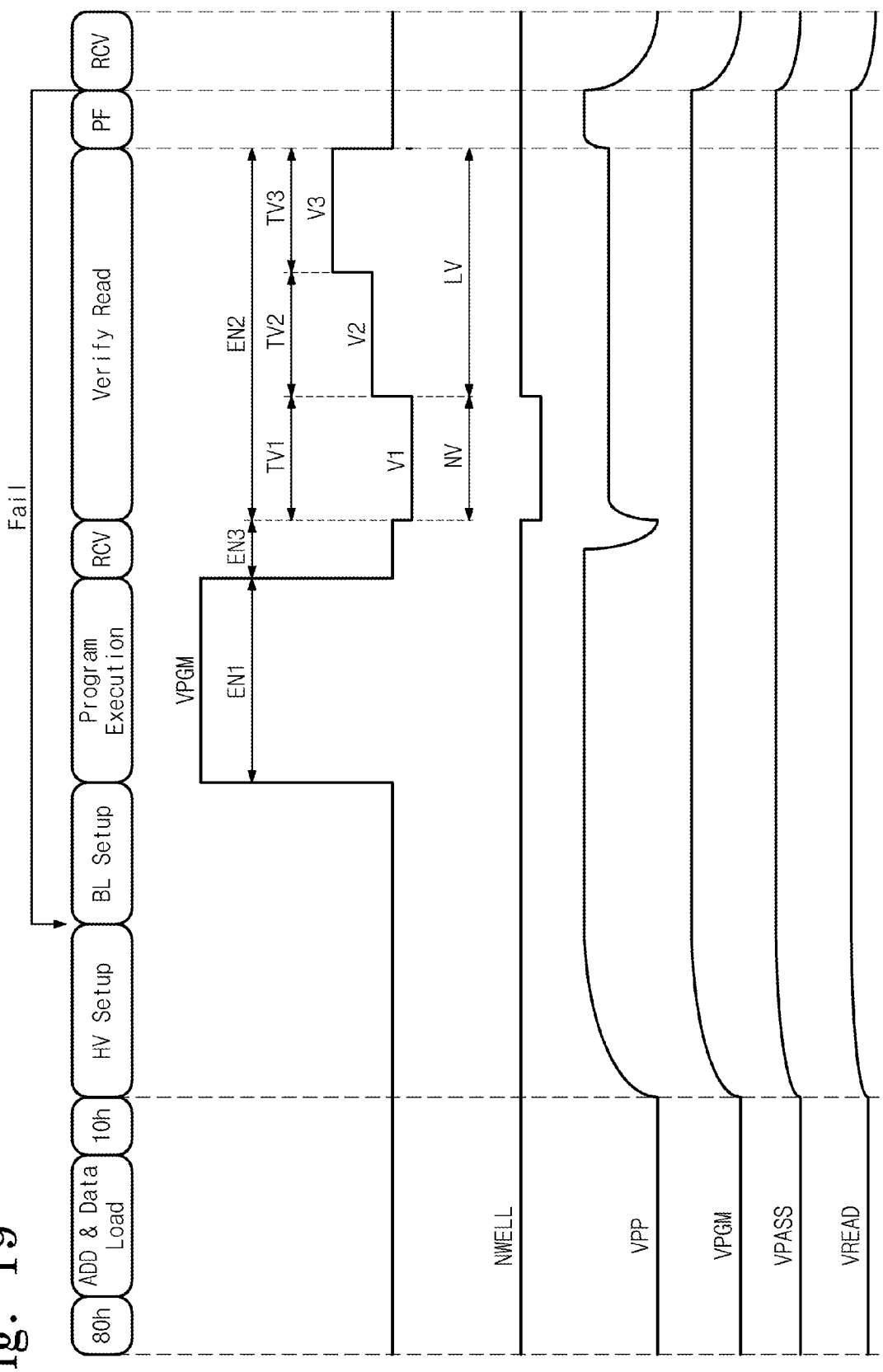
FIG. 19 is a timing diagram of a word line voltage selecting operation of a word line voltage selecting switch circuit in FIG. 18 according to another exemplary embodiment of the inventive concept.

FIG. 19 is a timing diagram of a word line voltage selecting operation of a word line voltage selecting switch circuit in FIG. 18 according to another exemplary embodiment of the inventive concept. A program operation illustrated in FIG. 19 may be performed by a 1-step verification operation.

After an input of a program operation command 80h, an address ADDR corresponding to a page for writing data and data to be written are loaded. After data loading is completed, a page program operation command 10h is received. A high voltage generator 121 (refer to FIG. 2) is activated in response to the page program operation command 10h.

After an input of a program operation command 80h, an address ADDR corresponding to a page for writing data and data to be written are loaded. After data loading is completed, a page program operation command 10h is received. A high voltage generator 121 (refer to FIG. 2) is activated in response to the page program operation command 10h. Accordingly, at a high voltage setup period, the high voltage generator 121 generates a high voltage VPP, a program voltage VPGM, a pass voltage VPASS, a read pass voltage VREAD.

At a bit line setup period, an input/output circuit (not shown) applies a bit line program voltage (e.g., a ground voltage) or a bit line inhibition voltage (e.g., a power supply voltage) according to input data at a first program loop and according to a verification read result from a second program loop.

At a program execution period, a word line voltage selecting switch circuit 105 selects the program voltage VPGM as a word line voltage VWL in response to a first enable signal EN1. The selected word line voltage VWL is applied to a word line corresponding to the input address ADDR.

At a recovery period, the word line voltage selecting switch circuit 105 discharges a word line voltage VWL of at least one line 226 (refer to FIG. 22) corresponding to a selected word line in response to a third enable signal EN3. Afterwards, a verification read operation is performed.

At a verification read period, a first word line voltage selecting switch circuit 105 selects the read verification voltage VRV as a word line voltage VWL in response to a second enable signal EN2. Herein, the read verification voltage VRV may be a negative voltage or a low voltage.

The verification read period illustrated in FIG. 19 includes a first verification period TV1 for verifying a first verification voltage V1, a second verification period TV2 for verifying a second verification voltage V2, and a third verification period TV3 for verifying a third verification voltage V3.

At the first verification period TV1, the first verification voltage V1 is a negative voltage. At the first verification period TV1, a negative voltage generator 123 (refer to FIG. 2) is activated to generate a negative voltage for a well voltage NWELL.

At the second and third verification periods TV2 and TV3, a low voltage generator 172 (refer to FIG. 2) generates the read verification voltage VRV.

If a 2-step verification operation is completed, a pass/fail on a verification operation is checked. If a verification operation is failed, a program voltage pump 134 (refer to FIG. 3) increases the program voltage VPGM by a predetermined value. At this time, the generated program voltage VPGM is a new program voltage VPGM. If a verification operation is successful, voltages of overall lines are discharged.

The program method according to the embodiment of the inventive concept may perform a 1-step verification operation by the negative voltage V1.

Selection Line Driver Circuit

Figure 20:
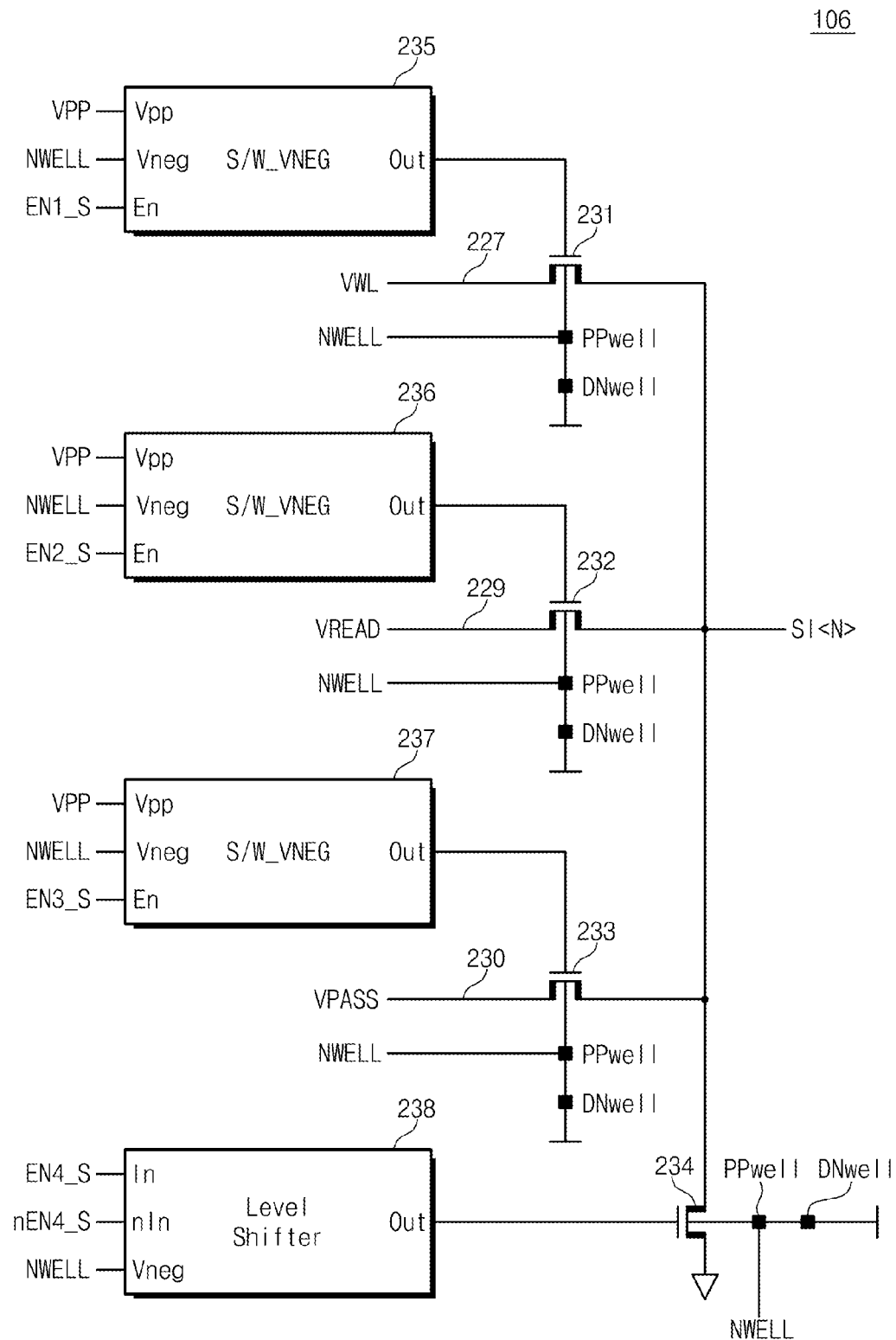
FIG. 20 is a diagram showing an example of a selection line driver circuit in FIG. 2.

FIG. 20 is a diagram showing an example of a selection line driver circuit in FIG. 2. Referring to FIG. 20, a selection line driver circuit 106 includes a word line voltage selection transistor 231, a read pass voltage selection transistor 232, a pass voltage selection transistor 233, a discharge selection transistor 234, a word line voltage selection switch 235, a read pass voltage selection switch 236, a pass voltage selection switch 237, and a level shifter 238.

The word line voltage selection transistor 231 is connected between a line 227 supplied with a word line voltage VWL and a selection line SI<N>. Herein, the selection line SI<N> is an nth selection line. The word line voltage selection transistor 231 is turned on in response to an enable signal EN1_S. Herein, the enable signal EN 1_S has a high level during a program execution period. A well of the word line voltage selection transistor 231 is a p-type well included in a deep n-type well, and is supplied with a negative voltage for a well voltage NWELL.

The read pass voltage selection transistor 232 is connected between a line 228 supplied with a read pass voltage VREAD and the selection line SI<N>. The read pass voltage selection transistor 232 is turned on in response to an enable signal EN2_S. Herein, the enable signal EN2_S has a high level at a read operation period or a verification read period. A well of the read pass voltage selection transistor 232 is a p-type well included in a deep n-type well, and is supplied with a negative voltage for a well voltage NWELL.

The pass voltage selection transistor 233 is connected between a line 229 supplied with a pass voltage VPASS and the selection line SI<N>. The pass voltage selection transistor 233 is turned on in response to an enable signal EN3_S. Herein, the enable signal EN3_S has a high level at the program execution period. A well of the pass voltage selection transistor 233 is a p-type well included in a deep n-type well, and is supplied with a negative voltage for a well voltage NWELL.

The discharge selection transistor 234 controls a discharge of the selection line SI<N> in response to an enable signal EN4_S. The discharge selection transistor 234 is connected between the selection line SI<N> and a ground terminal. A well of the discharge selection transistor 234 is a p-type well included in a deep n-type well, and is supplied with a negative voltage for a well voltage NWELL.

The word line voltage selection transistor 231, the read pass voltage selection transistor 232, and the pass voltage selection transistor 233 are implemented in the same manner as a selection switch circuit 163 in FIG. 15.

The level shifter 238 converts a level of the enable signal EN4_S to provide the level shifted result to a gate of the discharge selection transistor 234. The level shifter 238 includes a positive input terminal In receiving the enable signal EN4_S, a negative input terminal nIn receiving an inverted version of the enable signal EN4_S, a well voltage terminal receiving the negative voltage for a well voltage NWELL, and an output terminal Out outputting a converted level corresponding to the enable signal EN4_S. The level shifter 238 is implemented in the same manner as a level shifter LS0 in FIG. 11.

For convenience of explanation, one selection line driver is illustrated in FIG. 20. A selection line driver circuit 106 in FIG. 2 may include selection line drivers corresponding to word lines included in one memory block, respectively.

The selection line driver circuit 106 according to the embodiment of the inventive concept may supply one of the word line voltage VWL, the read pass voltage VREAD and the pass voltage VPASS corresponding to the enable signals EN1_S~EN4_S and nEN4_S to a corresponding selection line SI<N>.

Selection Line Selecting Switch Circuit

Figure 21:
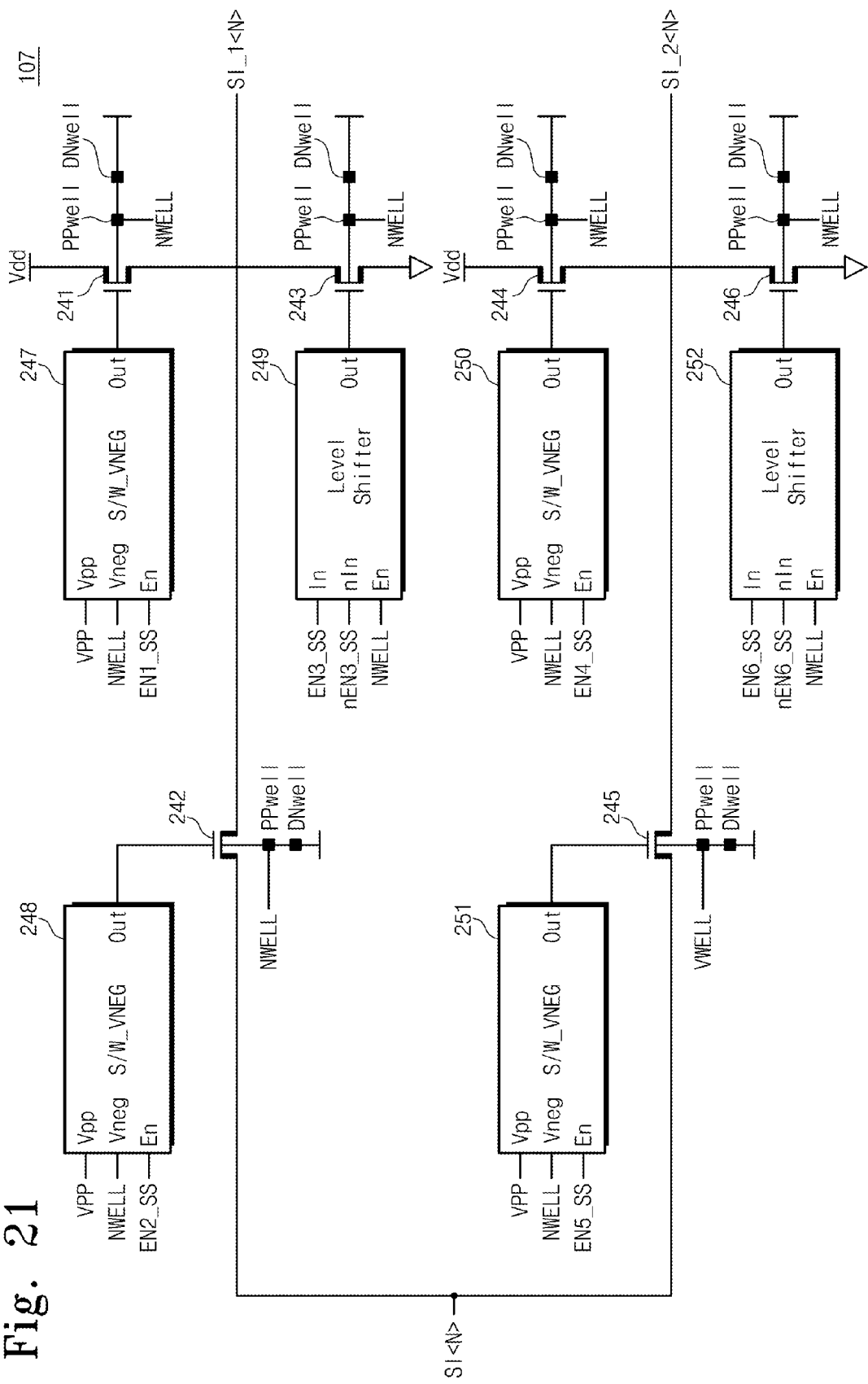
FIG. 21 is a diagram showing an example of a selection line selecting switch circuit in FIG. 2.

FIG. 21 is a diagram showing an example of a selection line selecting switch circuit in FIG. 2. Referring to FIG. 21, a selection line selecting switch circuit 107 includes first and second power supply voltage selection transistors 241 and 244, first and second selection line selection transistors 242 and 245, first and second discharge selection transistors 243 and 246, first and second power supply voltage selection switches 247 and 250, first and second selection line selection switches 248 and 251, and first and second level shifters 251 and 252.

The first power supply voltage selection transistor 241 applies a power supply voltage VDD to a first selection line SI_1<N>) in response to an enable signal EN1_SS. A well of the first power supply voltage selection transistor 241 is a p-type well included in a deep n-type well, and is supplied with a negative voltage for a well voltage NWELL.

The first selection line selection transistor 242 connects a selection line SI<N> with a first selection line SI_1<N>) in response to an enable signal EN2_SS. A well of the first selection line selection transistor 242 is a p-type well included in a deep n-type well, and is supplied with a negative voltage for a well voltage NWELL.

The first discharge selection transistor 243 decides a discharge of the first selection line SI_1<N> in response to an enable signal EN3_SS. The discharge selection transistor 243 is connected between the first selection line SI_1<N> and a ground terminal. A well of the first discharge selection transistor 244 is a p-type well included in a deep n-type well, and is supplied with a negative voltage for a well voltage NWELL.

The second power supply voltage selection transistor 244 applies a power supply voltage VDD to a second selection line SI_2<N>) in response to an enable signal EN2_SS. A well of the second power supply voltage selection transistor 244 is a p-type well included in a deep n-type well, and is supplied with a negative voltage for a well voltage NWELL.

The second selection line selection transistor 245 connects a selection line SI<N> with a second selection line SI_2<N> in response to an enable signal EN5_SS. A well of the first selection line selection transistor 245 is a p-type well included in a deep n-type well, and is supplied with a negative voltage for a well voltage NWELL.

The second discharge selection transistor 246 decides a discharge of the second selection line SI_2<N> in response to an enable signal EN6_SS. The second discharge selection transistor 246 is connected between the first selection line SI_1<N> and a ground terminal. A well of the discharge selection transistor 243 is a p-type well included in a deep n-type well, and is supplied with a negative voltage for a well voltage NWELL.

The selection switches 247, 248, 250, and 251 are implemented in the same manner as a selection switch 213 in FIG. 15.

The level shifters 253 and 254 are implemented in the same manner as a level shifter LS0 in FIG. 11.

The selection line selecting switch circuit 107 according to the embodiment of the inventive concept may electrically connect the selection line SI<N> corresponding to the enable signals EN1_SS~EN6_SS, nEN3_SS and nEN6_SS to one of the first selection line SI_1<N> and the second selection line SI_2<N>.

Well Voltage Selecting Switch Circuit

Figure 22:
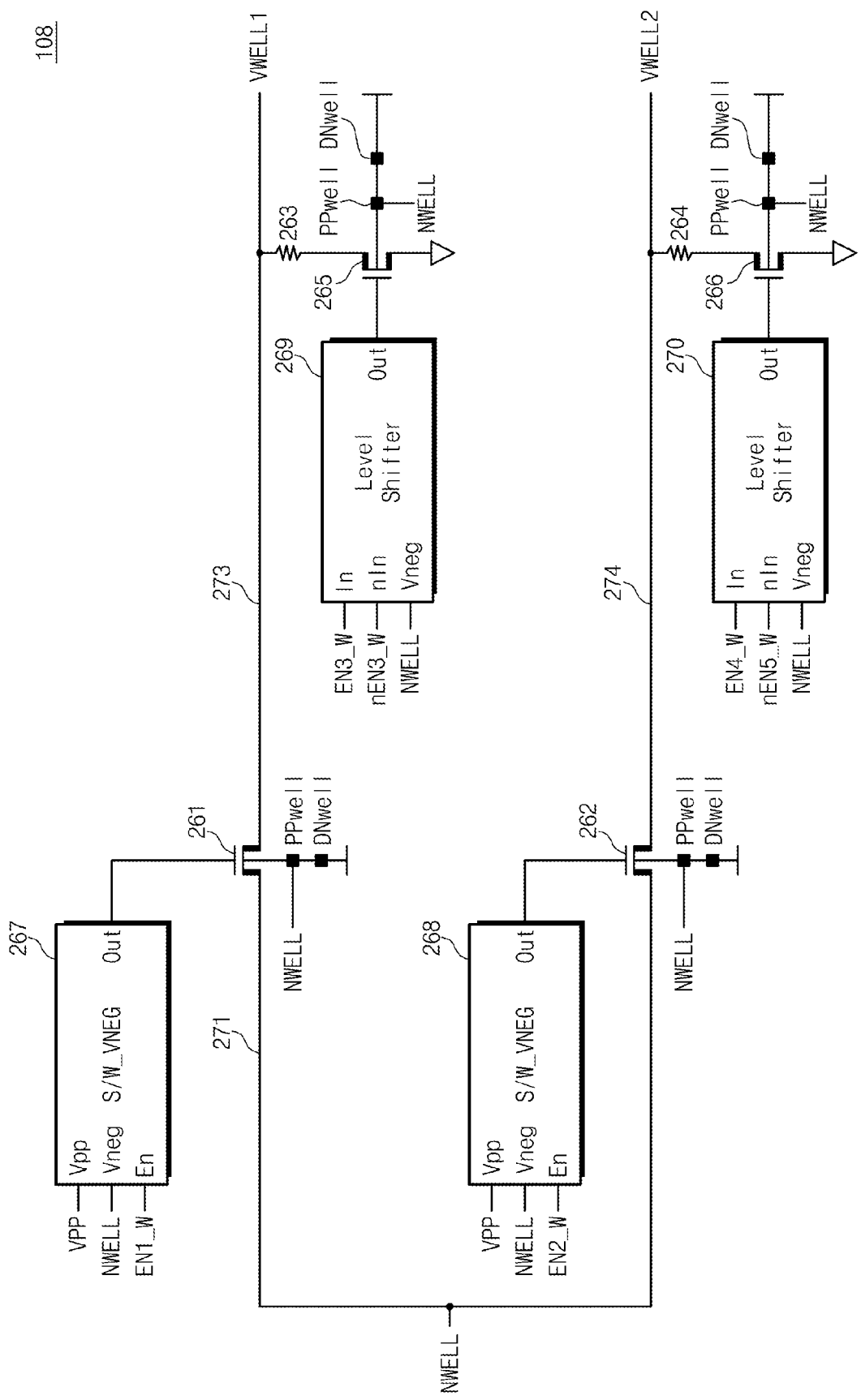
FIG. 22 is a diagram showing an example of a well voltage selecting switch circuit in FIG. 2.

FIG. 22 is a diagram showing an example of a well voltage selecting switch circuit in FIG. 2. Referring to FIG. 22, a well voltage selecting switch circuit 108 includes first and second well voltage selection transistors 261 and 262, first and second resistors 263 and 264, first and second discharge selection transistors 265 and 266, first and second well voltage selection switches 267 and 268, and first and second level shifters 269 and 270.

The first well voltage selection transistor 261 electrically connects a line 271 supplied with a negative voltage for a well voltage NWELL and a line 272 supplied with a first well voltage VWELL1 in response to an enable signal EN1_W. A well of the first well voltage selection transistor 261 is a p-type well included in a deep n-type well, and is supplied with a negative voltage for a well voltage NWELL.

The second well voltage selection transistor 262 electrically connects a line 271 supplied with a negative voltage for a well voltage NWELL and a line 272 supplied with a second well voltage VWELL2 in response to an enable signal EN4_W. A well of the second well voltage selection transistor 262 is a p-type well included in a deep n-type well, and is supplied with a negative voltage for a well voltage NWELL.

The first resistor 263 has one end connected with the line 272 to which the first well voltage VWELL1 is applied. The first resistor 263 prevents a large amount of current from flowing instantly at a discharge operation. The reason for this is that transistors operate abnormally due to a snap back phenomenon when a high voltage (e.g., 20V) is discharged instantly to 0V.

The second resistor 264 has one end connected with the line 272 to which the second well voltage VWELL2 is applied. The second resistor 264 prevents a much amount of current from flowing instantly at a discharge operation.

The first discharge selection transistor 265 is connected between the other end of the first resistor 263 and a ground terminal, and decides a discharge of the line 271 supplied with the first well voltage VWELL1 in response to an enable signal EN3_W.

The second discharge selection transistor 266 is connected between the other end of the second resistor 264 and a ground terminal, and decides a discharge of the line 272 supplied with the second well voltage VWELL2 in response to an enable signal EN6_W.

The first and second well voltage selection switches 267 and 268 are implemented in the same manner as a selection switch 213 in FIG. 15.

The first and second level shifters 267 and 268 are implemented in the same manner as a level shifter LS0 in FIG. 11.

The well voltage selecting switch circuit 108 according to the embodiment of the inventive concept may use the negative voltage for a well voltage NWELL corresponding to the enable signals EN1_W~EN4_W, nEN3_W and nEN4_W as one of the first well voltage VWELL1 and the second well voltage VWELL2.

First Embodiment of Row Decoder

Figure 23:
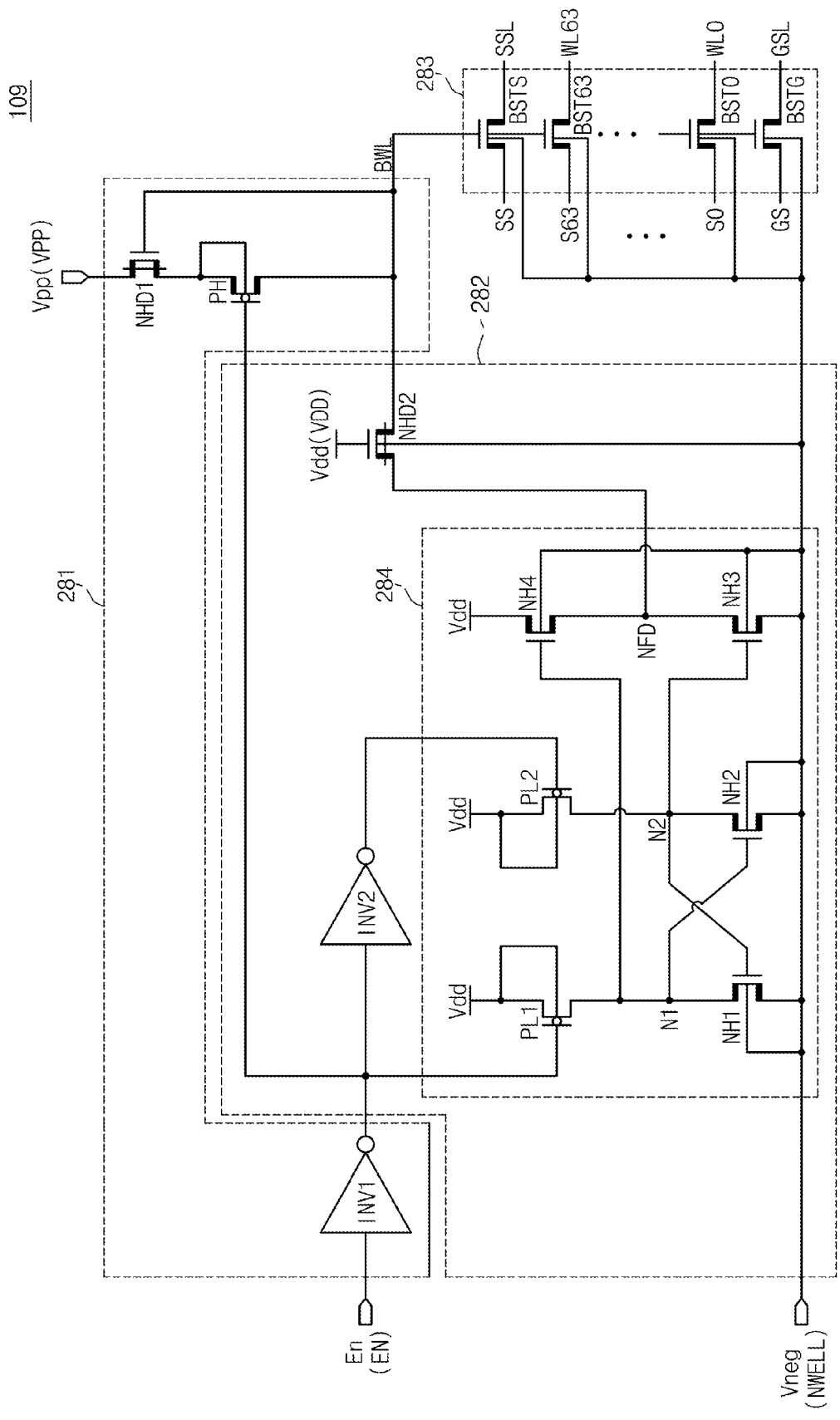
FIG. 23 is a diagram showing a row decoder in FIG. 2 according to the first embodiment of the inventive concept.

FIG. 23 is a diagram showing a row decoder in FIG. 2 according to the first embodiment of the inventive concept. For convenience of explanation, one row decoder is illustrated in FIG. 23. However, a memory device of the inventive concept includes row decoders corresponding to memory blocks, respectively. Referring to FIG. 23, the row decoder 109 includes a pull-up circuit 281, a pull-down circuit 282, and a voltage transfer circuit 283.

The pull-up circuit 281 is connected between a high voltage VPP and a block word line BWL, and applies the high voltage VPP to the block word line BWL in response to a voltage transfer enable signal EN. Herein, the enable signal EN is decided by a combination of a voltage transfer enable signal and a discharge signal determined according to an input address ADDR.

The pull-up circuit 281 includes a first depletion transistor NHD1, a PMOS transistor PH, and a first inverter INV1. The first depletion transistor NHD1 has a drain connected with the high voltage VPP and a gate connected with the block word line BWL. The PMOS high voltage transistor PH has a source connected with a source of the depletion transistor NHD1, a drain connected with the block word line BWL, and a gate connected to receive an inverted version of the voltage transfer enable signal EN. Herein, the inverted version of the voltage transfer enable signal EN is an output of the first inverter INV1. The pull-up circuit 281 applies the high voltage VPP to the block word line BWL in response to the voltage transfer enable signal EN having a high level. The high voltage VPP is applied to the block word line BWL via the following procedure.

If the voltage transfer enable signal EN having a high level is input, the first inverter INV1 outputs a low-level signal. The PMOS high voltage transistor PH is turned on by the low-level signal. At this time, it is assumed that an initial level of the block word line is 0V. Accordingly, the depletion transistor NHD1 applies a threshold voltage (e.g., about 2V) of the first depletion transistor NHD1 in response to a gate voltage of 0V. This means that a voltage of the block word line BWL increases. At the same time, the increased voltage of the block word line BWL is fed back to a gate of the first depletion transistor NHD1. The first depletion transistor NHD1 increases a voltage of block word line BWL in response to a feedback voltage. The first depletion transistor NHD1 prevents a voltage of the block word line BWL from increasing sharply. The voltage of the block word line BWL increases up to the high voltage VPP via iteration of the above-described operation.

On the other hand, if the voltage transfer enable signal EN having a low level is input, the first inverter INV1 outputs a high-level signal. The PMOS high voltage transistor PH is turned off by the high-level signal.

When the high voltage VPP is applied to the block word line BWL, the pull-down circuit 282 electrically isolates the block word line BWL from a voltage applied to a well of a row decoder 109. Further, the pull-down circuit 282 electrically connects the block word line BWL with a well of the row decoder 109 in response to the voltage transfer enable signal EN. That is, the pull-down circuit 282 applies a well voltage applied to a well of a row decoder to the block word line BWL in response to an inverted version of the voltage transfer enable signal EN.

The pull-down circuit 282 includes a second depletion transistor NHD2, Low voltage PMOS transistors PL1 and PL2, High voltage NMOS transistors NH1 to NH4, and first and second inverters INV1 and INV2.

The second depletion transistor NHD2 is connected between a block word line BWL and a block node NFD. The second depletion transistor NHD2 electrically connects the pull-down circuit with the block word line BWL in response to the voltage transfer enable signal EN having a low level. The second depletion transistor NHD2 electrically isolates the pull-down circuit from the block word line BWL in response to the voltage transfer enable signal EN having a high level.

Isolation of the pull-down circuit from the block word line BWL in response to the voltage transfer enable signal EN having a high level will be performed as follows. The first inverter outputs a low-level signal in response to a high level of the voltage transfer enable signal EN. The PMOS transistor PL1 is turned on in response to the low-level signal. The power supply voltage VDD is applied to a gate of the third NMOS high voltage transistor NH3 according to a turn-on of the PMOS low voltage transistor PL1. This enables the third NMOS high voltage transistor NH3 to be turned on. Accordingly, the power supply voltage VDD is applied to the blocking node NFD. At this time, if a voltage of the node NFD increases by a threshold voltage of the second depletion transistor NHD2, the second depletion transistor NHD2 is shut off. The pull-down circuit 282 is electrically isolated from the block word line BWL in response to a high level of a block enable signal EN.

Meanwhile, at a discharge operation, the second depletion transistor NHD2 prevents a high voltage VPP of the block word line BWL from being discharged sharply.

Connecting of the pull-down circuit with the block word line BWL in response to the voltage transfer enable signal EN having a low level will be performed as follows. If a low level of the voltage transfer enable signal EN is input, the first inverter INV1 outputs a high-level signal, and the second inverter INV2 outputs a low-level signal in response to a high-level signal output from the first inverter INV1. The second PMOS low voltage transistor PL2 is turned on in response to a low-level signal output from the second inverter INV2. When the PMOS transistor PL2 is turned on, the power supply voltage VDD is applied to a gate of the NMOS high voltage transistor NH4. This means that the NMOS high voltage transistor NH4 is turned on and the first well voltage VWELL1 is applied to the blocking node NFD. The first well voltage VWELL1 of the first blocking node NFD is applied to the block selection line BWL via the second depletion transistor NHD2.

Meanwhile, if a voltage of the block word line BWL is 0V, the first well voltage VWELL1 of the blocking node NFD is applied to the block word line BWL by the second depletion transistor NHD2. On the other hand, if a voltage of the block word line BWL is a high voltage VPP, the second depletion transistor NHD2 discharges the high voltage VPP of the block word line BWL. This means that a voltage of the block word line BWL is set to the first well voltage VWELL1.

The voltage transfer circuit 283 connects selection lines S0 to S63, a string line SS, and a ground line GS with word lines WL0 to WL63, a string selection line SSL, and a ground selection line GSL in response to the high voltage VPP applied to the block word line BWL, respectively. For convenience of explanation, the number of word lines is limited to 64. However, the number of word lines is not limited thereto.

A plurality of memory blocks of a first mat 101 (refer to FIG. 2) shares the selection lines S0 to S63. Voltages (e.g., a program voltage, a pass voltage, a read voltage, and a verification voltage) generated by a voltage generator 103 (refer to FIG. 2) at a program/read/erase operation are applied to the selection lines S0 to S63. The plurality of memory blocks shares the string line SS and the ground line GS.

The voltage transfer circuit 283 includes a plurality of block selection transistors BTS, BT0 to BT63, and BTG. Gates of the block selection transistors BTS, BT0 to BT63, and BTG are all connected with the block word line. A well of the block selection transistors BTS, BT0 to BT63, and BTG is implemented such that the first well voltage VWELL1 is applied thereto.

The first and second Low voltage PMOS transistors PL1 and PL2 and the first to fourth High voltage NMOS transistors NH1, NH2, NH3, and NH4 constitute a level shifter 284. Herein, the level shifter 284 is implemented in the same manner as a level shifter LS0 in FIG. 11.

Figure 24:
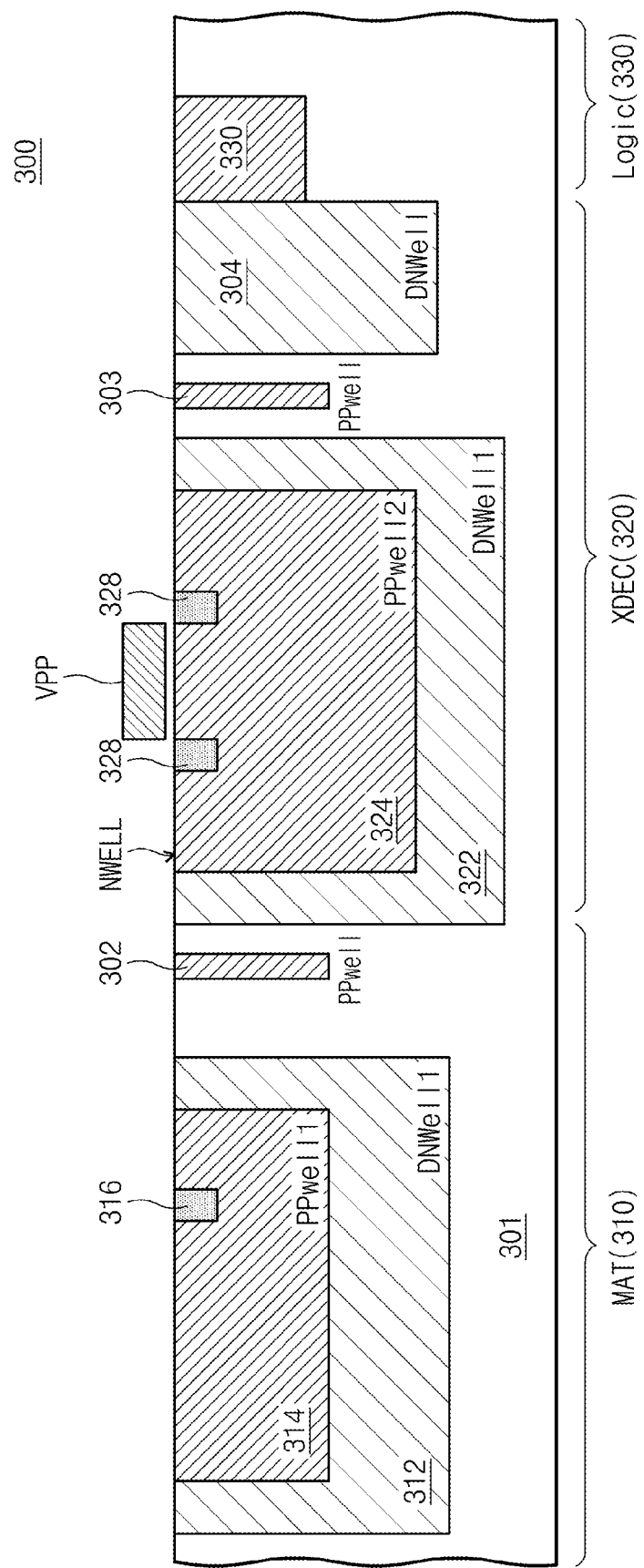
FIG. 24 is a diagram showing a cross section of a row decoder according to an exemplary embodiment of the inventive concept.

FIG. 24 is a diagram showing a cross section of a row decoder according to an exemplary embodiment of the inventive concept. Referring to FIG. 24, a mat 310, a row decoder 320, and a logic circuit 330 are formed at a large well 301. An isolation film 302 is formed for isolation between the mat 310 and the row decoder 320, and isolation films 303 and 304 are formed for isolation between the row decoder 320 and the logic circuit 330.

Referring to the mat 310, a deep n-type well 312 is formed in a p-type well 301, and a p-type well 314 is formed in the n-type well 312. Herein, memory cells may be formed on the p-type well using an n-type active layer 316.

Referring to the row decoder 320, a deep n-type well 322 is formed in a p-type well 301, and a p-type well 324 is formed in the n-type well 322. Herein, circuits (e.g., a row decoder 109 illustrated in FIG. 23) may be formed on the p-type well 324 using an n-type active layer 328.

The above-described well of the row decoder 120 means the p-type well 324. A well voltage VWELL1 is applied to the p-type well 324, and a high voltage VPP is applied to the n-type active layer 328. Although not shown, the well voltage VWELL1 is applied to the p-type well 324 via a contact.

The n-type well 322 is biased by 0V or a power supply voltage VDD. The n-type well 322 satisfies a reverse bias condition with the p-type well 324. This prevents a forward current from flowing at a PN junction.

The p-type well 324 is biased by a negative voltage when a negative voltage is provided to a word line and by 0V when a negative voltage is not used.

As shown in FIG. 24, a PN junction is formed between the p-type well 324 and the n-type active layer 328. In case of a transistor supplied with a high voltage VPP, when a well voltage VWELL1 applied to the p-type well 324 is a negative voltage, a voltage across the PN junction may correspond to a sum of the high voltage VPP and an absolute value of a negative voltage. This means that a PN junction of a transistor supplied with the high voltage VPP and formed at the p-type well 324 supplied with a negative voltage can be broken down. To prevent break-down of the PN junction, when a negative voltage is applied to the p-type well 324, a voltage level of the high voltage VPP lowers.

High Voltage Varying Method

Below, a high voltage varying method will be more fully described with reference to FIGS. 25 to 27.

Figure 25:
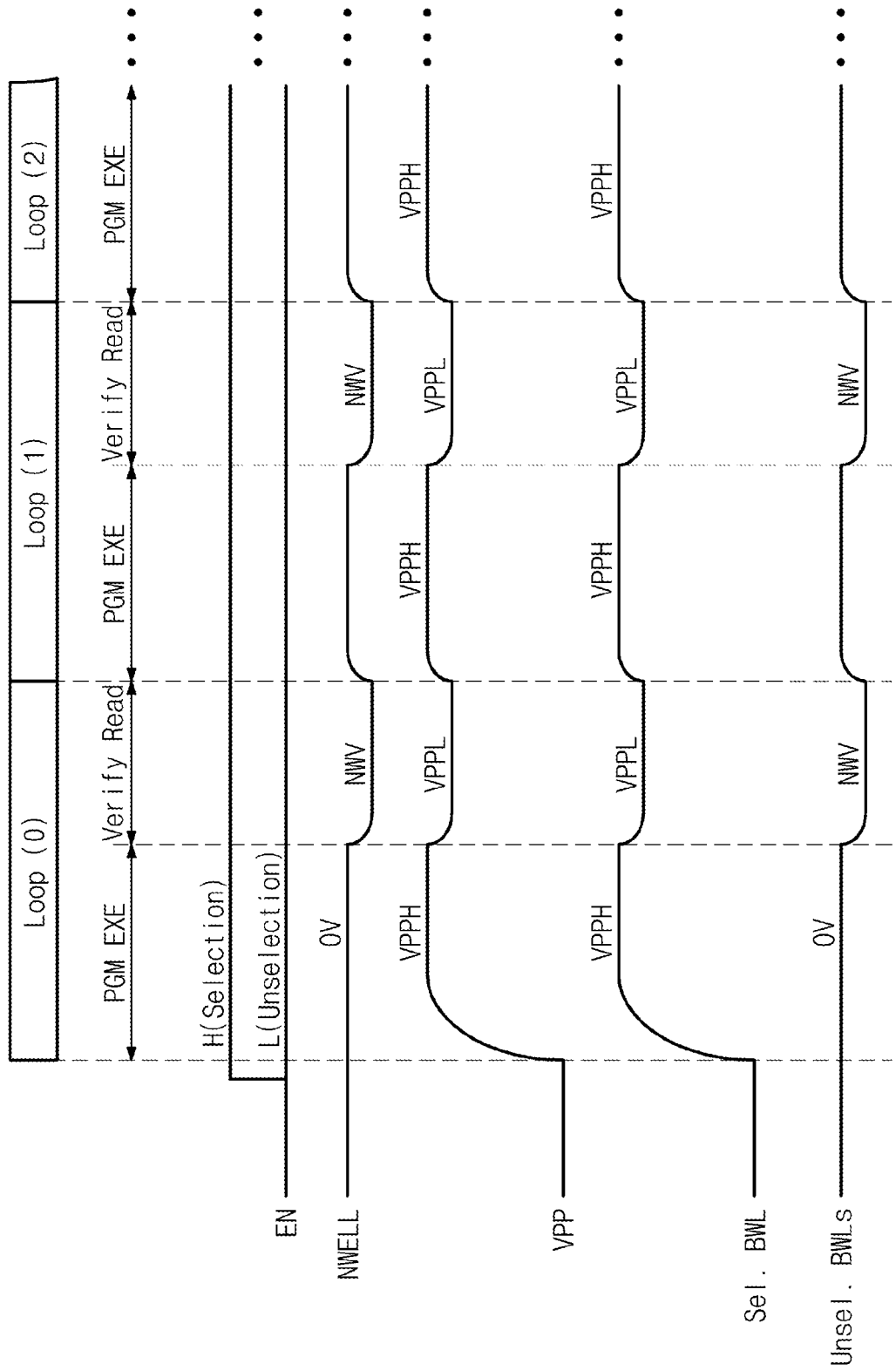
FIG. 25 is a diagram showing an embodiment of a voltage control method during a program operation of a nonvolatile memory device in FIG. 2.

FIG. 25 is a timing diagram showing an embodiment of a voltage control method during a program operation of a nonvolatile memory device in FIG. 2. Referring to FIG. 25, a voltage may be controlled during a program operation as follows.

In the case of a memory block selected by an input address ADDR, an enable signal EN has a high level. During a program execution period of a first program loop 0, control logic 111 (refer to FIG. 2) controls a high voltage generator 121 (refer to FIG. 2) so as to apply a well voltage VWELL of 0V and to generate a high voltage VPP having a first level VPPH. At this time, a row decoder 109/110 (refer to FIG. 2) applies the first level VPPH of the high voltage VPP to a selected block word line BWL in response to a high level of an enable signal EN.

Afterwards, during a verification read period of the first program loop 0, the control logic 111 controls a negative voltage generator 123 (refer to FIG. 2) so as to generate a well voltage VWELL having a negative level NWV and the high voltage generator 121 so as to generate the high voltage VPP having a second level VPPL. Herein, the second level VPPL is lower in level than the first level VPPH. A difference between the second level VPPL and the negative level NWV is less in level than an junction breakdown voltage (e.g., 30V) of a depletion transistor NHD2 (refer to FIG. 24). At this time, the row decoder 109/110 applies the second level VPPL of a voltage to a selected block word line Sel. BWL in response to a high level of the enable signal EN.

Meanwhile, in case of memory blocks unselected by the input address ADDR, the enable signal EN has a low level. At the program execution period of the first program loop 0, the well voltage VWELL of 0V is applied to unselected block word lines Unsel. BWLs in response to the low level of the enable signal EN.

Afterwards, at the verification read period of the first program loop 0, the well voltage VWELL having a negative level NWV is applied to the unselected block word lines Unsel. BWLs in response to the low level of the enable signal EN.

The above-described process of the first program loop 0 may be identically applied to remaining program loops (1, 2, . . . ).

As set forth above, a nonvolatile memory device 100 lowers a level of the high voltage VPP when a well voltage having a negative level is applied during a verification period.

Figure 26:
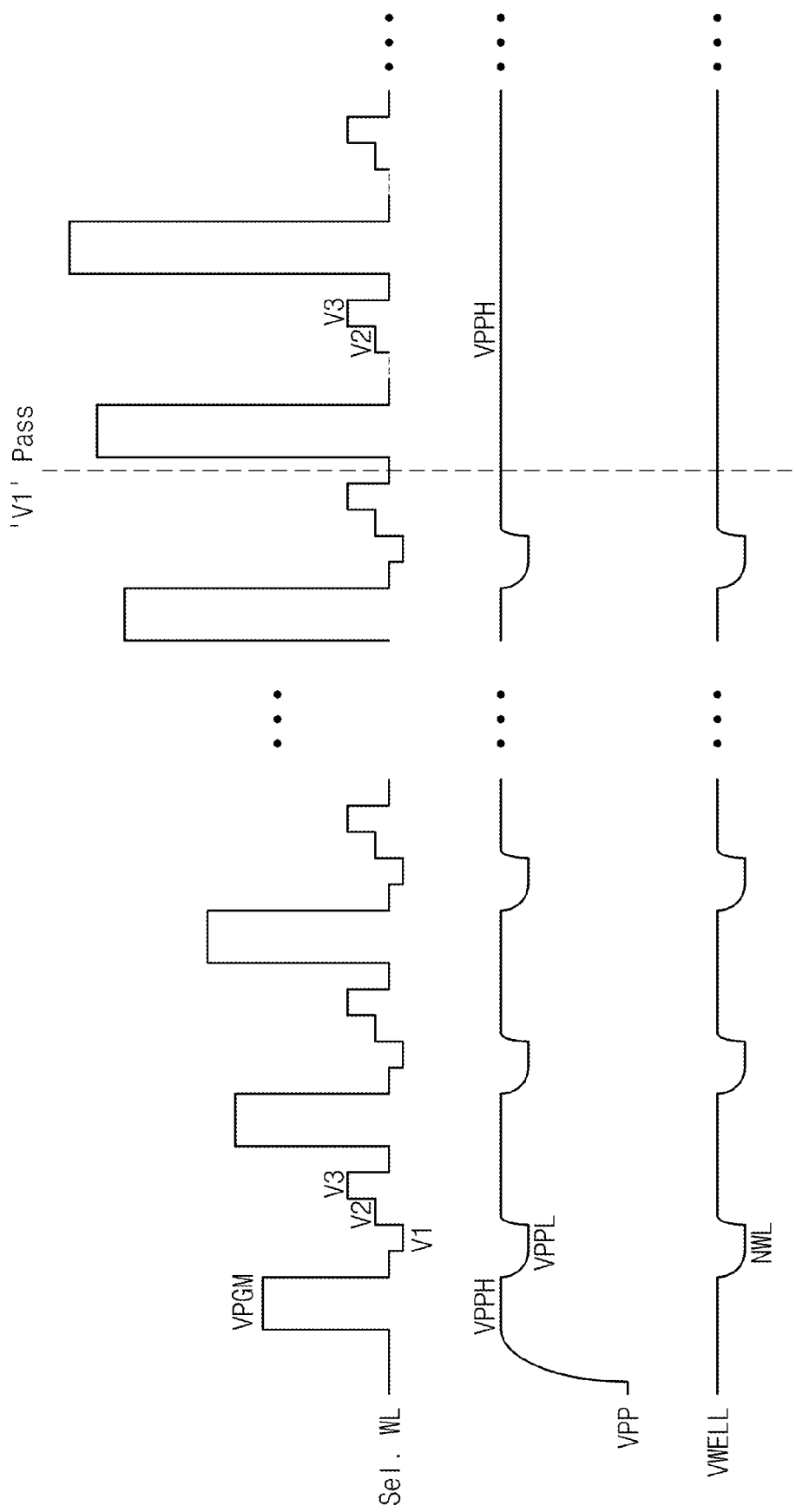
FIG. 26 is a diagram showing a method of controlling a well voltage and a high voltage during a program operation according to the first embodiment of the inventive concept.

FIG. 26 is a diagram showing a method of controlling a well voltage and a high voltage during a program operation according to the first embodiment of the inventive concept. Referring to FIG. 26, until a first verification read operation is passed, during a first verification period, a well voltage VWELL has a first negative level NWV1, and a high voltage VPP has a level VPPL1. After the first verification read operation is passed, during the first verification period, the well voltage VWELL has 0V and the high voltage VPP has a level VPPH.

Until a second verification read operation is passed, during a second verification period, the well voltage VWELL has a second negative level NWV2, and the high voltage VPP has a level VPPL2. Herein, the second negative level NWV2 is higher than the first negative level NVW1, and the level VPPL2 is higher than the level VPPL1. After the second verification read operation is passed, during the second verification period, the well voltage VWELL has 0V and the high voltage VPP has a level VPPH.

Meanwhile, the passed verification period of operation is included in a next program loop or not included therein. For example, after the first verification read operation is passed and until a second verification read operation is passed, as represented by a dotted line in FIG. 26, the first verification period is included or not included in a program loop. Further, after the second verification read operation is passed and until a third verification read operation is passed, the first and second verification periods are included or not included in a program loop.

As described above, a well voltage VWELL is 0V at periods other than the first or second verification period. However, the well voltage need not be 0V at periods other than the first or second verification period. The well voltage VWELL has a level higher than the second negative level NWL2 at periods other than the first or second verification period.

Figure 27:
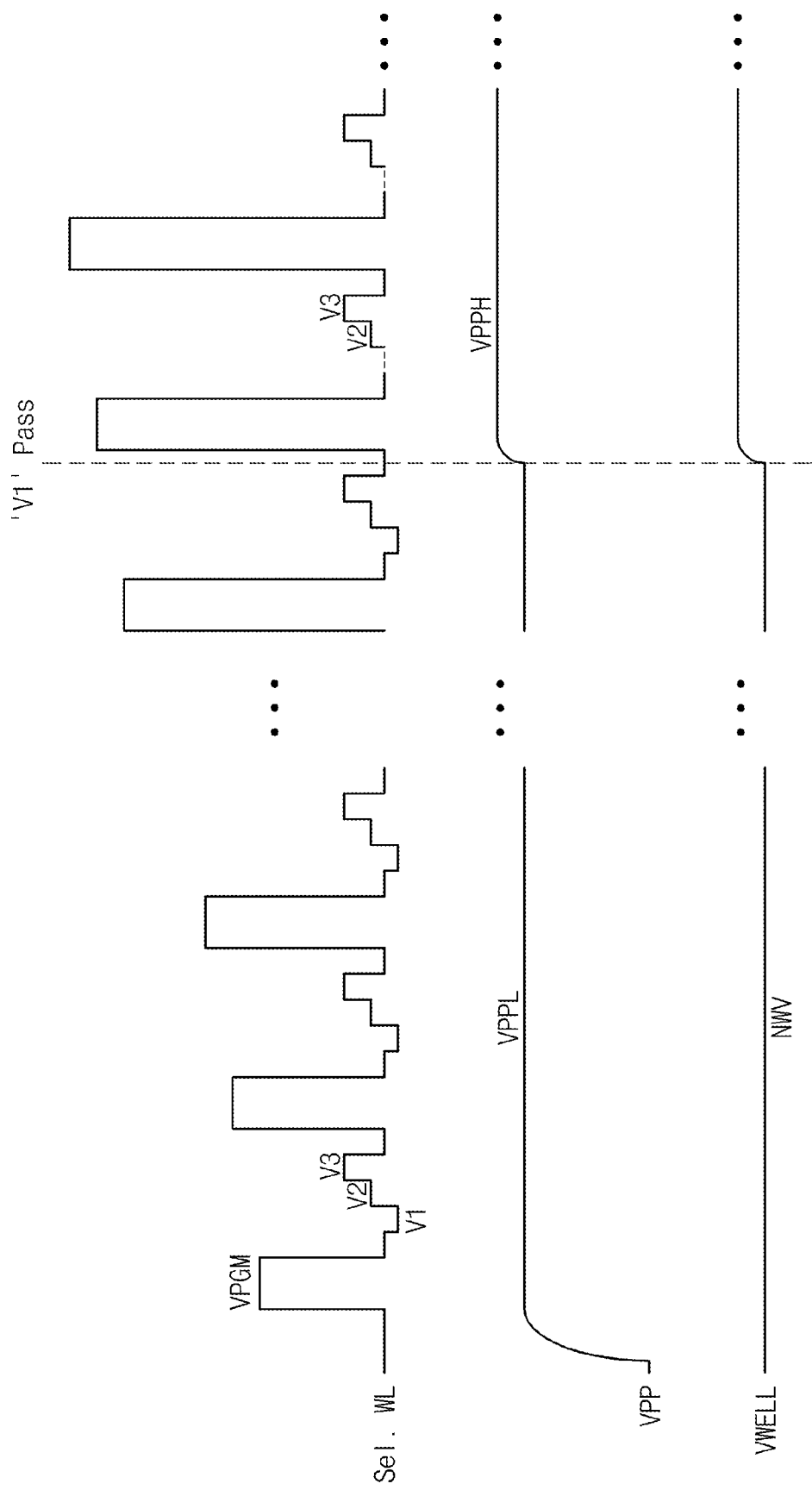
FIG. 27 is a diagram showing a method of controlling a well voltage and a high voltage during a program operation according to the second embodiment of the inventive concept.

FIG. 27 is a diagram showing a method of controlling a well voltage and a high voltage during a program operation according to the second embodiment of the inventive concept. Referring to FIG. 27, until a first verification read operation is passed, a high voltage VPP has a level VPPL1. At this time, a well voltage VWELL has a first negative level NWV1 at the first verification period and a second negative level NWL2 at a second verification period. After the first verification read operation is passed and until a second verification read operation is passed, the high voltage VPP has a second level VPP2. At this time, the well voltage VWELL has the second negative level NWV2 at the second verification period. After the second verification read operation is passed and until a third verification read operation is passed, the high voltage VPP has a third level VPP3.

Meanwhile, the passed verification period of operation is included in a next program loop or not included therein. For example, after the first verification read operation is passed and until a second verification read operation is passed, as represented by a dotted line in FIG. 27, the first verification period is included or not included in a program loop. Further, after the second verification read operation is passed and until a third verification read operation is passed, the first and second verification periods are included or not included in a program loop.

As described above, until the first verification read operation is passed, a well voltage VWELL is 0V at periods other than the first or second verification period. Until the second verification read operation is passed, the well voltage VWELL is 0V at periods other than the second verification period. However, the well voltage VWELL need not be 0V at periods other than the first or second verification period until the first verification read operation is passed, and the well voltage VWELL need not be 0V at periods other than the second verification period until the second verification read operation is passed. The well voltage VWELL has a level higher than the second negative level NWL2 at periods other than the first or second verification period until the first verification read operation is passed and at periods other than the second verification period until the second verification read operation is passed. Alternatively, the well voltage VWELL has a level higher than the second negative level at periods other than the first or second verification period.

Figure 28:
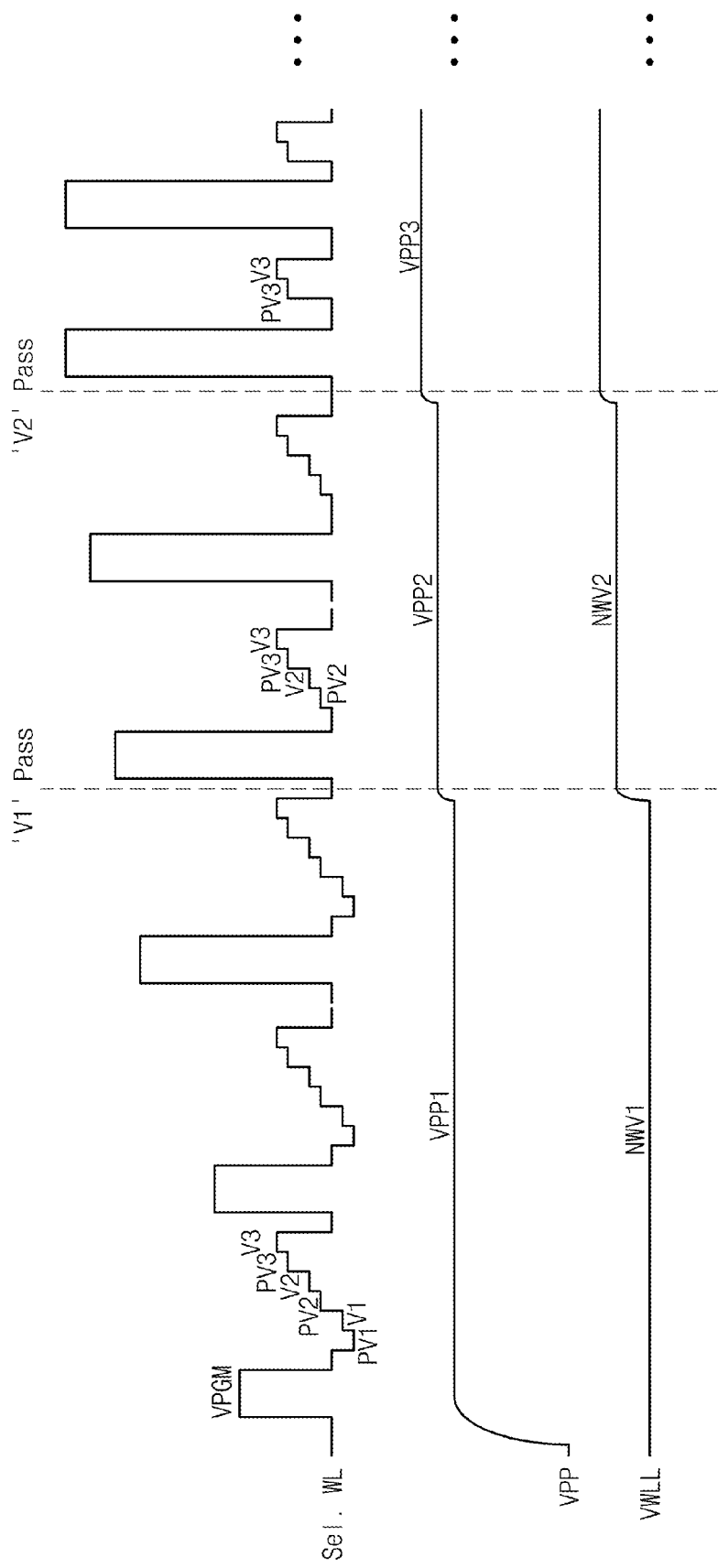
FIG. 28 is a diagram showing a method of controlling a well voltage and a high voltage during a program operation according to the third embodiment of the inventive concept.

FIG. 28 is a diagram showing a method of controlling a well voltage and a high voltage during a program operation according to the third embodiment of the inventive concept. Referring to FIG. 28, until a first verification read operation is passed, a high voltage VPP has a level VPPL1 and a well voltage VWELL has a first negative level NWV1. After the first verification read operation is passed and until a second verification read operation is passed, the high voltage VPP has a second level VPP2 and the well voltage VWELL has the second negative level NWV2. After the second verification read operation is passed and until a third verification read operation is passed, the high voltage VPP has a third level VPP3.

Meanwhile, the passed verification period of operation is included in a next program loop or not included therein. For example, after the first verification read operation is passed and until a second verification read operation is passed, as represented by a dotted line in FIG. 28, the first verification period is included or not included in a program loop. Further, after the second verification read operation is passed and until a third verification read operation is passed, the first and second verification periods represented by a dotted line are included or not included in a program loop.

As described above, after the second verification read operation is passed, a well voltage VWELL is 0V. However, the well voltage VWELL need not be 0V after the second verification read operation is passed. The well voltage VWELL has a level higher than the second negative level NWL2 after the second verification read operation is passed.

Second Embodiment of Row Decoder

A row decoder 109 illustrated in FIG. 23 uses high voltage NMOS transistors NH1 to NH4 at a pull-down circuit 282. However, the inventive concept is not limited thereto. That is, a row decoder of the inventive concept can use an NMOS low voltage transistor.

Figure 29:
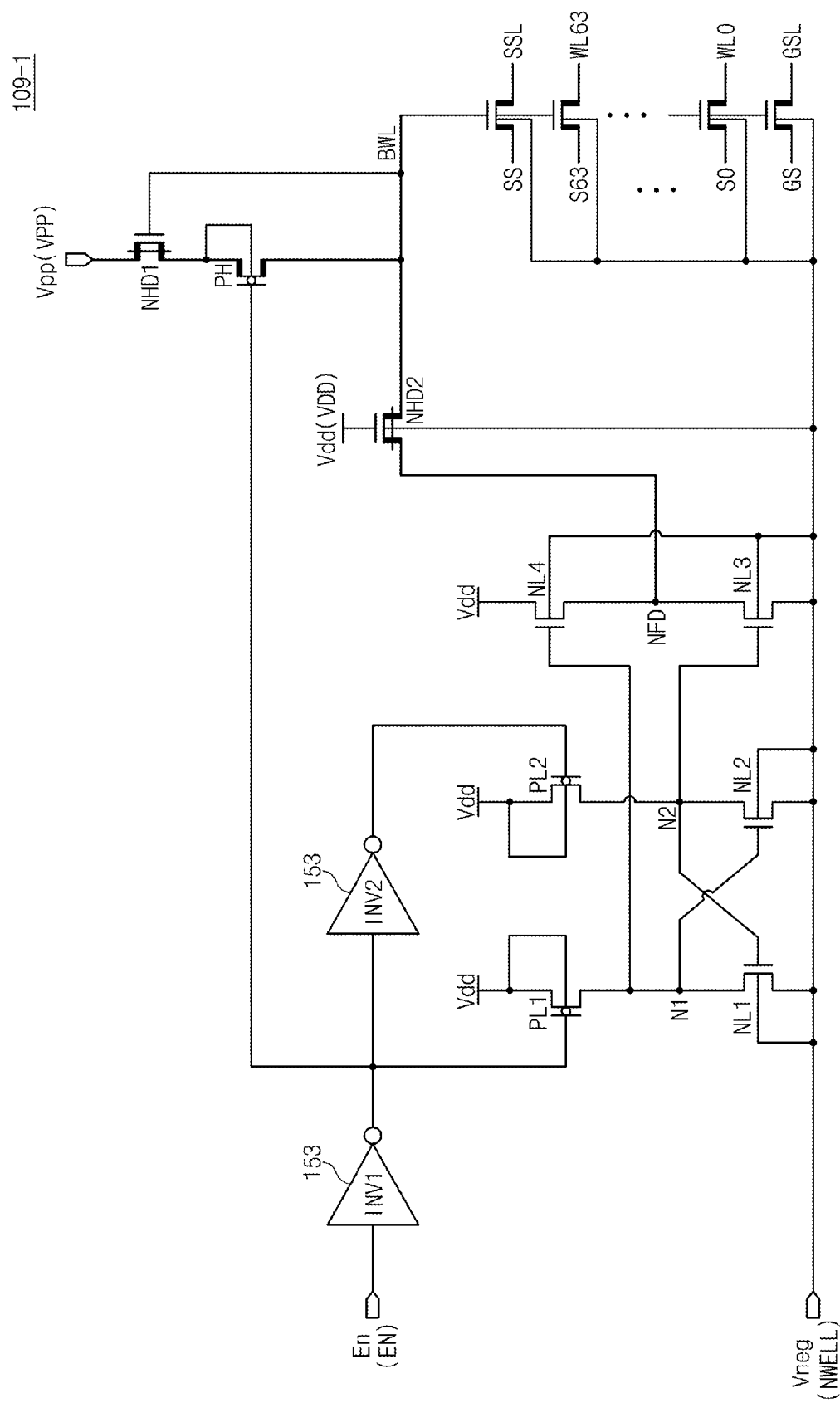
FIG. 29 is a diagram showing a row decoder according to the second embodiment of the inventive concept.

FIG. 29 is a diagram showing a row decoder according to the second embodiment of the inventive concept. Referring to FIG. 29, a row decoder 109_1 includes a pull-down circuit, which is configured using NMOS transistors NL1 to NL4 instead of high voltage NMOS transistors, as compared with a row decoder 105 in FIG. 23.

Third Embodiment of Row Decoder

A row decoder 109 illustrated in FIG. 23 uses low voltage PMOS transistors PL1 and PL2 at a pull-down circuit 282. However, the inventive concept is not limited thereto. That is, a row decoder of the inventive concept can use a PMOS high voltage transistor.

Figure 30:
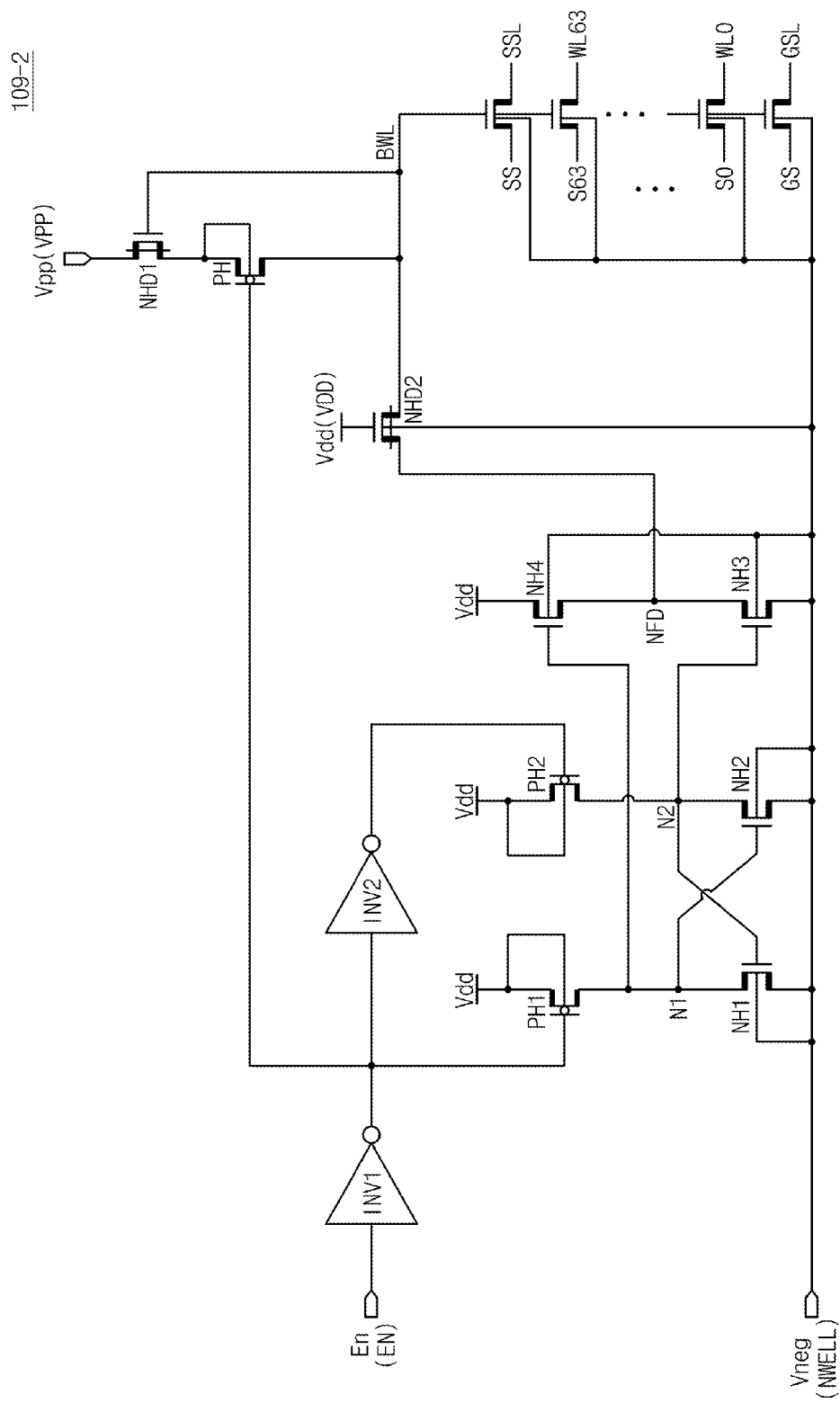
FIG. 30 is a diagram showing a row decoder according to the third embodiment of the inventive concept.

FIG. 30 is a diagram showing a row decoder according to the third embodiment of the inventive concept. Referring to FIG. 30, a row decoder 109_2 includes a pull-down circuit, which is configured using high voltage PMOS transistors PH1 and PH2 instead of low voltage PMOS transistors, as compared with a row decoder 105 in FIG. 23.

Program Methods

Figure 31:
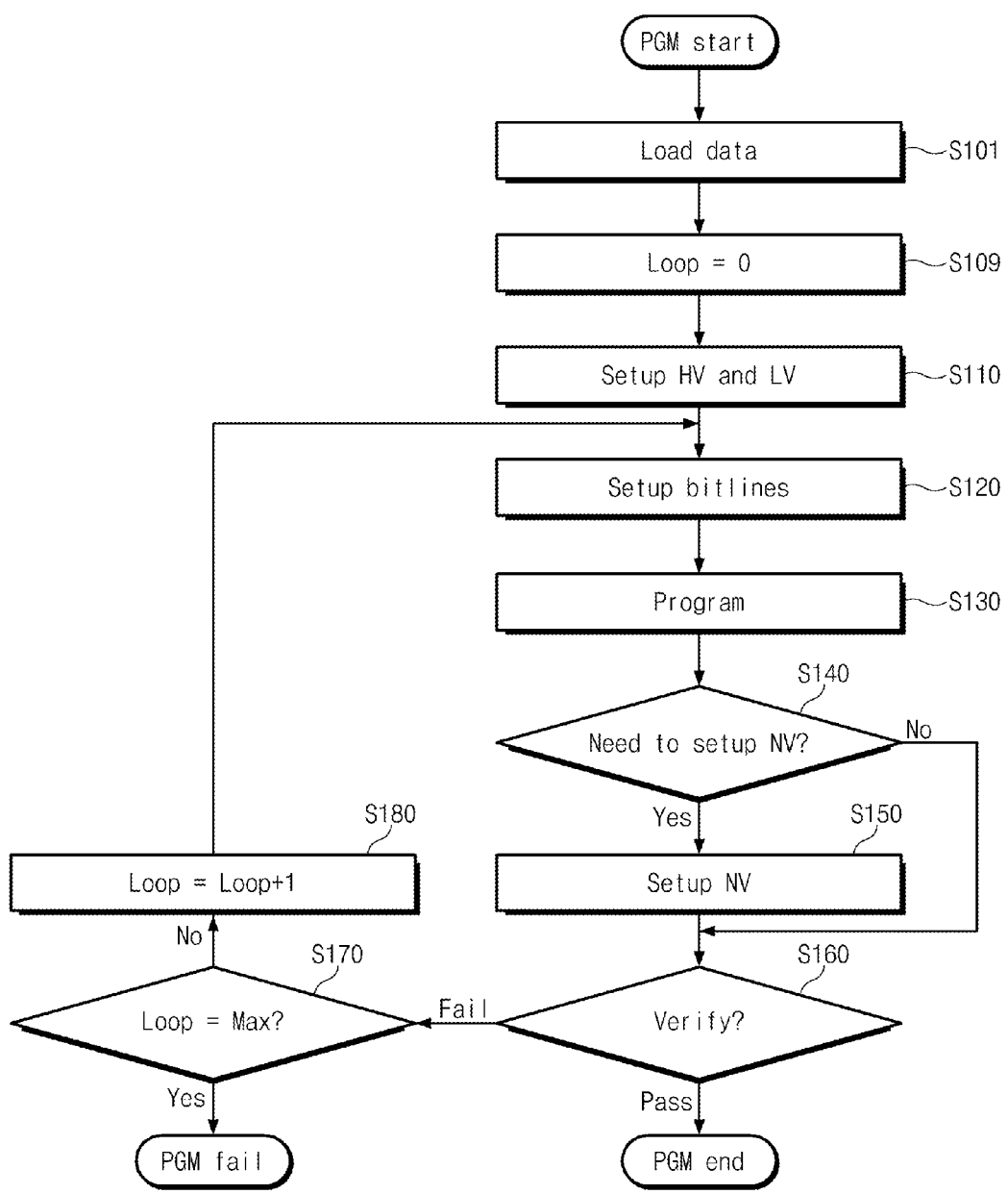
FIG. 31 is a flowchart showing a program method according to the first embodiment of the inventive concept.

FIG. 31 is a flowchart showing a program method according to the first embodiment of the inventive concept. A program method will be more fully described with reference to FIG. 31. For ease of description, it is assumed that a nonvolatile memory device is a nonvolatile memory device 100 as shown in FIG. 2.

In operation S101, data to be programmed during a program operation is loaded onto each page buffer (not shown) of a data input/output circuit (not shown). In operation S109, control logic 111 (refer to FIG. 2) performs a first program loop.

In operation S110, the control logic 111 controls a voltage generator 103 (refer to FIG. 2) so as to generate voltages for a program operation such as a high voltage VPP, a program voltage VPGM, a program pass voltage VPASS, a peri-voltage VLV, a read verification voltage VRV, and the like.

In operation S120, the control logic 111 sets up bit lines according to the loaded data of the page buffers. For example, 0V is applied to bit lines corresponding to program data (e.g., '0'), and a power supply voltage VDD is applied to bit lines corresponding to program-inhibit data (e.g., '1'). Further, a bit line forcing voltage (e.g., 1V) is applied to bit lines corresponding to memory cells the first step verification of which is completed at a 2-step verification operation.

Afterwards, in operation S130, the pass voltage VPASS is applied to unselected word lines, and the program voltage VPGM is applied to a selected word line. Herein, a voltage level of the program voltage VPGM increases by a predetermined value according to a program loop number.

In this embodiment, a pass voltage can be applied to the selected word line during a predetermined time before the program voltage VPGM is applied thereto. Afterwards, a program recovery operation is performed. At the program recovery operation, bias voltages applied to word lines WL0 to WLM and a string selection line SSL are discharged, and voltages applied to bit lines BL0 to BLn−1 are discharged.

Afterwards, in operation S140, the control logic 111 performs a verification operation, and judges whether a negative voltage is needed at the verification operation. If the negative voltage is not needed, the method proceeds to operation S160. If the negative voltage is needed, in operation S150, the control logic 111 activates a negative voltage generator 123 to generate a negative voltage NWL and a negative voltage for a well voltage NWELL.

In operation S160, a verification operation is performed according to the control of the control logic 111, and there a judgment is made as to whether the verification operation has passed or failed. Herein, the verification operation is performed in a 2-step verification manner.

If the verification operation has failed, in operation S170, the control logic 111 judges whether a program loop reaches a maximum program loop. If so, the program operation is treated as program fail.

On the other hand, if the program loop is not the maximum program loop, in operation S180, a program loop number increases by 1. Afterwards, the method proceeds to operation S130.

As described above, a program method of the inventive concept judges whether a negative voltage is needed at each program loop and activates a negative voltage generator 123 according to the judgment result. However, the program method of the inventive concept need not judge whether a negative voltage is needed at each program loop.

Figure 32:
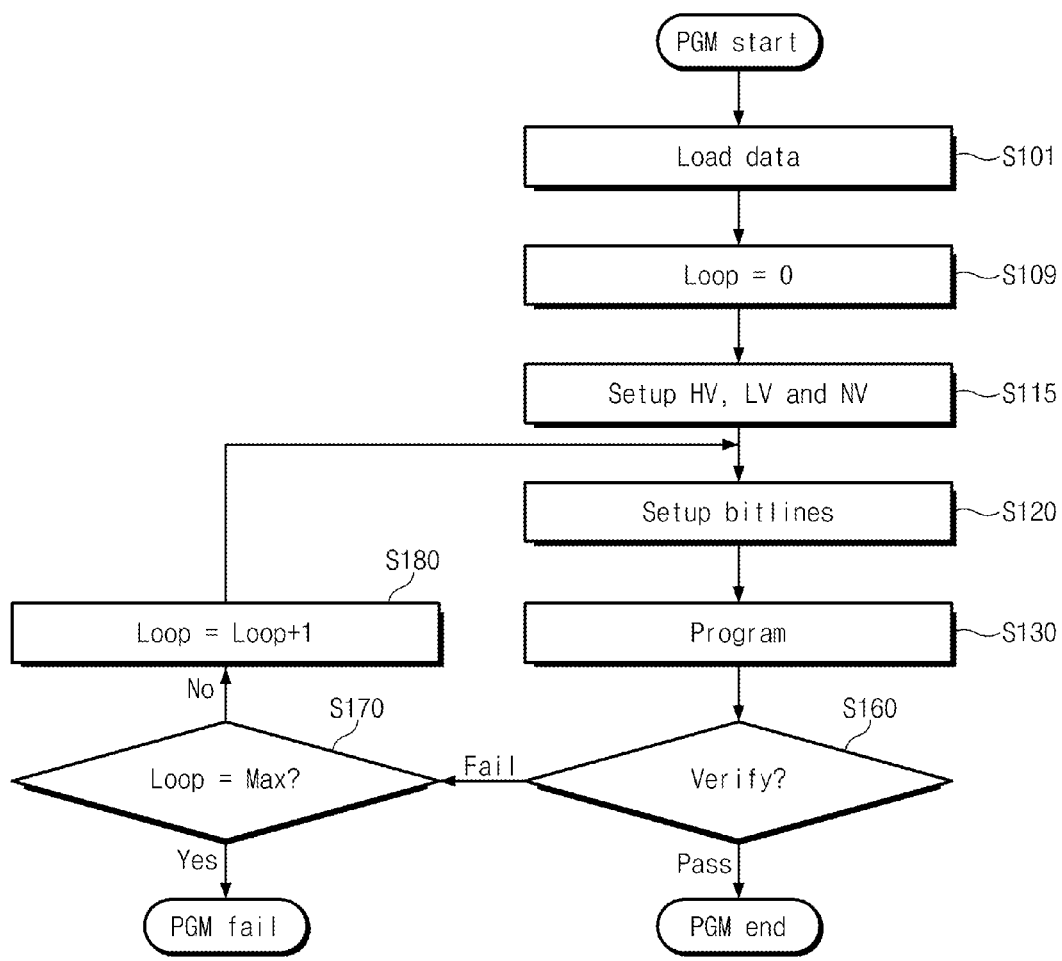
FIG. 32 is a flowchart showing a program method according to the second embodiment of the inventive concept.

FIG. 32 is a flowchart showing a program method according to the second embodiment of the inventive concept. Referring to FIG. 32, a program method is different from that in FIG. 31 in that operations S120 and S130 are removed and a high voltage, a low voltage, and a negative voltage are set at an operation S115.

Figure 33:
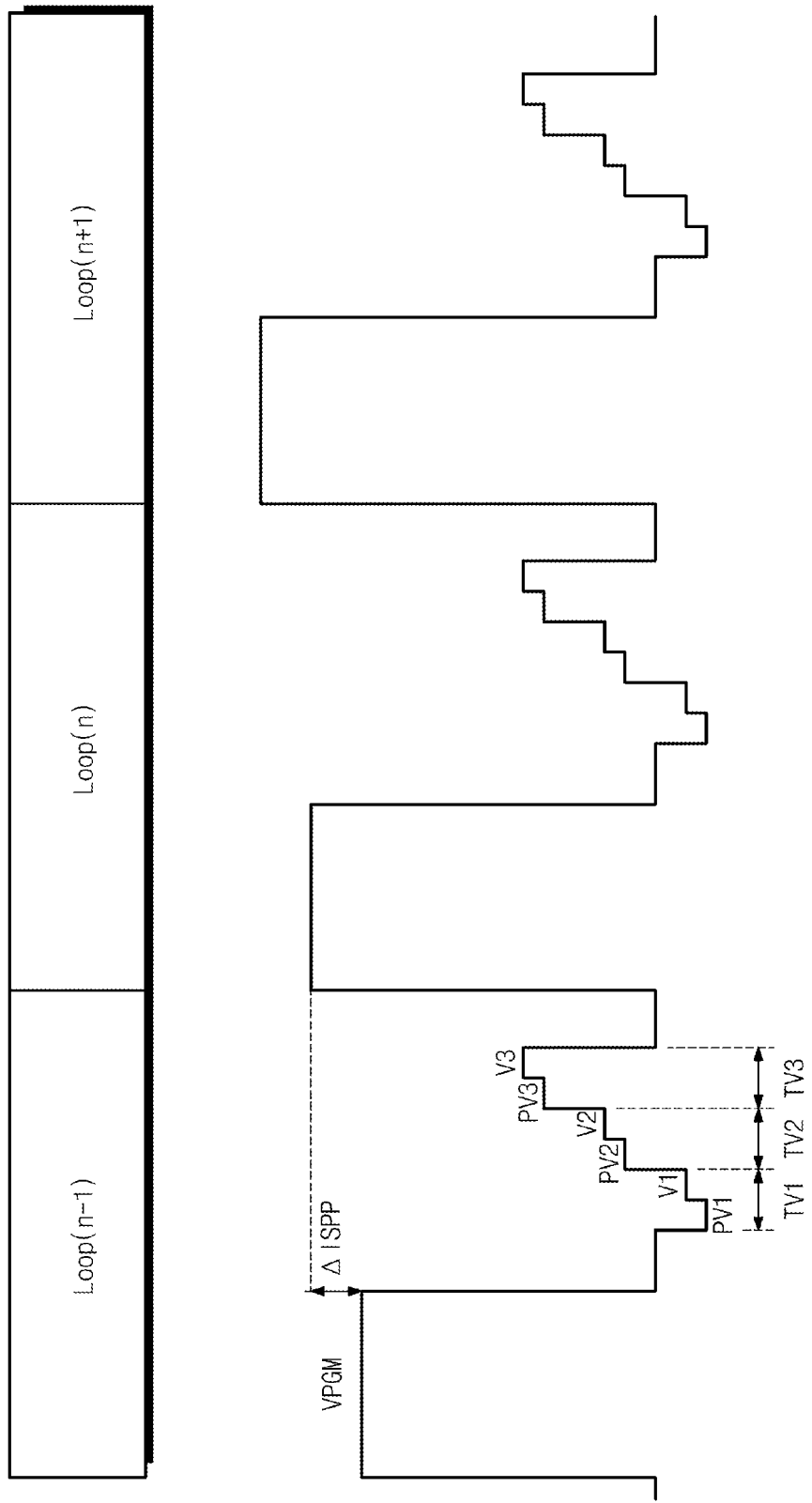
FIG. 33 is a diagram showing a voltage pulse of a program loop according to a 2-step verification operation of a program method in FIG. 32.

FIG. 33 is a diagram showing a voltage pulse of a program loop according to a 2-step verification operation of a program method in FIG. 32. Referring to FIG. 33, a program voltage VPGM increases by ΔISPP according to an increase in a program loop, and each program loop has three verification periods TV1, TV2, and TV3. Herein, at the first verification period TV1, a first pre-verification voltage TV1 and a first verification voltage V1 are negative voltages. At the second and third verification periods TV2 and TV3, pre-verification voltages PV2 and PV3 and verification voltages V2 and V3 are positive voltages.

In FIG. 33, there is exemplarily illustrated the case that each program loop includes one program pulse. However, the inventive concept is not limited thereto. Each program loop of the inventive concept can include at least one program pulse.

Figure 34:
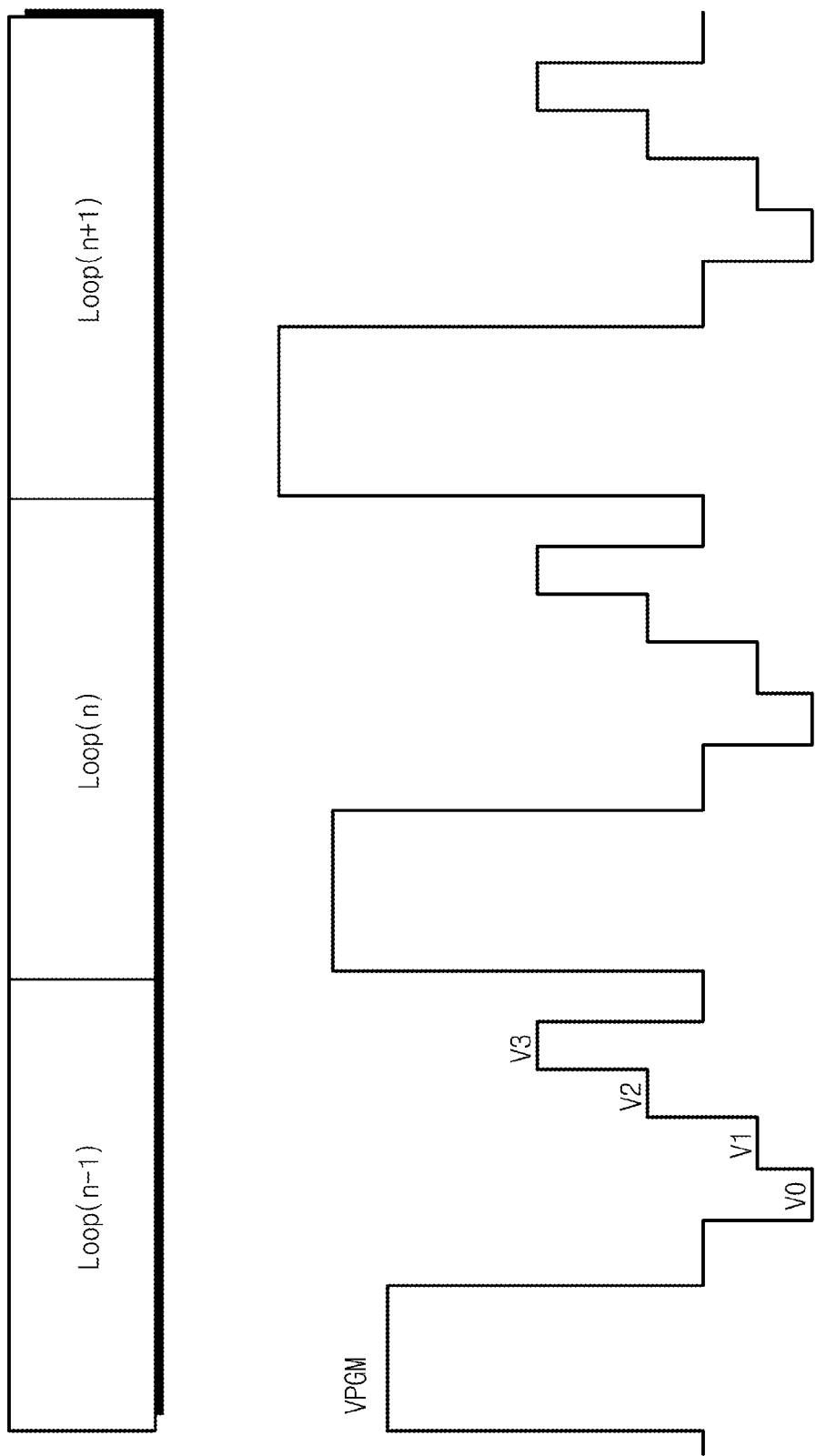
FIG. 34 is a diagram showing a voltage pulse according to a program loop in which a verification operation on an erase state is performed.

The inventive concept can perform a verification operation on an erase state E (refer to FIG. 1). FIG. 34 is a diagram showing a voltage pulse according to a program loop in which a verification operation on an erase state is performed. Referring to FIG. 34, at each program loop, a verification operation is performed on the basis of four verification voltages V0, V1, V2, and V3. Herein, the verification voltages V0 and V1 are negative voltages, and the verification voltages V2 and V3 are positive voltages.

Read Method

Figure 35:
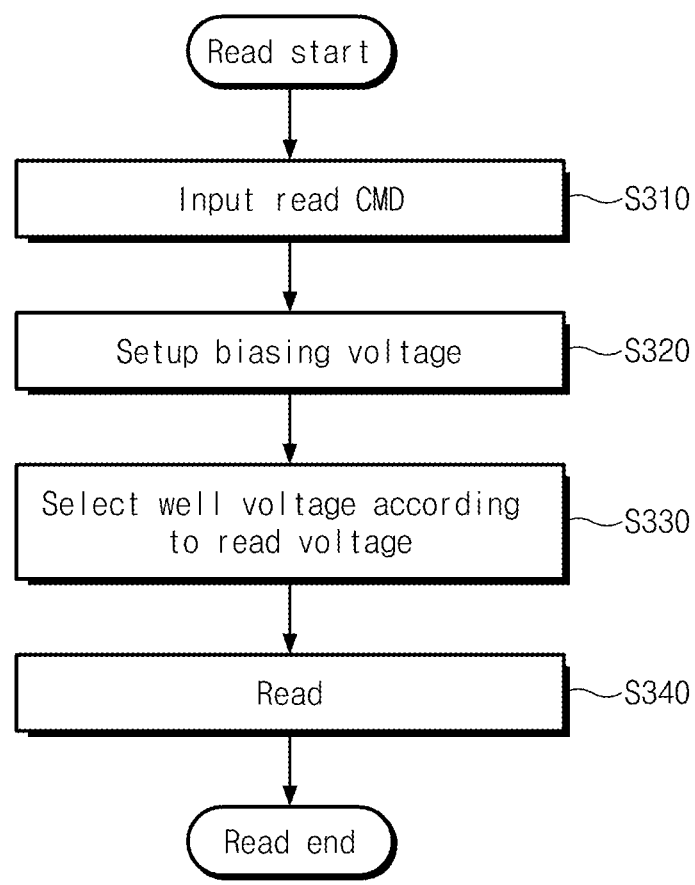
FIG. 35 is a flowchart showing a read method according to an exemplary embodiment of the inventive concept.

FIG. 35 is a flowchart showing a read method according to an exemplary embodiment of the inventive concept. A read method will be more fully described with reference to FIG. 35. For ease of description, a read voltage may include a first to a third read voltage VR1 to VR3. It is assumed that the first read voltage VR1 is a negative voltage and the second and third read voltages VR2 and VR3 are positive voltages.

In operation S310, a read command is received. Afterwards, bias voltages needed for a read operation are generated. For example, the read voltages VR1, VR2, and VR3, a read pass voltage, and a high voltage VPP are generated. A negative voltage generator 123 generates the first read voltage VR1 and a negative voltage for a well voltage NWELL, a low voltage generator 122 generates the second read voltages VR2 and VR3, and a high voltage generator 121 generates the read pass voltage VPASS and the high voltage VPASS. In operation S320, the negative voltage for a well voltage NWELL is applied to all wells which include circuits supplied with a negative voltage when a read operation is performed using the first read voltage VR1, and a ground voltage is applied to a well when a read operation is performed using the second and third read voltages VR2 and VR3.

A read operation on the first to third read voltages is performed as follows. In operations S330, a read voltage is applied to a selected word line, a read pass voltage is applied to unselected word lines, and bit lines are pre-charged. Afterwards, in operation S340, voltage variations of bit lines connected with memory cells are sensed as data, and the sensed data is latched and output.

Afterwards, a memory controller (not shown) connected a nonvolatile memory device 100 judges an error on output data. If no error is detected, a read operation is ended. If an error is detected, it is corrected. If an error is uncorrectable, the read voltages VR1, VR2, and VR3 are changed, and a read operation is again performed using the changed read voltages.

Other Embodiments of Nonvolatile Memory

Figure 36:
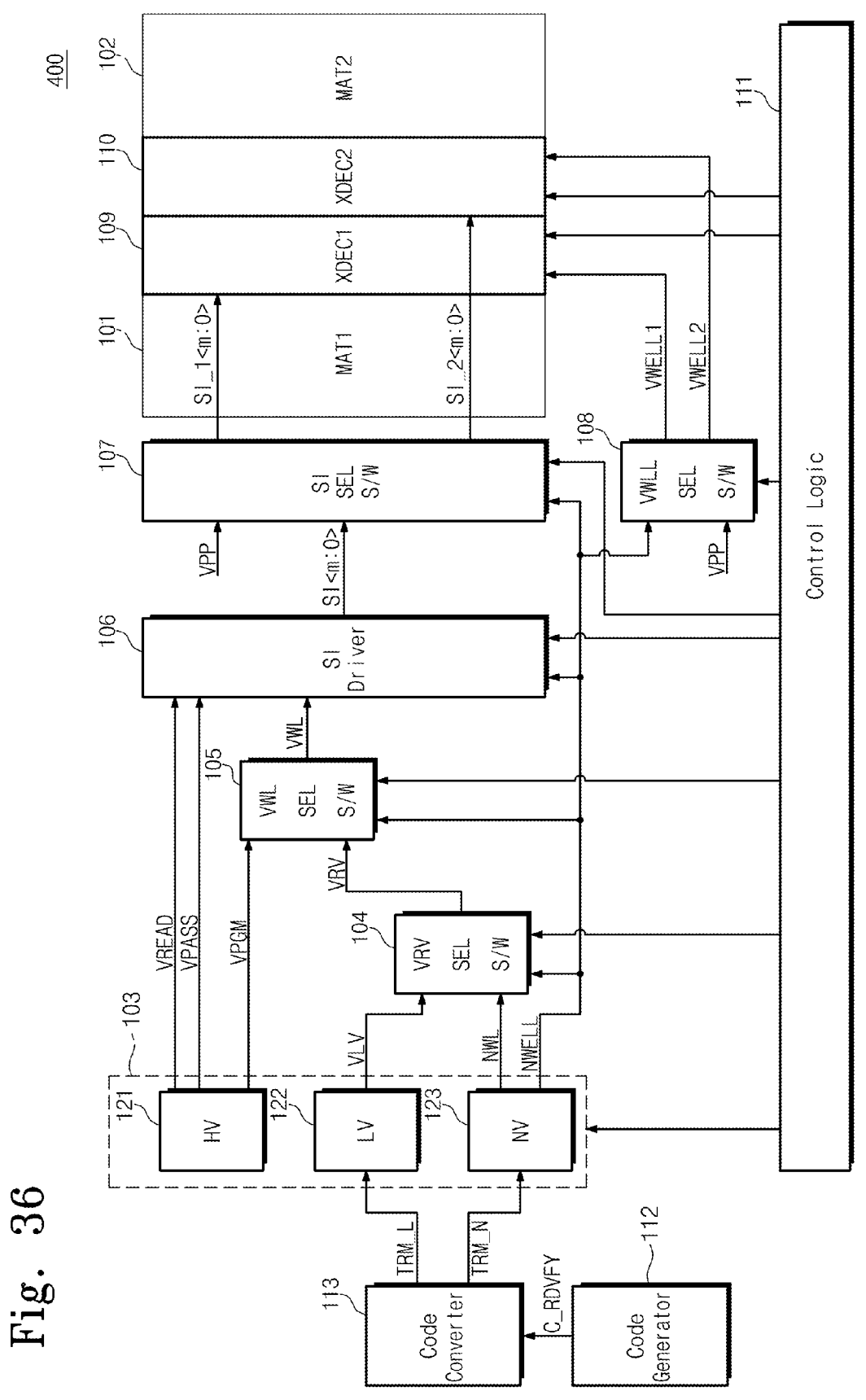

FIG. 36 is a diagram illustrating a nonvolatile memory device according to an exemplary embodiment of the inventive concept. Referring to FIG. 36, a nonvolatile memory device 400 further includes a code generator 112 and a code converter 113 as compared with that 100 illustrated in FIG. 2.

The code generator 112 generates a read code C_RDVFY corresponding to a verification voltage during a program operation or a read voltage at a read operation. That is, a verification voltage or a read voltage corresponding to a read code C_RDVFY is generated. For ease of description, in FIG. 36, a read code C_RDVFY corresponding to a verification voltage or a read voltage is illustrated. However, the code generator 112 can generate a trim code (refer to FIG. 4, TRM0_H to TRM2_H) for generating voltages (e.g., a high voltage, a program voltage, a program pass voltage, a read pass voltage, etc.) generated from a high voltage generator 121.

The code converter 113 converts the read code C_RDVFY into one of a low-voltage trim code TRM_L (refer to FIG. 5, TRM0_L to TRM2_L) and a negative trim code TRM_N (refer to FIG. 10, TRM0 to TRM2 and nTRM0 to nTRM2).

In an embodiment, the code converter 113 may be implemented to perform a code conversion operation according to the read code C_RDVFY. For example, when a value of the read code C_RDVFY is over a predetermined value, the read code C_RDVFY is converted into the low-voltage trim code TRM_L. When a value of the read code C_RDVFY is below a predetermined value, the read code C_RDVFY is converted into the negative trim code TRM_N.

In an embodiment, when a value of the read code C_RDVFY is over a predetermined value, the code converter 113 activates a low voltage generator 122. When a value of the read code C_RDVFY is below a predetermined value, the code converter 113 activates a negative voltage generator 123.

In another embodiment, the code converter 113 may be implemented to output the read code C_RDVFY to one of the low voltage generator 122 and the negative voltage generator 123 according to the read code C_RDVFY. At this time, an output code C_RDVFY may become one of the low-voltage trim code TRM_L and the negative trim code TRM_N.

The code generator 112 and the code converter 113 may constitute a trim code generator (refer to FIGS. 6 and 7).

The low voltage generator 122 generates a low voltage VLV corresponding to the low-voltage trim code TRM_L. The low voltage generator 122 is substantially identical to that described in FIG. 5, and description thereof is thus omitted.

The negative voltage generator 122 generates a negative voltage NWL or a well voltage NWELL corresponding to the negative trim code TRM_N. The negative voltage generator 122 is substantially identical to that described in relation to FIGS. 9 to 13, and description thereof is thus omitted.

A verification voltage or a read voltage can be changed/adjusted/controlled to a positive voltage or a negative voltage according to external factors (temperature, program state, P/E cycling, etc.). The nonvolatile memory device 400 according to the inventive concept may be implemented to be suitable for this modification. For example, the code generator 112 generates a changed read code C_RDVFY, and the code converter 113 automatically converts the code C_RDVFY into the low-voltage trim code TRM_L or the negative trim code TRM_N.

Figure 37:
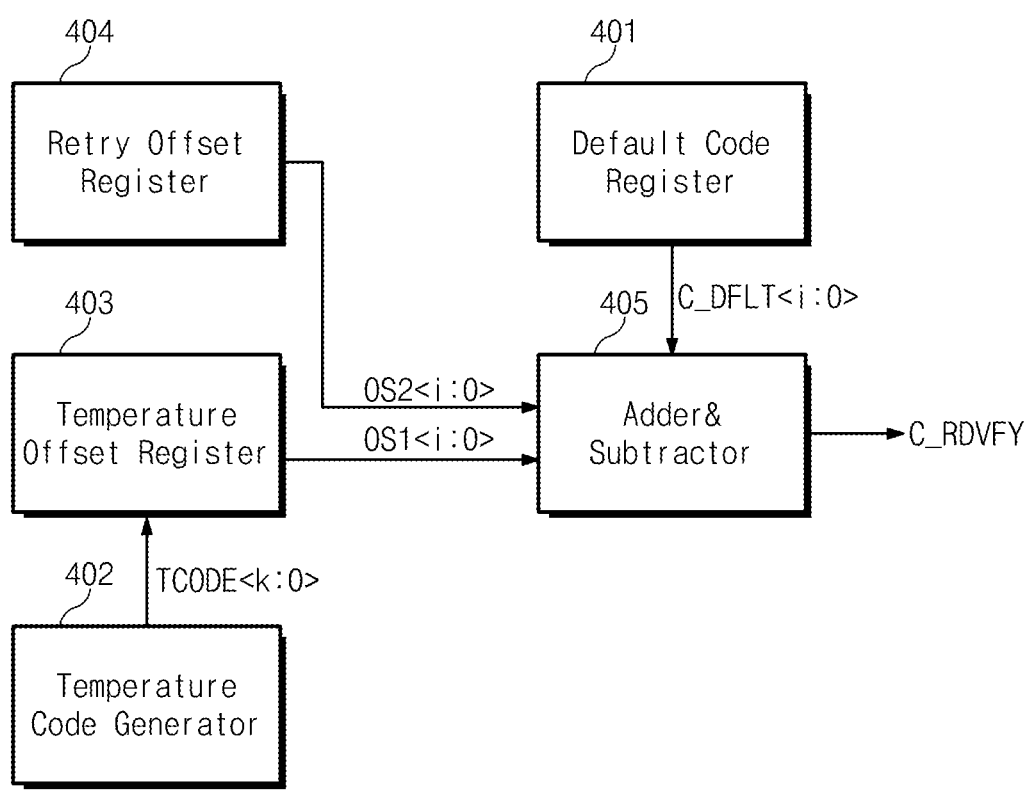
FIG. 37 is a diagram illustrating a code converter illustrated in FIG. 36.

FIG. 37 is a diagram illustrating an example of a code converter illustrated in FIG. 36. Referring to FIG. 37, a code converter 112 includes a default code register 401, a temperature code generator 402, a temperature offset register 403, a retry offset register 404, and an adder & subtractor 405.

The default code register 401 outputs a default code C_DFLT<i:0> (i being a positive integer) corresponding to a verification voltage during a program operation or a read voltage at a read operation. For example, if i=8, the default code register 401 outputs a default 8-bit code C_DFLT<7:0>.

In an embodiment, the default code C_DFLT<i:0> may be set by control logic 111 (refer to FIG. 1).

The temperature code generator 402 generates a k-bit temperature code TCODE<k:0> (k being a positive integer) corresponding to a temperature of a nonvolatile memory device 100. Herein, a temperature of the nonvolatile memory device 100 may be a temperature of a page including a memory cell to be driven, a temperature of a memory block including a memory cell to be driven, or a temperature of a mat including a memory cell to be driven. In an embodiment, the temperature code TCODE<k:0> may have a value corresponding to temperature intervals (e.g., 10° C.) between −40° C. to 90° C.

The temperature offset register 403 outputs a first offset code OS1<j:0> (j being a positive integer) corresponding to the temperature code TCODE<k:0>. In an embodiment, j may be 4, and the first option code OS1<j:0> may be a j-bit code.

In an embodiment, the first offset code OS1<j:0> may be constant regardless of a read voltage. For example, the first offset code OS1<j:0> of a first read voltage R1 for discriminating an erase state E (refer to FIG. 1) and a first program state P1, the first offset code OS1<j:0> of a second read voltage R2 for discriminating the first program state P1 and a second program state P2, and the first offset code OS1<j:0> of a third read voltage R3 for discriminating the second program state P2 and a third program state P3 may be identical to one another.

The retry offset register 404 outputs a second offset code OS2<j:0>, being j-bit, when a verification operation or a read operation is retried. In an embodiment, the second offset code OS2<j:0> may differentiate according to a read voltage. In an embodiment, the second offset code OS2<j:0> of a first read voltage R1, the second offset code OS2<j:0> of a second read voltage R2, and the second offset code OS2<j:0> of a third read voltage R3 may be different from one another.

In another embodiment, the second offset code OS2<j:0> can be constant regardless of a read voltage.

In an embodiment, the second offset code OS2<j:0> may be set by the control logic 111 or by an external memory controller (not shown) controlling the nonvolatile memory device 400.

The nonvolatile memory device 400 according to an exemplary embodiment of the inventive concept may provide one of a negative word line voltage and a positive word line voltage to a selected word line according to a temperature.

In FIG. 37, the first offset code OS1<j:0> and the second offset code OS2<j:0> all are j-bit data. However, the inventive concept is not limited thereto. The first offset code may be data having at least one bit, and the second offset code may be data having at least one bit.

The adder & subtractor 405 outputs the read code C_RDVFY by adding or subtracting the default code C_DFLT<i:0> and the first and second offset codes OS1<j:0> and OS2<j:0>.

The code generator 112 changes or adjusts the read code C_RDVFY according to a temperature or a retry.

Figure 38:
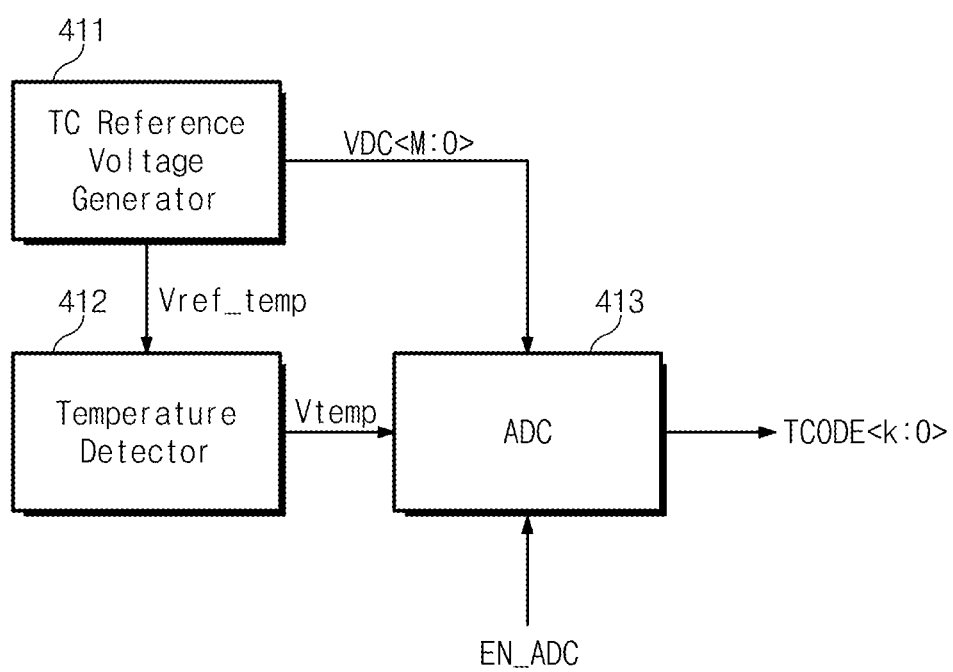
FIG. 38 is a diagram illustrating a temperature code generator illustrated in FIG. 37.

FIG. 38 is a diagram illustrating a temperature code generator illustrated in FIG. 37. Referring to FIG. 38, a temperature code generator 402 includes a temperature reference voltage generator 411, a temperature detector 412, and an analog-digital converter 413.

The temperature reference voltage generator 411 generates a reference voltage Vref_temp needed to detect a temperature and DC voltages VDC<M:0> (M being a positive integer) for generating a temperature code.

The temperature detector 412 detects a temperature voltage Vtemp by comparing the reference voltage Vref_temp and a voltage of a temperature region (hereinafter, referred to as a temperature region) associated with a memory cell to be driven. Herein, the temperature voltage Vtemp is inversely proportional to a temperature. That is, as a temperature increases, the temperature voltage Vtemp decreases. An inverse proportion ratio (e.g., a slope) of the temperature voltage Vtemp and a temperature may be determined by voltage division using resistors.

The analog-digital converter 413 outputs a temperature code TCODE<k:0>, being k-bit, by comparing the temperature voltage Vtemp and the DC voltages VDC<M:0>.

The temperature code generator 402 according to an exemplary embodiment of the inventive concept generates the temperature code TCODE<k:0> corresponding to a temperature of a temperature region.

Figure 39:
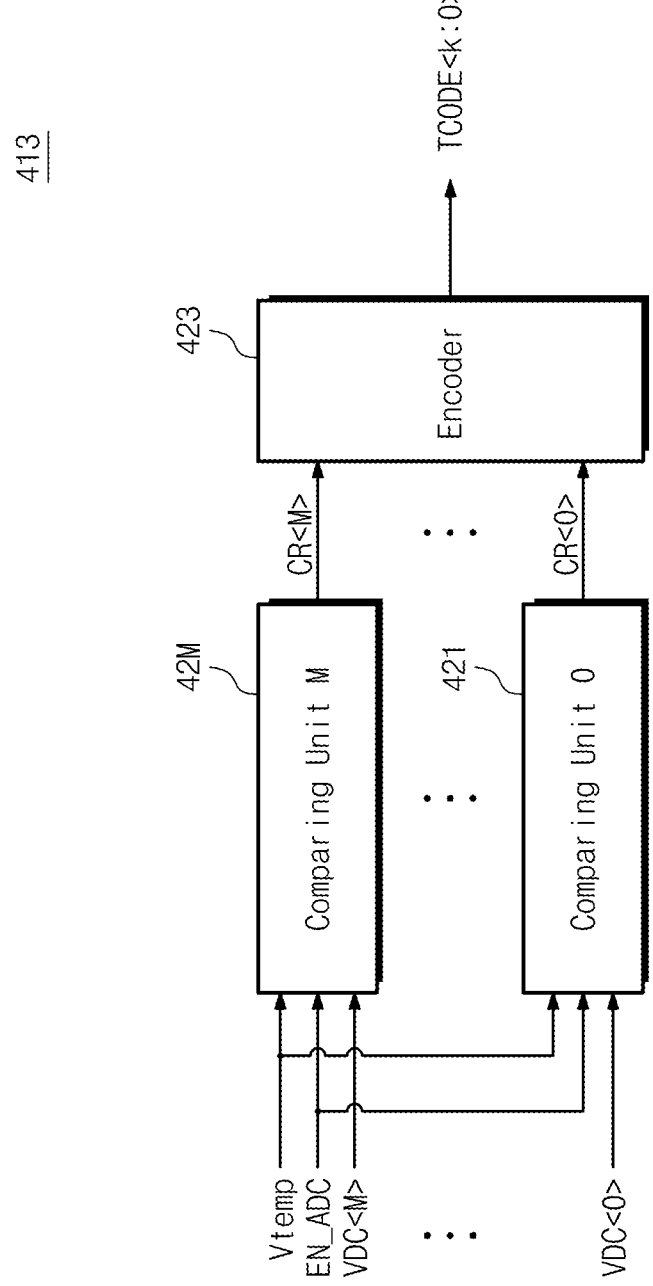
FIG. 39 is a diagram illustrating an analog-digital converter illustrated in FIG. 38.

FIG. 39 is a diagram illustrating an example of a analog-digital converter illustrated in FIG. 38. Referring to FIG. 39, an analog-digital converter includes a plurality of comparing units 421 to 42M and an encoder 423.

The plurality of comparing units 421 to 42M compare a corresponding temperature voltage Vtemp and DC voltages VDC<M:0> in response to an enable signal EN_ADC to output comparison result values CR<M:0>.

The encoder 423 encodes the comparison result values CR<M:0> to output a temperature code TCODE<k:0> being k-bit.

The analog-digital converter 413 according to an exemplary embodiment of the inventive concept converts the temperature voltage Vtemp into the temperature code TCODE<k:0> being k-bit.

Figure 40:
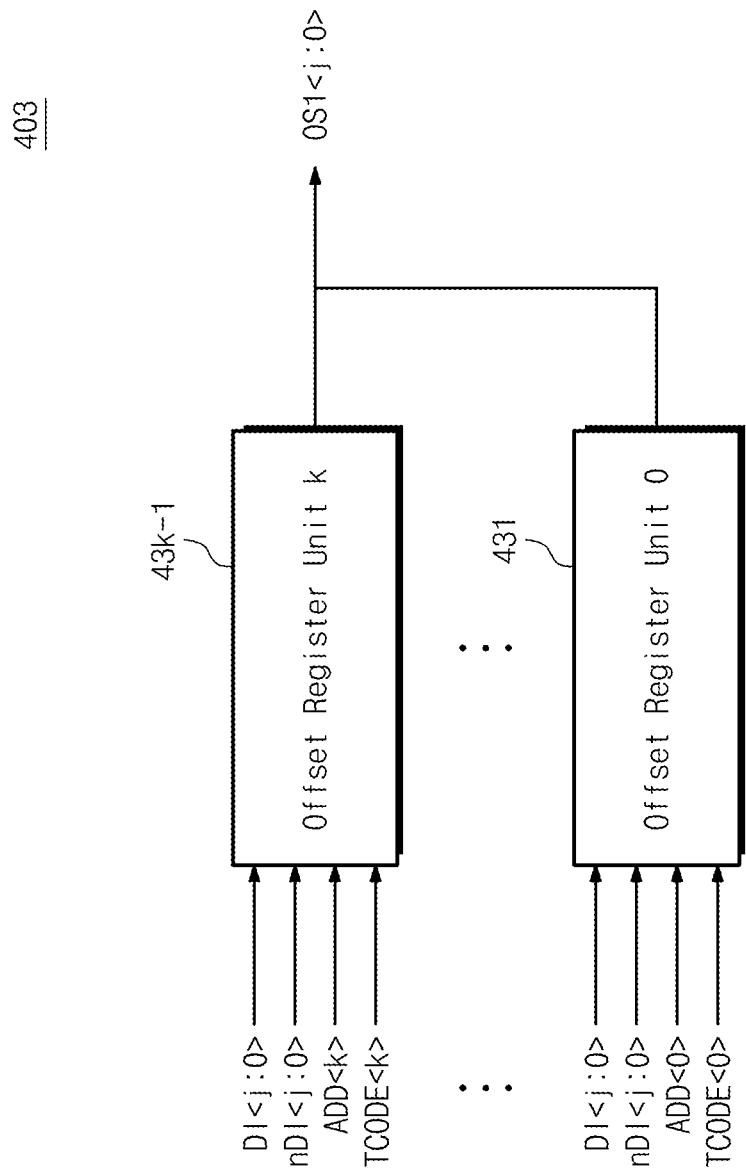
FIG. 40 is a diagram illustrating a temperature offset register illustrated in FIG. 37.

FIG. 40 is a diagram illustrating an example of a temperature offset register illustrated in FIG. 37. Referring to FIG. 40, a temperature offset register 403 includes a plurality of offset register units 431 to 43k.

The plurality of offset register units 431 to 43k receives data DI<j:0> having an offset trim value, its inverted data nDI<j:0>, corresponding register addresses ADD<k:0>, and corresponding temperature codes TCODE<k:0> to output a first offset code OS1<j:0>. Herein, the register addresses ADD<k:0> determine activation of corresponding offset register units 431 to 43k, respectively.

The data DI<j:0>, the inverted data nDI<j:0>, and the register addresses ADD<k:0> may be provided from control logic 111 (refer to FIG. 2) or a memory controller (not shown) controlling a nonvolatile memory device 400.

As a result, the temperature offset register 403 outputs a first offset code OS1<j:0> corresponding to a temperature code TCODE<k:0> by using the plurality of offset register units 431 to 43k according to the control of the control logic 111 or the memory controller.

Figure 4:
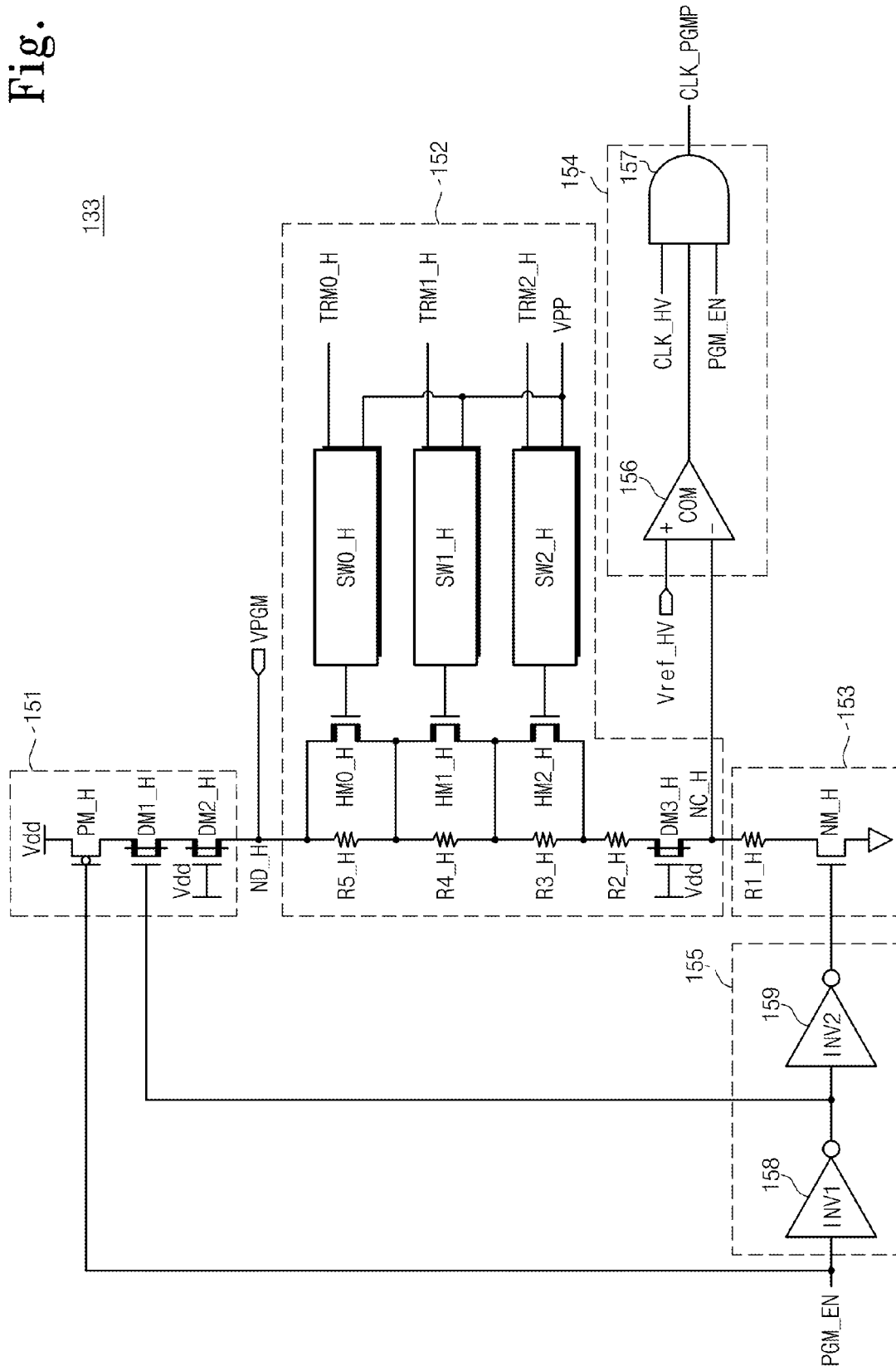
FIG. 4 is a diagram showing an example of a voltage detector for a program voltage illustrated in FIG. 3.

A retry offset register 404 and a default code register 401 may be implemented to be similar to the temperature offset register 403 in FIG. 4.

Figure 41:
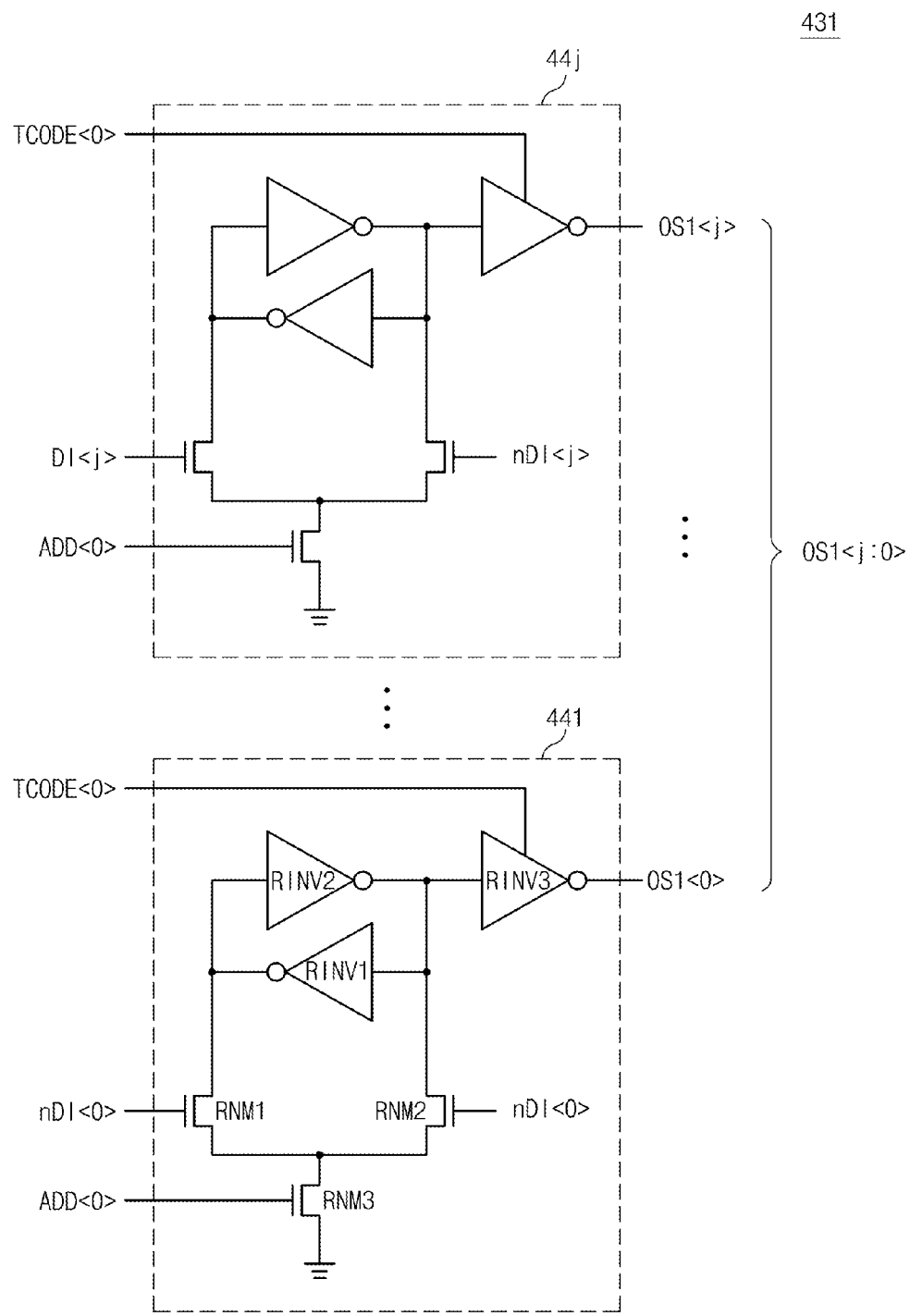
FIG. 41 is a diagram illustrating an offset register unit illustrated in FIG. 40.

FIG. 41 is a diagram illustrating an example of an offset register unit illustrated in FIG. 40. For ease of description, one offset register unit 431 will be described. Referring to FIG. 41, the offset register unit 431 includes a plurality of latch circuits 441 to 44j.

The plurality of latch circuits 441 to 44j operates responsive to a register address ADD<0>, and latches data based upon corresponding data DI<j:0> and inverted data nDI<j:0>. The plurality of latch circuits 441 to 44j outputs a first offset code OS1<j:0> in response to a temperature code TCODE<0>.

For ease of description, a first latch circuit 441 will be described below. The first latch circuit 441 includes NMOS transistors RNM1 to RNM3 and a plurality of inverters RINV1 to RINV3. The NMOS transistor RNM3 is turned on in response to the register address ADD<0>, and the inverter RINV3 is activated according to the temperature code TCODE<0>. For example, when ADD<0> is '1', TCODE<0> is '1', DI<0> is '0', and nDI<0> is '1', the NMOS transistors RNM1 and RNM3 are turned on and the inverter RINV3 is activated. Accordingly, '0' corresponding to the DI<0> is output as an offset code OS1<0>.

Remaining latch circuits may be implemented in the same manner as the first latch circuit 441.

In case of a general nonvolatile memory device, a threshold voltage distribution may be changed according to a temperature. Read voltages must be changed according to a temperature.

Figure 42:
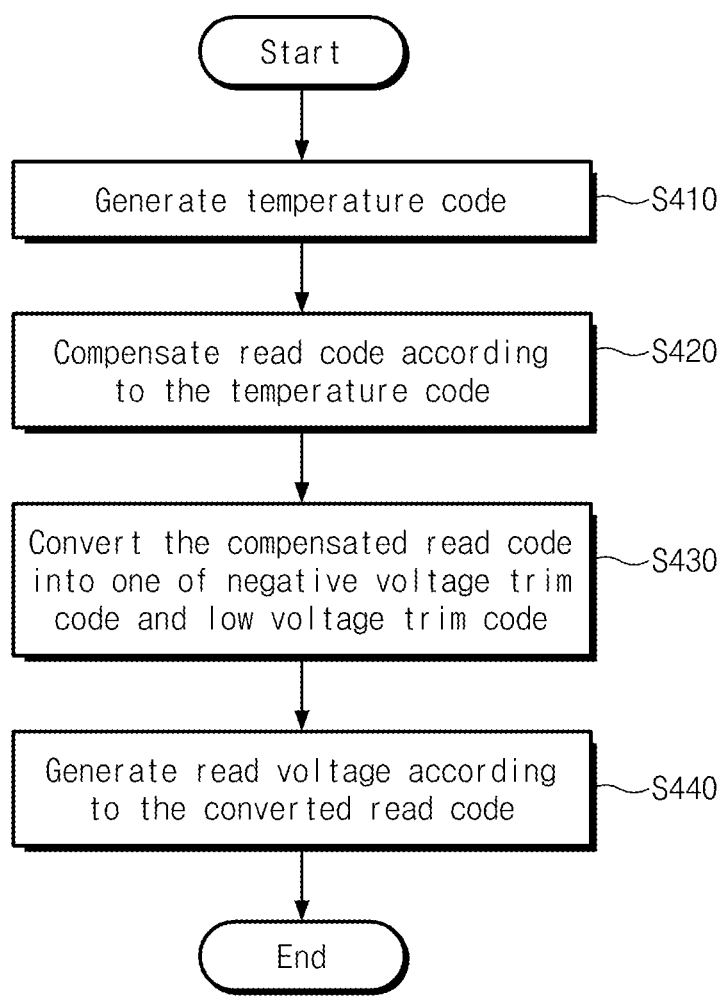
FIG. 42 is a flowchart illustrating a read voltage generating method using temperature compensation according to an exemplary embodiment of the inventive concept.

FIG. 42 is a flowchart illustrating a read voltage generating method using temperature compensation according to an exemplary embodiment of the inventive concept. Below, a read voltage generating method will be described with reference to FIGS. 36 to 42.

In step S420, a temperature code TCODE<k:0> is generated by sensing a voltage of a temperature region of a nonvolatile memory device 400. In step S320, a read code C_RDVFY is corrected according to the temperature code TCODE<k:0>. In step S430, the corrected read code C_RDVFY is changed into a negative voltage trim code TRM_N or a low voltage trim code TRM_L. In step S440, a read voltage is generated according to the changed read code.

The read voltage generating method according to an exemplary embodiment of the inventive concept can generate a negative voltage or a low voltage according to a temperature.

Figure 43:
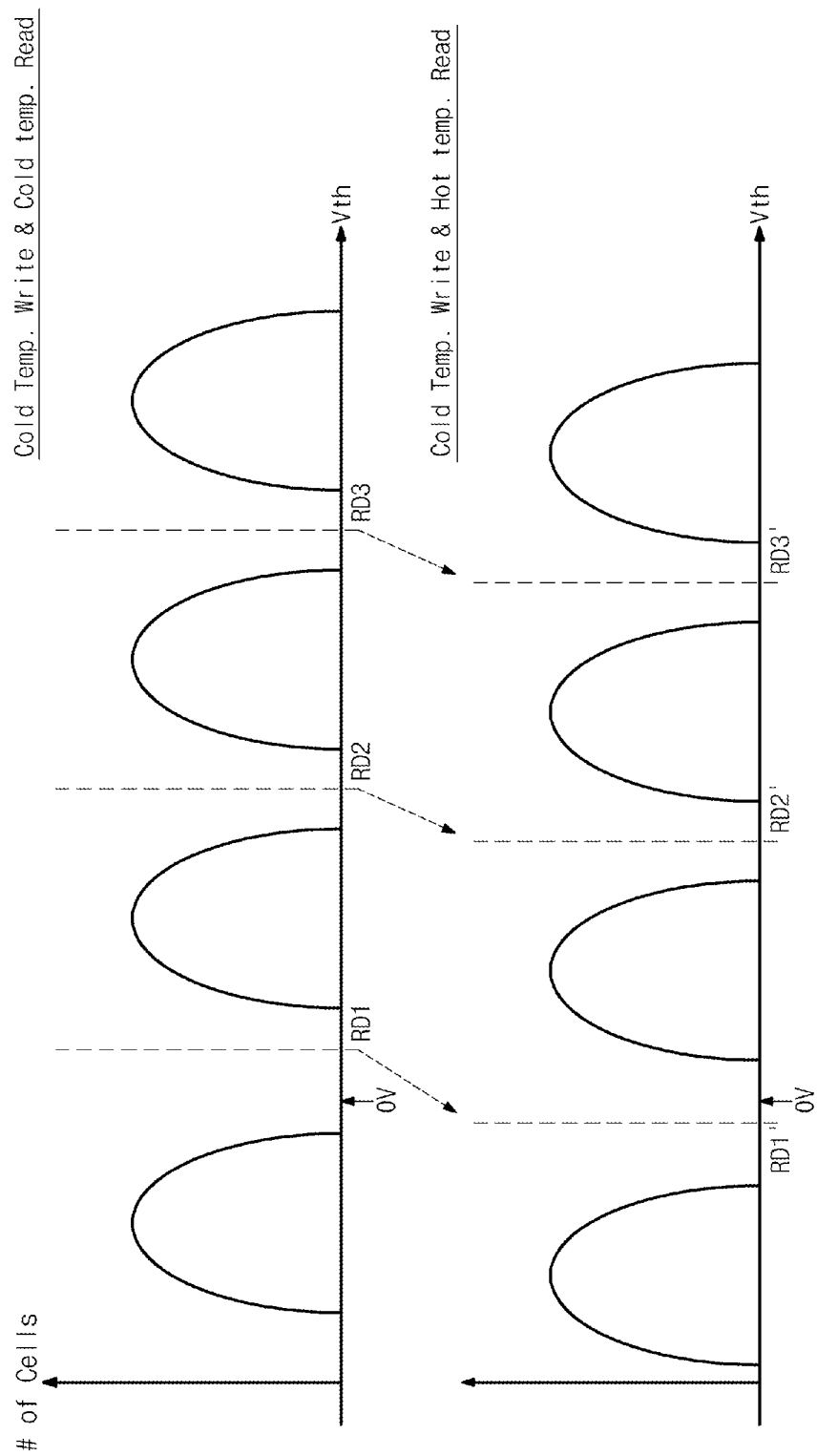
FIG. 43 is a threshold voltage distribution illustrating that a read voltage is changed to a negative voltage from a positive voltage according to a temperature.

FIG. 43 is a threshold voltage distribution illustrating that a read voltage is changed to a negative voltage from a positive voltage according to a temperature. Referring to FIG. 43, a threshold voltage distribution of a hot temperature is overall down shifted as compared with that of a cold temperature. In this case, it is necessary to set read voltages R1', R2', and R3' of a hot temperature to be higher than read voltages R1, R2, and R3 of a cold temperature. At this time, a first read voltage R1 is a positive voltage at a cold temperature, and a first read voltage R1' is a negative voltage at a hot temperature.

A nonvolatile memory device 400 (refer to FIG. 36) according to an exemplary embodiment of the inventive concept may have a read voltage which is changed to a negative voltage from a positive voltage according to a temperature.

In the case of a general nonvolatile memory device, a threshold voltage may be changed due to discharging over time of charges from a charge storage layer. Accordingly, it is necessary over time to change read voltages. A high temperature data retention (HTDR) test may be made to measure the data reliability.

Figure 44:
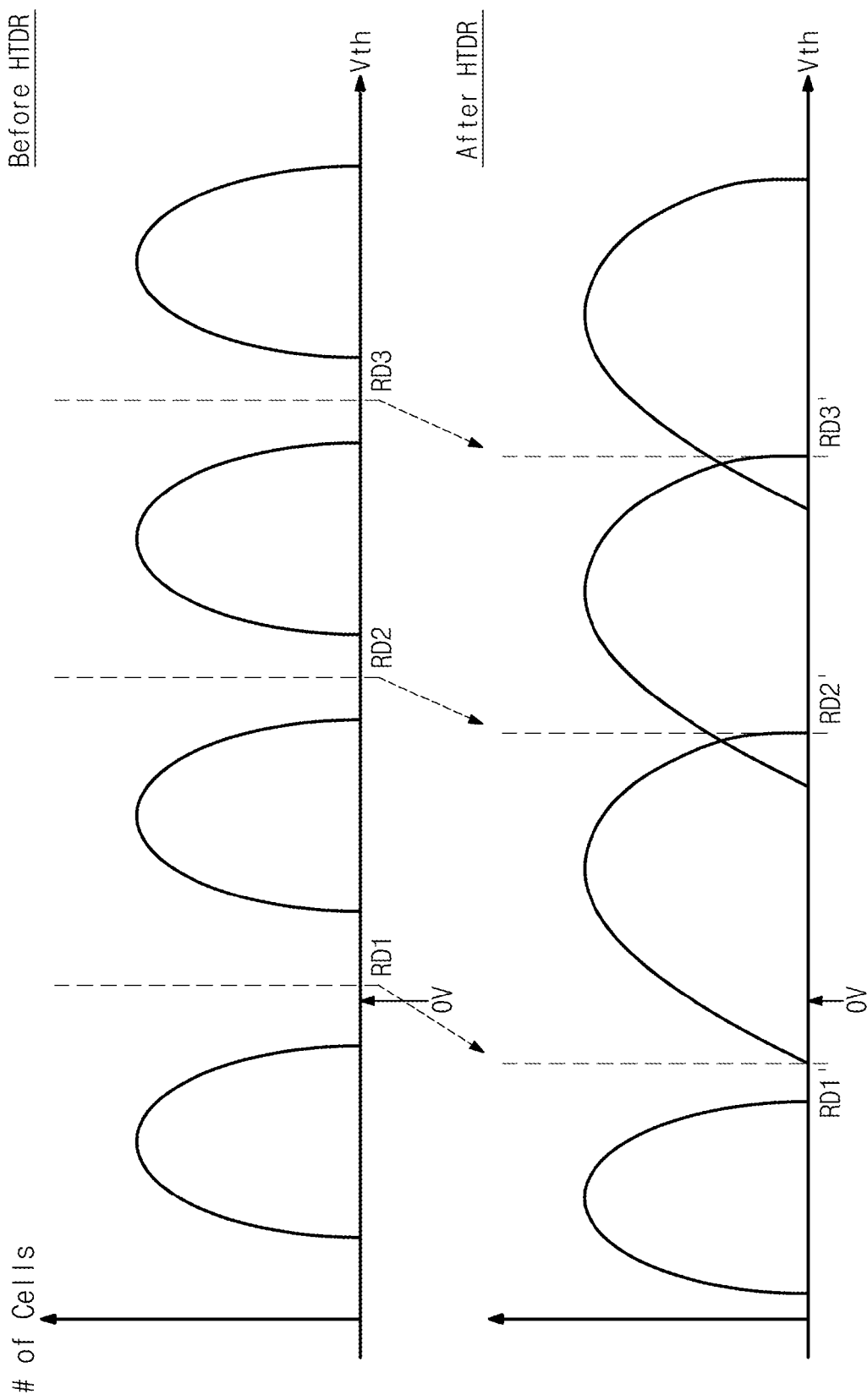
FIG. 44 is a threshold voltage distribution illustrating that a read voltage is changed to a negative voltage from a positive voltage before and after a HTDR test.

FIG. 44 is a threshold voltage distribution illustrating that a read voltage is changed to a negative voltage from a positive voltage before and after a HTDR test. Referring to FIG. 44, a width of a threshold voltage distribution after a HTDR test is widened as compared with that before the HTDR test. Read voltages R1', R2', and R3' after the HTDR test must be set to be lower than read voltages R1, R2, and R3 before the HTDR test. At this time, a first read voltage R1 is a positive voltage before the HTDR test, and a first read voltage R1' is a negative voltage after the HTDR test.

Figure 45:
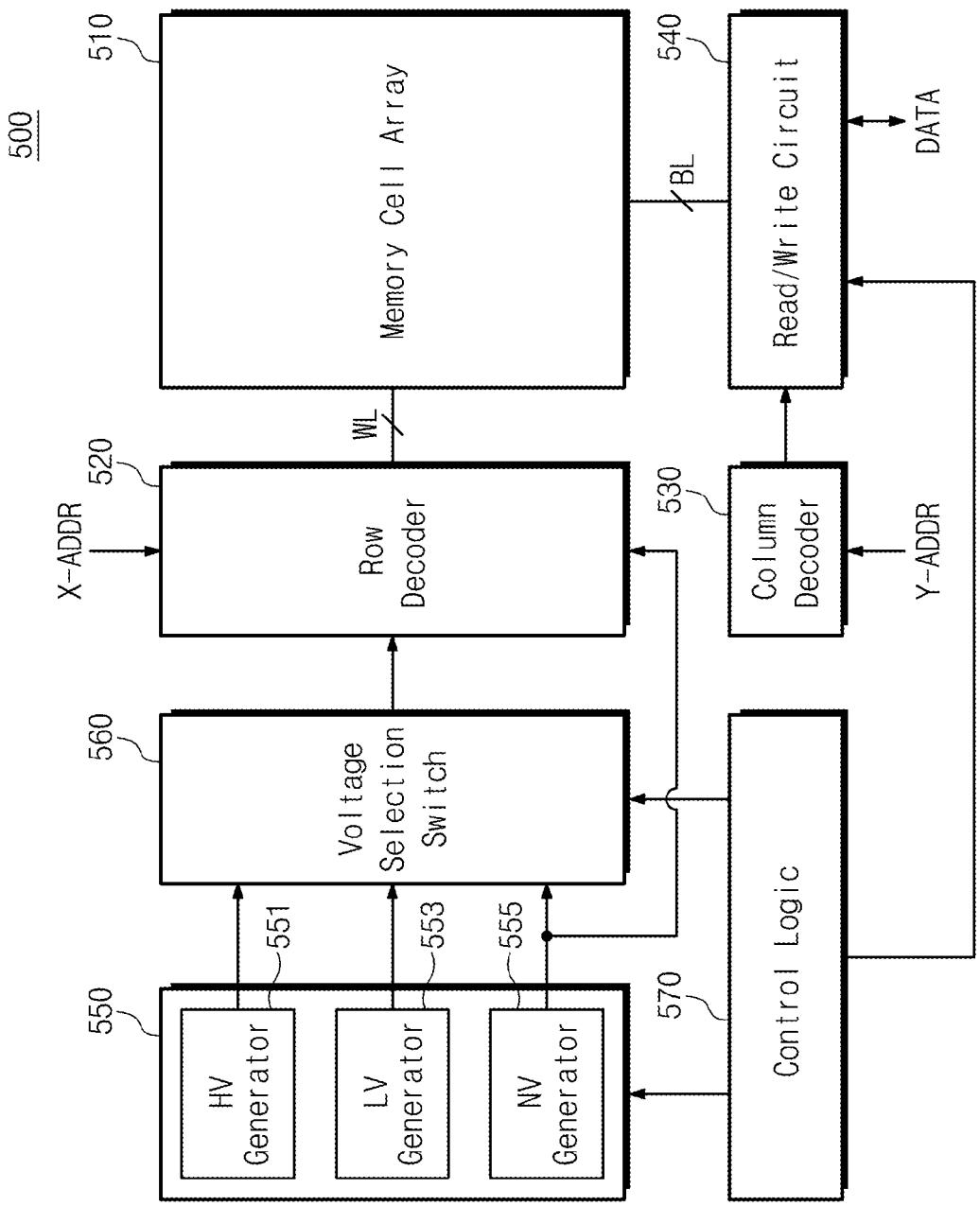
FIG. 45 is a block diagram showing a nonvolatile memory device according to another exemplary embodiment of the inventive concept.

FIG. 45 is a block diagram showing a nonvolatile memory device according to another exemplary embodiment of the inventive concept. Referring to FIG. 45, a nonvolatile memory device 500 includes a memory cell array 510, a row decoder 520, a column decoder 530, an input/output circuit 540, a voltage generator circuit 550, a voltage selecting switch circuit 560, and control logic 570.

The memory cell array 510 is connected with the row decoder 520 via word lines WL and with the input/output circuit 540 via bit lines BL. The memory cell array 510 includes memory cells arranged in a plurality of rows (or, word lines) and a plurality of columns (or, bit lines). The plurality of memory cells in the memory cell array 510 may constitute a plurality of memory blocks. The memory cell array 510 will be more fully described with reference to FIG. 37.

The row decoder 520 is connected between the voltage selection circuit 560 and the memory cell array 510. The row decoder 520 is configured to operate under the control of the control logic 570. The row decoder 520 receives a row address X-ADDR from an external device to decode it. The row decoder 520 selects word lines WL based on a decoding result of the row address X-ADDR. The row decoder 520 performs a function of transferring an output (e.g., a voltage) of the voltage selection switch 560 to a selected word line and unselected word lines.

The column decoder 530 is connected with the input/output circuit 540. The column decoder 530 is configured to operate in response to the control of the control logic 570. The column decoder 530 receives a column address Y-ADDR from the external device to decode it. A decoding result of the column address Y-ADDR is provided to the input/output circuit 540.

The input/output circuit 540 is controlled by the control logic 570, and operates as a sense amplifier or a write driver according to a mode of operation. For example, at a verification/normal read operation, the input/output circuit 540 operates as a sense amplifier for reading data from the memory cell array 510.

During a normal read operation, data read via the column selector circuit 530 is output to the outside (e.g., a memory controller or a host) of the nonvolatile memory device 500. Unlike this, at a verification read operation, data read via the column selector circuit 530 is provided to a pass/fail checking circuit (not shown) in the nonvolatile memory device 500, and is used to judge whether memory cells are programmed normally.

In the case of a program operation, the input/output circuit 540 operates as a write driver for driving bit lines BL0 to BLn according to data to be stored in the memory cell array 510. During the program operation, the input/output circuit 540 receives data to be written in the memory cell array 510 from a buffer (not shown) and drives the bit lines BL0 to BLn according to input data. For this purpose, the input/output circuit 540 is formed of a plurality of page buffers PB corresponding to columns (or, bit lines) or column pairs (or, bit line pairs), respectively. Each page buffer includes a plurality of latches, which perform operations of latching data sensed from a page buffer PB and/or latching data to be programmed.

The voltage generator circuit 550 includes a high voltage generator 551, a low voltage generator 553, and a negative voltage generator 555. The high voltage generator 551 generates positive high voltages needed for driving of the nonvolatile memory device 500 according to the control of the control logic 570. The positive high voltages generated from the high voltage generator 551 may be used as a program voltage Vpgm, a pass voltage Vpass, etc. during a program operation.

The low voltage generator 553 generates positive low voltages needed for driving of the nonvolatile memory device 500 according to the control of the control logic 570. The positive low voltages generated by the low voltage generator 553 may be used as a read voltage Vrd, a verification voltage Vvfy, a decoupling voltage, a blocking block, etc. at a program or read operation.

The negative voltage generator 555 generates negative voltages needed for driving of the nonvolatile memory device 500 according to the control of the control logic 570. The negative voltages generated by the negative voltage generator 555 may be used as a read voltage Vrd, a verification voltage Vvfy, a decoupling voltage, a blocking block, etc. at a program or read operation. The negative voltages generated by the negative voltage generator 555 may be supplied to a bulk (e.g., a well region) in which memory cells are formed.

Below, voltages applied to a word line to drive the nonvolatile memory device 500 are called a word line voltage. Outputs of the high voltage generator 551 and the low voltage generator 553 are transferred to the voltage selecting switch circuit 560. An output of the negative voltage generator 555 is provided to the voltage selecting switch 560 and the row decoder 520.

The voltage selecting switch circuit 560 is connected to the voltage generator circuit 550, the row decoder 520, and the control logic 570. The voltage selecting switch circuit 560 selects one of voltages output from the voltage generator circuit 550 in response to the control of the control logic 570. A voltage selected via the voltage selecting switch circuit 560 is provided to a corresponding word line via the row decoder 520.

In the event that an output of the negative voltage generator 555 is selected by the control of the control logic 570, the voltage selecting switch circuit 560 transfers a negative voltage generated from the negative voltage generator 555 to the row decoder 520. A transfer of a negative voltage to the row decoder 520 via a field effect transistor is accomplished by biasing well regions of the voltage selecting switch circuit 560 and the row decoder 520 by a negative voltage generated from the negative voltage generator 555.

If inactivated, the negative voltage generator 555 generates a ground voltage in response to the control of the control logic 570. When a high voltage or a low voltage is transferred to word lines WL via the voltage selecting switch circuit 560 and the row decoder 520, well regions of the voltage selecting switch circuit 560 and the row decoder 520 are grounded. The negative voltage generator 555 is implemented in the same manner as negative voltage generators 123 and 123_1 illustrated in FIGS. 9 and 13.

The control logic 570 controls an overall operation related to program, erase, and read operations of the nonvolatile memory device 500. The voltage generator circuit 550 generates word line voltages to be supplied to word lines according to a mode of operation and a voltage to be supplied to a bulk (e.g., a well region) in which memory cells are formed. A voltage generating operation of the voltage generator circuit 550 is performed by the control of the control logic 570.

Figure 46:
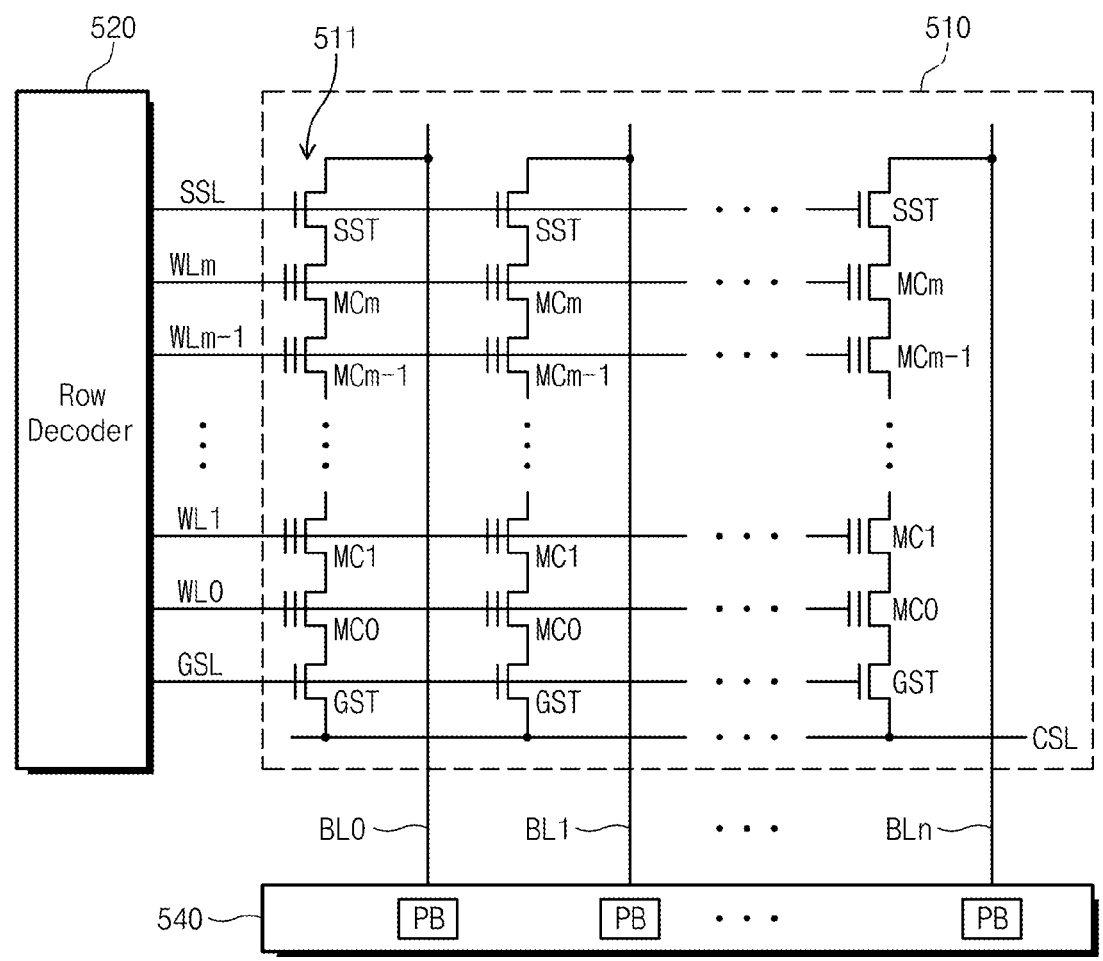
FIG. 46 is a block diagram showing a memory cell array in FIG. 45.

FIG. 46 is a block diagram showing an example of a memory cell array in FIG. 35. Referring to FIG. 46, each memory block includes a plurality of cell strings (or, NAND strings) 511 connected with bit lines BL0 to BLn, respectively.

The cell string 511 includes at least one string selection transistor SST, a plurality of memory cells MC0 to MCn, and at least one ground selection transistor GST. In each cell string 511, a drain of the string selection transistor SST is connected with a bit line, and a source of the ground selection transistor GST is connected with a common source line CSL. The plurality of memory cells MC0 to MCn is connected in series between a source of the string selection transistor SST and a drain of the ground selection transistor GST.

Each of the memory cells MC0 to MCn stores N-bit data information (N being an integer of 1 or more). The memory cells MC0 to MCn store bit information by injecting charges in a charge storage layer. In an exemplary embodiment, the memory cells MC0 to MCn may use a conductive floating gate blocked by an insulation film as a charge storage layer. In another embodiment, the memory cells MC0 to MCn use an insulation film such as Si3N4, Al2O3, HfAlO, HfSiO, etc. as a charge storage layer instead of a typical conductive floating gate. A flash memory using an insulation film such as Si3N4, Al2O3, HfAlO, HfSiO, etc as a charge storage layer is called a charge trap flash (CTF) memory. As will be described below, an operating characteristic of a nonvolatile memory device according to an exemplary embodiment of the inventive concept is applied to a flash memory device using a conductive floating gate as a charge storage layer and a CTF memory using an insulation film as a charge storage layer.

Further, the memory cell array 110 according to an exemplary embodiment of the inventive concept is implemented by any one of a stack flash structure including a plurality of cell arrays stacked in a multi-layer manner, a source-drain free flash structure, a pin-type flash structure, and a three-dimensional flash structure.

FIG. 46 illustrates the example where the nonvolatile memory device 500 according to an exemplary embodiment of the inventive concept is a NAND-type flash memory. However, the inventive concept is not limited thereto. As will be more fully described below, an operating characteristic of the nonvolatile memory device 500 of the inventive concept is applicable to a NOR-type flash memory, a hybrid flash memory including two different types of memory cells, a flash memory in which a controller is embedded within a chip, and the like.

As illustrated in FIG. 46, control gates of memory cells in the same row are connected in common with corresponding word lines WL0 to WLm. A string selection transistor SST is controlled by a voltage applied via a string selection line SSL, and a ground selection transistor GST is controlled by a voltage applied via a ground selection line GSL. Memory cells MC0 to MCn are controlled by voltages applied via corresponding word lines WL0 to WLm. Memory cells connected to each word line store data corresponding to a page, a sub-page less than a page, or a plurality of pages. A read operation for reading data stored in a NAND-type flash memory and a program operation for storing data therein are performed by a unit of one page or a plurality of pages. Alternatively, they are performed by a unit of a sub-page. An erase operation for erasing data stored in the NAND-type flash memory is performed by a block unit formed of a plurality of pages.

Figure 47:
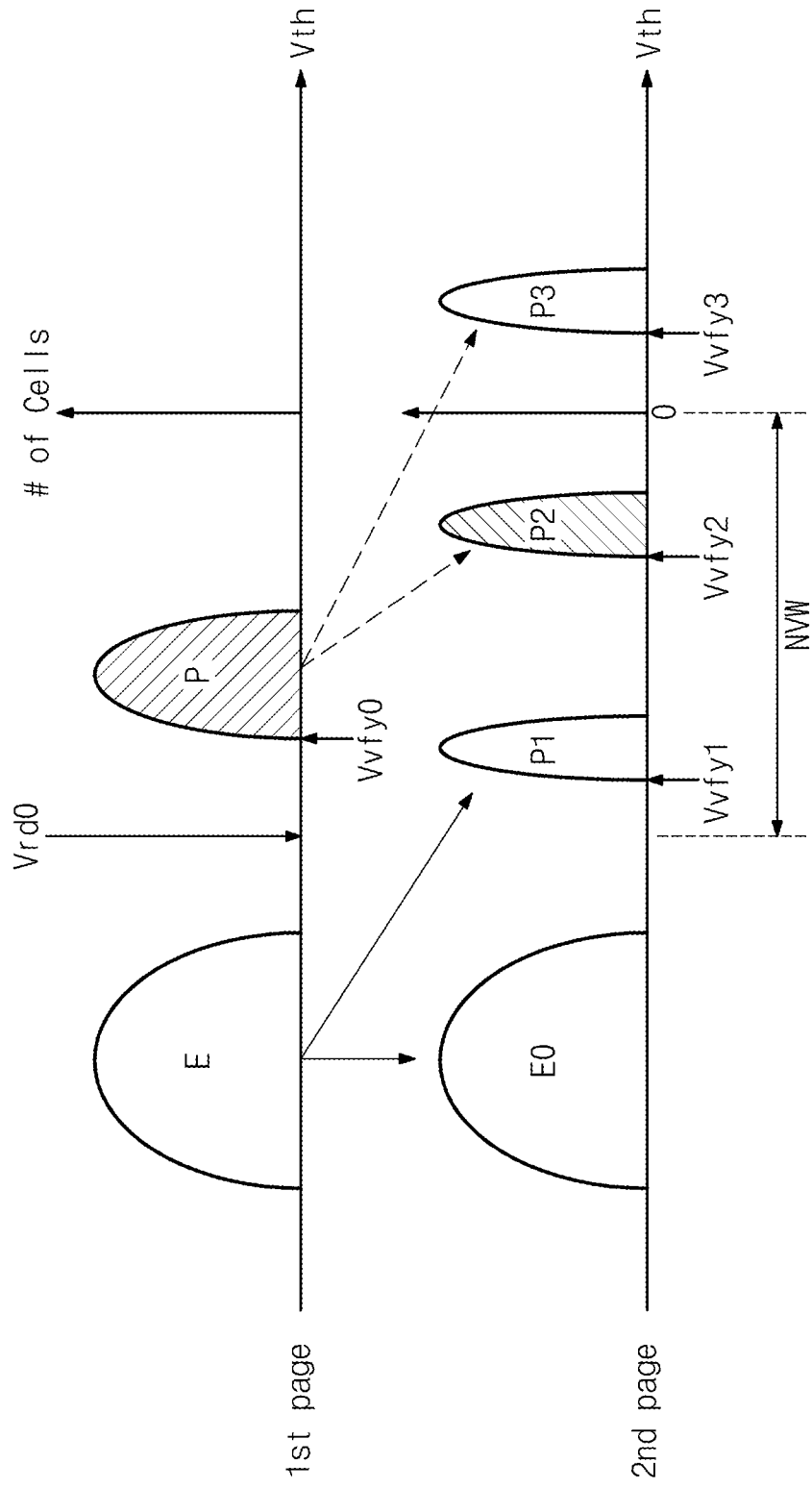
FIG. 47 is a diagram showing a program method of a nonvolatile memory device in FIG. 45 according to the first embodiment of the inventive concept.

FIG. 47 is a diagram showing a program method of a nonvolatile memory device in FIG. 45 according to the first embodiment of the inventive concept. Referring to FIG. 47, a program state P of a first page may be programmed to program states P2 and P3 of a second page.

When programmed with the first page, each of memory cells has an erase state E or a program state P. Herein, a threshold voltage distribution corresponding to the program state P is disposed at a threshold voltage region lower in level than 0V.

When programmed with the second page, each of memory cells has one data state of an erase state E0 and a plurality of program states P1, P2, and P3. Herein, the erase and program states E0 and P1 represent states programmed from an erase state E by programming of the second page. The program states P2 and P3 are threshold voltage distributions formed according to programming of the second page from the program state P. Programming may be performed from a program state P disposed at a negative voltage region to a program state P2 disposed at the negative voltage region.

A process of programming a second page is as follows. First, an initial read operation is performed to latch first page data programmed at selected memory cells. At this time, a read voltage Vrd0 provided for the initial read operation is a negative voltage. Bit values of the first page stored in memory cells are sensed when the read voltage Vrd0 being a negative voltage is applied to a word line of the selected memory cells. The first page data sensed via the initial read operation is stored in latches of a page buffer (not shown). Data bits corresponding to the second page are loaded onto other latches included in the page buffer. A target state is decided according to a bit value of the first page latched by the initial read operation and a bit value of the second page provided as write data.

During a program operation, a program voltage is applied to a word line of selected memory cells. A verification read operation for detecting whether the selected memory cells are programmed normally may be performed by the number of program states P1, P2, and P3. This means that verification voltages Vvfy1, Vvfy2, and Vvfy3 are sequentially applied to a word line of the selected memory cells. Herein the verification voltages Vvfy1 and Vvfy2 are negative voltages.

As described above, referring to a voltage distribution formed after programming of a second page, at least two program states P1 and P2 are disposed between an erase state E0 and 0V. A negative voltage window (NVW) including at least two program states is established between the erase state E0 and 0V in order to support programming from a negative program state P to another negative voltage state P2.

Figure 48:
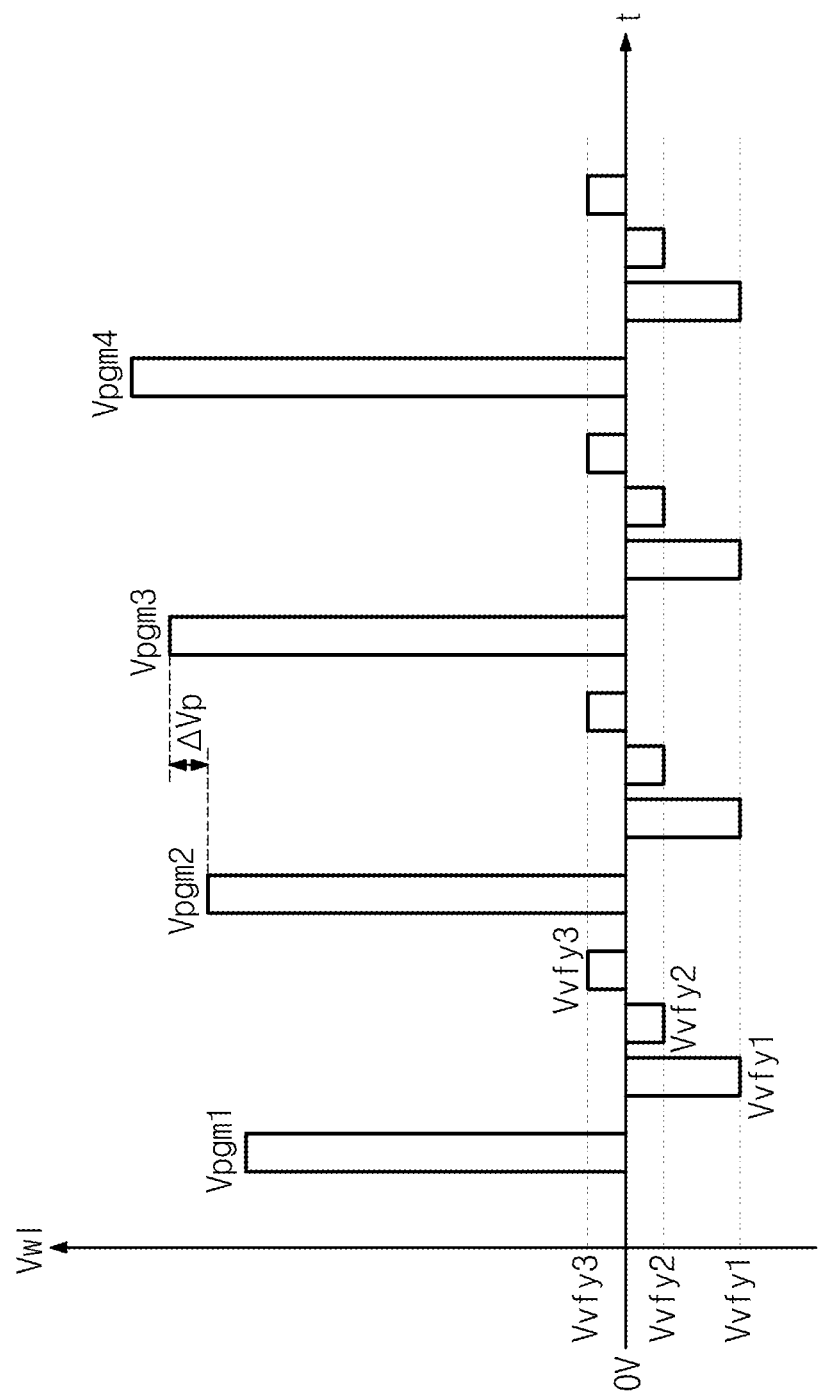
FIG. 48 is a waveform diagram showing a program operation of memory cells having a program state of FIG. 47.

FIG. 48 is a waveform diagram showing a program operation of memory cells having a program state of FIG. 47. Referring to FIG. 48, there is illustrated a waveform of a word line voltage provided during a program-verification cycle on selected memory cells. A word line waveform is skipped at an initial read operation executed to store multi-bit data in selected memory cells and at a verification operation executed before a supply of a program voltage.

First, a program voltage Vpgm1 is supplied to a word line of selected memory cells. At this time, in the event that a verification read operation is performed before programming, memory cells, in which logic '1' is stored, among the selected memory cells are program inhibited. On the other hand, charges are injected to charge storing layers of memory cells, in which logic '0' is written, among the selected memory cells by the program voltage Vpgm1.

Following a supply of a program voltage Vpgm1, verification read voltages Vvfy1, Vvfy2, and Vvfy3 are provided to the word line of the selected memory cells. The program-verification cycle is repeated until all memory cells are programmed to a target state. A nonvolatile memory device 500 is programmed by an ISPP manner to control a threshold voltage distribution of memory cells exactly. In this case, program voltages Vpgm1 to VpgmN to be used at programming of program loops have voltage levels stepwise increased by $\Delta Vp$. In this embodiment, whenever each of the program voltages Vpgm1 to VpgmN is applied at each of the program loops, a verification read operation is performed three times using first to third verification voltages Vvfy1, Vvfy2, and Vvfy3. Herein, the program voltages Vpgm1 to VpgmN are positive high voltages. In this embodiment, the program voltages Vpgm1 to VpgmN are generated from a high voltage generator 571 under the control of control logic 570.

In this embodiment, the first and second verification voltages Vvfy1 and Vvfy2 are negative voltages. The second verification voltage Vvfy2 is a negative voltage higher in level than the first verification voltage Vvfy1. The first and second verification voltages Vvfy1 and Vvfy2 are provided from a negative voltage generator 555 under the control of the control logic 570. The third verification voltage Vvfy3 is a positive voltage. The third verification voltage Vvfy3 is provided from a low voltage generator 553 under the control of the control logic 570.

Figure 49:
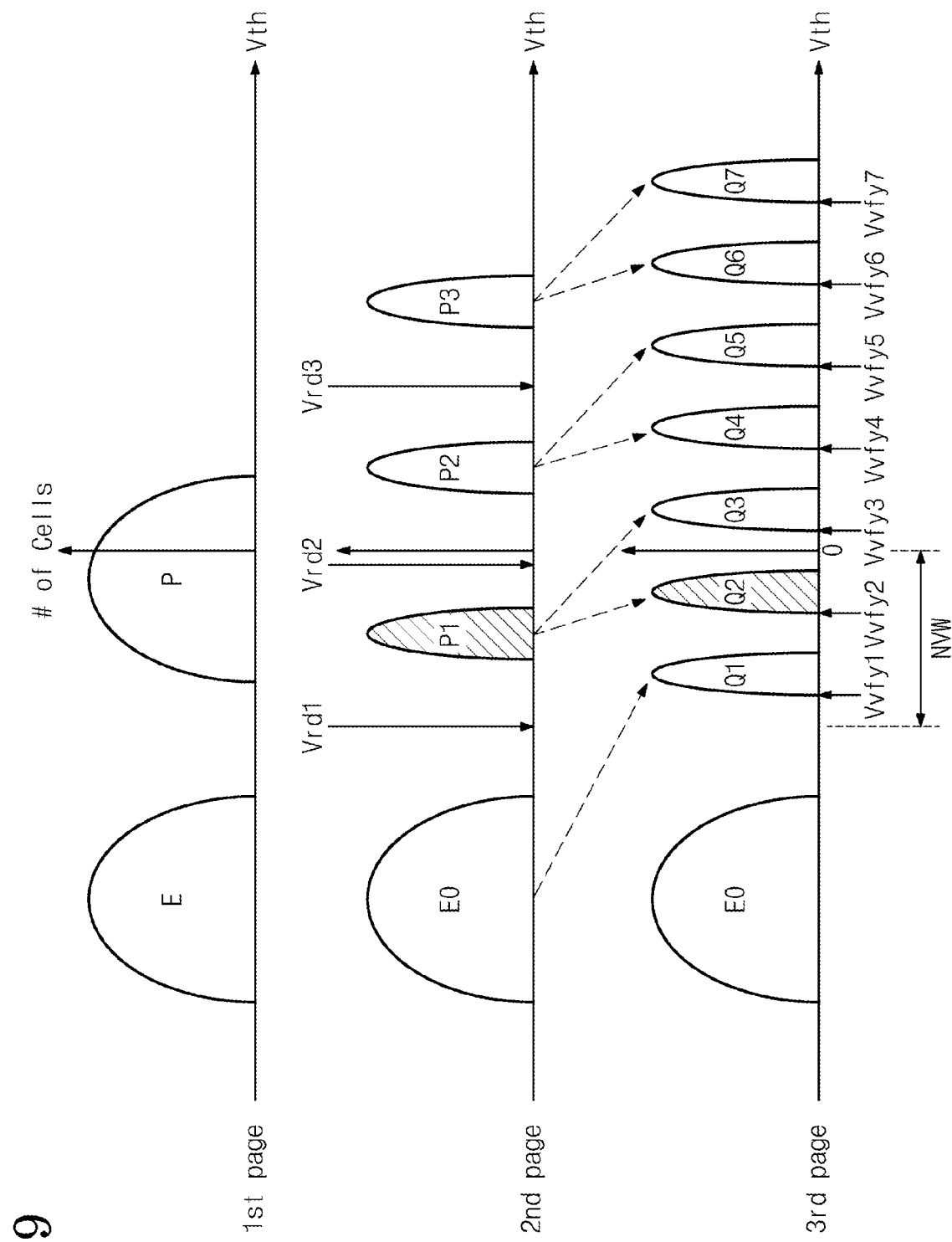
FIG. 49 is a diagram showing a program method of a nonvolatile memory device in FIG. 45 according to the second embodiment of the inventive concept.

FIG. 49 is a diagram showing a program method of a nonvolatile memory device in FIG. 45 according to the second embodiment of the inventive concept. Referring to FIG. 49, a program state P1 of a second page is programmed to program states Q2 and Q3 of a third page.

If programmed with the second page, memory cells have one of an erase state E0 and a plurality of program states P1, P2, and P3, respectively. Herein, a threshold voltage distribution corresponding to the program state P1 is disposed at a threshold voltage region lower than 0V.

If programmed with the third page, memory cells has one data state of the erase state E0 and a plurality of program states Q1, Q2, Q3, Q4, Q5, Q6, and Q7, respectively. Herein, the erase state E0 and the program state Q1 represent states programmed from the erase state E0 upon programming of the third page. The program states Q2 and Q3 are threshold voltage distributions formed from the program state P1 upon programming of the third page. According to an exemplary embodiment of the inventive concept, a memory cell is programmed from a program state disposed at a negative voltage region to a program state Q2 disposed at a negative voltage region.

A process of programming the third page is as follows. First, an initial read operation is performed to latch first page data programmed in selected memory cells. At this time, a read voltage Vrd1 provided for the initial reading is a negative voltage. A read voltage Vrd2 is 0V or a negative voltage lower than 0V. A read voltage Vrd3 is a positive voltage.

Bit values of the second page stored in memory cells are sensed when the read voltages Vrd1, Vrd2, and Vrd3 are provided to a word line of selected memory cells. The second page data sensed via the initial read operation is stored in latches included in a page buffer (not shown). Data bits corresponding to a third page are loaded onto other latches included in the page buffer. A target state is decided according to a bit value of the second page latched by the initial reading and a bit value of the third page provided as write data.

During a program operation, a program voltage is applied to a word line of selected memory cells. After, a verification read operation for detecting whether the selected memory cells are programmed normally may be performed by the number of program states Q1, Q2, Q3, Q4, Q5, Q6, and Q7. That is, verification voltages Vvfy1, Vvfy2, Vvfy3, Vvfy4, Vvfy5, Vvfy6, and Vvfy7 are sequentially applied to the word line of the selected memory cells. Herein, the verification voltages Vvfy1 and Vvfy2 are negative voltages.

As described above, referring to a threshold distribution formed after programming of the third page, at least two program states Q1 and Q2 are disposed between an erase state E0 and 0V. A negative voltage window (NVW) including at least two program states is established between the erase state E0 and 0V in order to support programming from a negative program state P1 to another negative voltage state Q2.

Figure 50:
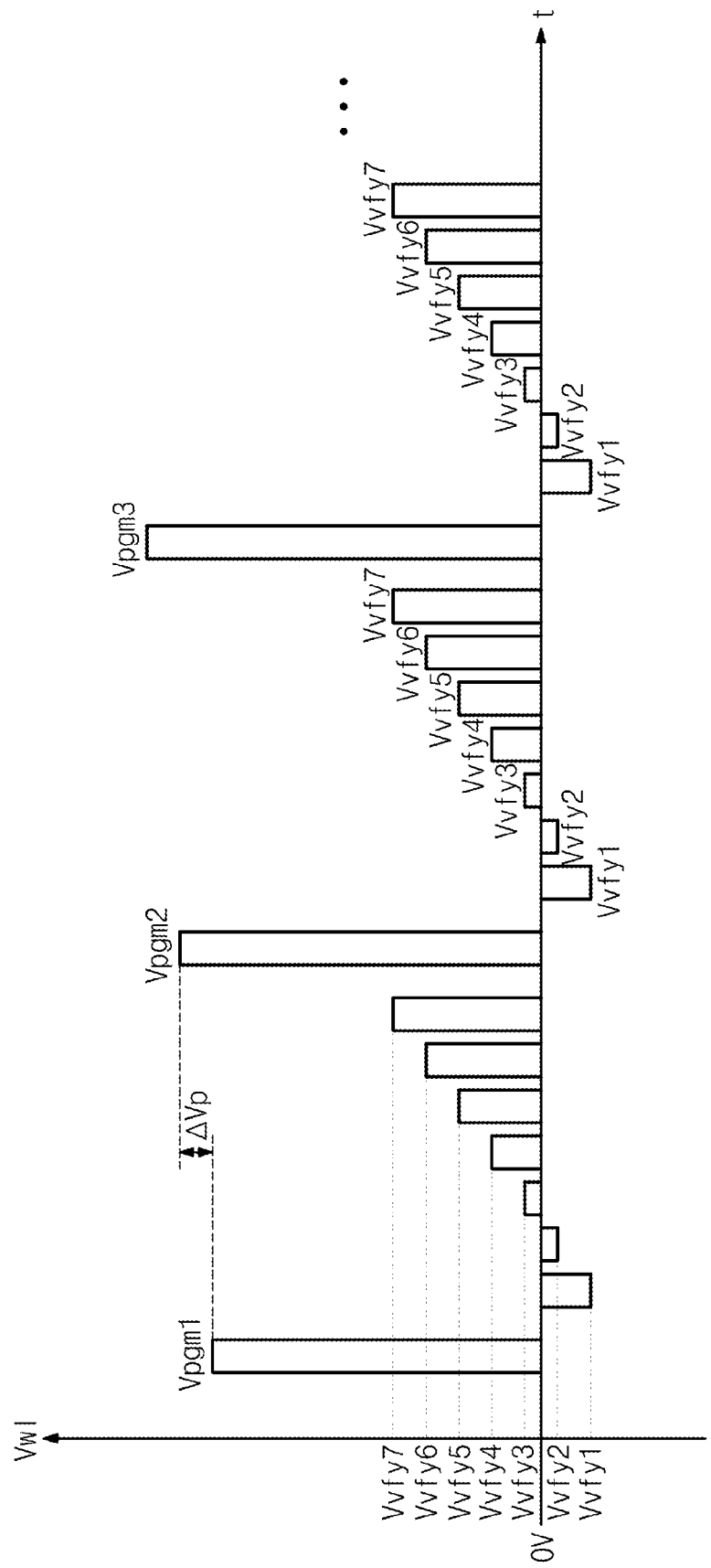
FIG. 50 is a waveform diagram showing a program operation of memory cells having a program state of FIG. 49.

FIG. 50 is a waveform diagram showing a program operation of memory cells having a program state of FIG. 49. Referring to FIG. 50, there is illustrated a waveform of a word line voltage provided during a program-verification cycle on selected memory cells. A word line waveform is skipped at an initial read operation executed to store multi-bit data in selected memory cells and at a verification operation executed before a supply of a program voltage.

First, a program voltage Vpgm1 is supplied to a word line of selected memory cells. At this time, in the event that a verification read operation is performed before programming, memory cells, in which logic '1' is stored, among the selected memory cells are program inhibited. On the other hand, charges are injected to charge storing layers of memory cells, in which logic '0' is written, among the selected memory cells by the program voltage Vpgm1.

Following a supply of a program voltage Vpgm1, verification read voltages Vvfy1, Vvfy2, Vvfy3, Vvfy4, Vvfy5, Vvfy6, and Vvfy7 are provided to the word line of the selected memory cells. The program-verification cycle is repeated until all memory cells are programmed to a target state. A nonvolatile memory device 500 is programmed by an ISPP manner to control a threshold voltage distribution of memory cells exactly. In this case, program voltages Vpgm1 to VpgmN to be used at programming of program loops have voltage levels stepwise increased by $\Delta Vp$.

In this embodiment, whenever each of the program voltages Vpgm1 to VpgmN is applied at each of the program loops, a verification read operation is performed seven times using first to third verification voltages Vvfy1, Vvfy2, Vvfy3, Vvfy4, Vvfy5, Vvfy6, and Vvfy7. Herein, the program voltages Vpgm1 to VpgmN are positive high voltages. In this embodiment, the program voltages Vpgm1 to VpgmN are generated from a high voltage generator 571 under the control of control logic 570.

In this embodiment, the first and second verification voltages Vvfy1 and Vvfy2 are negative voltages. The second verification voltage Vvfy2 is a negative voltage higher in level than the first verification voltage Vvfy1. The first and second verification voltages Vvfy1 and Vvfy2 are provided from a negative voltage generator 555 under the control of the control logic 570. The third verification voltage Vvfy3 is a positive voltage. The third verification voltage Vvfy3 is provided from a low voltage generator 553 under the control of the control logic 570.

Figure 51:
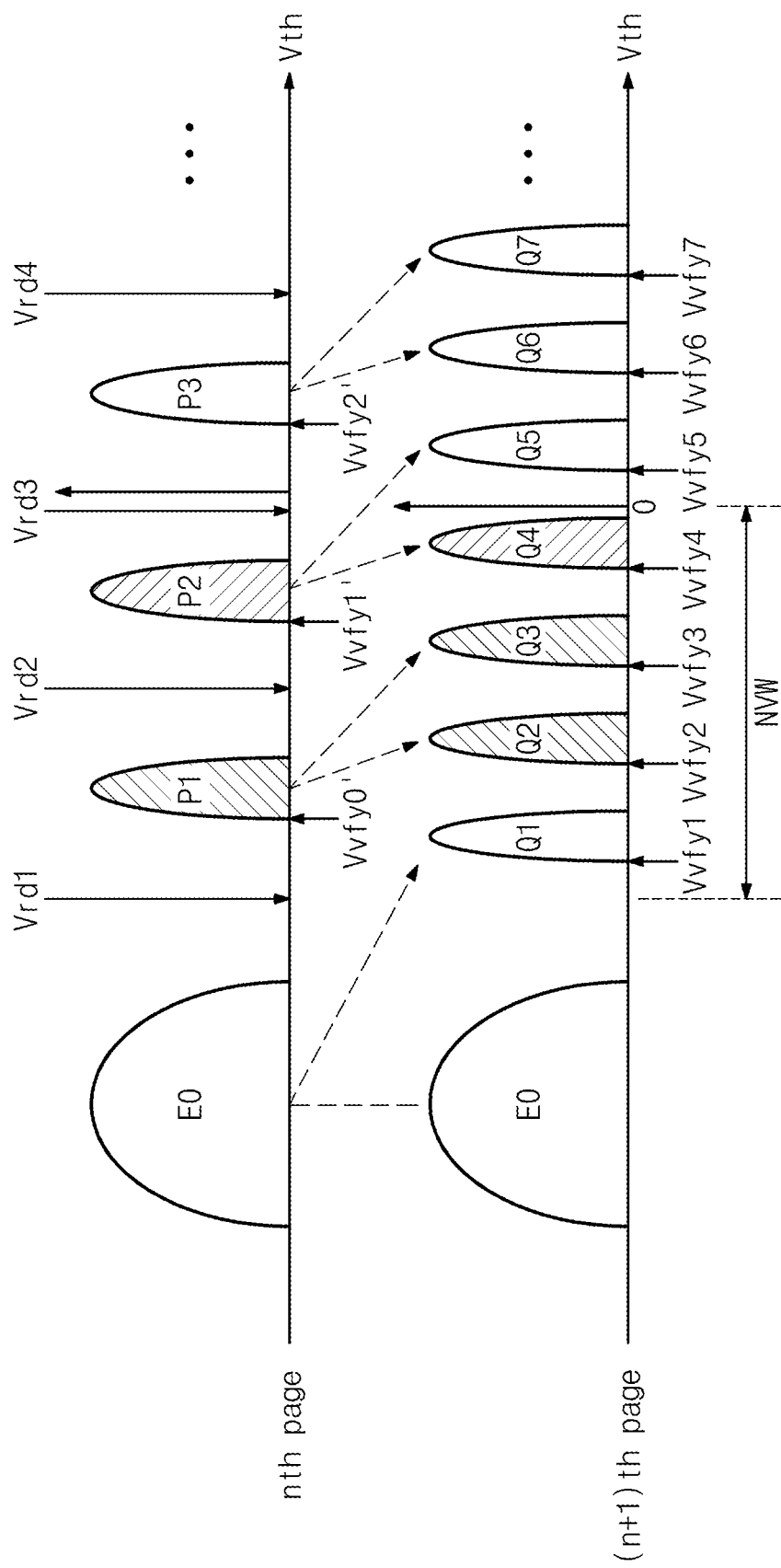
FIG. 51 is a diagram showing a program method of a nonvolatile memory device in FIG. 45 according to the third embodiment of the inventive concept.

FIG. 51 is a diagram showing a program method of a nonvolatile memory device in FIG. 45 according to the third embodiment of the inventive concept. Referring to FIG. 51 a program state P1 of a nth page is programmed to program states Q2 and Q3 of a (n+1)th page. A program state P2 of the nth page is programmed to program states Q4 and Q5 of the (n+1)th page. Herein, when the (n+1)th page is programmed, the program states Q1, Q2, Q3, and Q4 are disposed at a negative threshold voltage region, respectively. Program states P2, P3, and P4 represent states shifted according to programming of data from program states P1 and P2.

If programmed with the (n+1)th page, memory cells have one state of an erase state E0 and a plurality of program states (Q1, Q2, Q3, Q4, Q5, Q6, Q7, . . . ), respectively. The erase state E0 and the program state Q1 represent states programmed from the erase state E0 by programming of the (n+1)th page. The program states P2, P3, and P4 are threshold voltage distributions formed from the program states P1 and P2 upon programming of the (n+1)th page. According to an exemplary embodiment of the inventive concept, a memory cell is programmed to program states Q2, Q3, and Q4 disposed at a negative voltage region to program states P1 and P2 disposed at a negative voltage region.

A process of programming the (n+1)th page is as follows. First, an initial read operation is performed to latch nth page data programmed in selected memory cells. At this time, read voltages Vrd1 and Vrd2 provided for the initial reading are negative voltages. A read voltage Vrd3 is 0V or a negative voltage lower than 0V. A read voltage Vrd4 is a positive voltage.

Bit values of the nth page stored in memory cells are sensed when the read voltages (Vrd1, Vrd2, Vrd3, ... ) are provided to a word line of selected memory cells. The nth page data sensed via the initial read operation is stored in latches included in a page buffer (not shown). Data bits corresponding to the (n+1)th page are loaded onto other latches included in the page buffer. A target state is decided according to a bit value of the nth page latched by the initial reading and a bit value of the (n+1)th page provided as write data.

During a program operation, a program voltage is applied to a word line of selected memory cells. After, a verification read operation for detecting whether the selected memory cells are programmed normally may be performed by the number of program states (Q1, Q2, Q3, Q4, Q5, Q6, Q7, ... ). That is, verification voltages (Vvfy1, Vvfy2, Vvfy3, Vvfy4, Vvfy5, Vvfy6, Vvfy7, ... ) are sequentially applied to the word line of the selected memory cells. Herein, the verification voltages Vvfy1, Vvfy2, Vvfy3, and Vvfy4 are negative voltages.

As described above, referring to a threshold distribution formed after programming of the (n+1)th page, a plurality of program states Q1, Q2, Q3, and Q4 is disposed between an erase state E0 and 0V. A negative voltage window (NVW) including at least two program states (Q1, Q2, Q3, and Q4) is established between the erase state E0 and 0V in order to support programming from a negative program states P1 and P2 to another negative voltage state Q2, Q3, and Q4.

Figure 52:
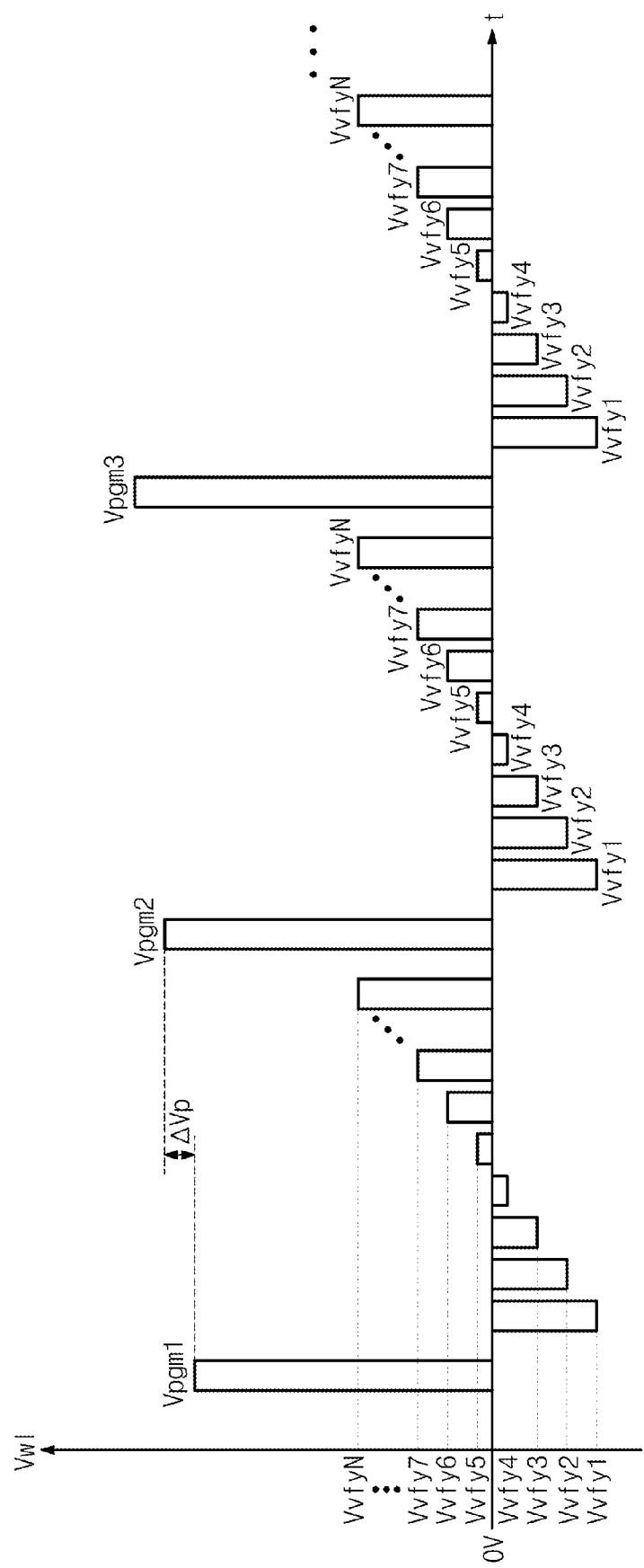
FIG. 52 is a waveform diagram showing a program operation of memory cells having a program state of FIG. 51.

FIG. 52 is a waveform diagram showing a program operation of memory cells having a program state of FIG. 51. Referring to FIG. 52, there is illustrated a waveform of a word line voltage provided during a program-verification cycle on selected memory cells. A word line waveform is skipped at an initial read operation executed to store multi-bit data in selected memory cells and at a verification operation executed before a supply of a program voltage.

First, a program voltage Vpgm1 is supplied to a word line of selected memory cells. Following a supply of a program voltage Vpgm1, verification read voltages (VVvfy1, Vvfy2, Vvfy3, Vvfy4, Vvfy5, Vvfy6, Vvfy7, ... ) are provided to the word line of the selected memory cells. The program-verification cycle is repeated until all memory cells are programmed to a target state. A nonvolatile memory device 500 is programmed by an ISPP manner to control a threshold voltage distribution of memory cells exactly. In this case, program voltages Vpgm1 to VpgmN to be used at programming of program loops have voltage levels stepwise increased by ΔVp. In this embodiment, whenever each of the program voltages Vpgm1 to VpgmN is applied at each of the program loops, a verification read operation is performed seven times using first to third verification voltages (Vvfy1, Vvfy2, Vvfy3, Vvfy4, Vvfy5, Vvfy6, Vvfy7, ... ). Herein, the program voltages Vpgm1 to VpgmN are positive high voltages. In this embodiment, the program voltages Vpgm1 to VpgmN are generated from a high voltage generator 571 under the control of control logic 570.

In this embodiment, the first to fourth verification voltages Vvfy1, Vvfy2, Vvfy3, and Vvfy4 are negative voltages. The second verification voltage Vvfy2 is a negative voltage higher in level than the first verification voltage Vvfy1. The third verification voltage Vvfy3 is a negative voltage higher in level than the second verification voltage Vvfy2. The first to fourth verification voltages Vvfy1, Vvfy2, Vvfy3, and Vvfy4 are provided from a negative voltage generator 555 under the control of the control logic 570. Remaining verification voltages higher than the fourth verification voltage Vvfy4 are positive voltages. The remaining verification voltages higher than the fourth verification voltage Vvfy4 are provided from a low voltage generator 553 under the control of the control logic 570.

Figure 53:
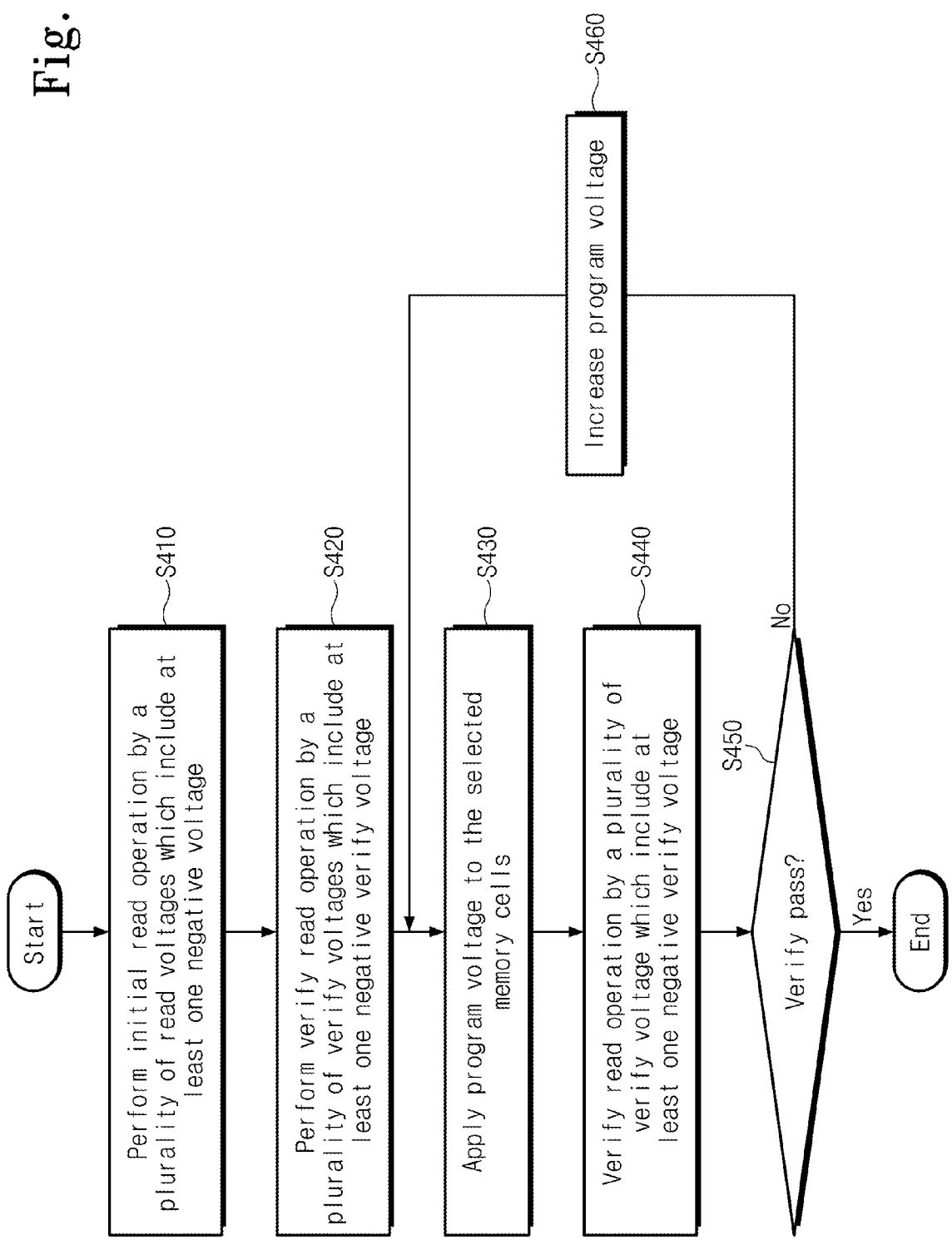
FIG. 53 is a flowchart showing a program method of a nonvolatile memory device illustrated in FIG. 45.

FIG. 53 is a flowchart showing a program method of a nonvolatile memory device illustrated in FIG. 45. Referring to FIG. 53, an initial read operation and a verification read operation are performed prior to a program loop.

In operation S410, there is carried out the initial read operation on memory cells prior to writing multi-bit data. At this time, data stored in memory cells may be stored in a corresponding page buffer via a sensing operation. Program data is loaded onto other latches of the page buffers.

In operation S420, the verification read operation on the selected memory cells is carried out. At this time, a verification read voltage may include verification read voltages (e.g., Vvfy1 and Vvfy2 in FIG. 40) included in a negative voltage region. According to the verification read operation, bit lines of memory cells are biased so as to be program inhibited or by 0V.

In operation S430, there is performed a program execution operation in which a program voltage is applied to a word line of the selected memory cells. A program voltage of a first program loop is the lowest high voltage, and a program voltage being provided afterward stepwise increases according to an ISPP manner.

In operation S440, memory cells supplied with the program voltage Vpgm are sensed by a plurality of verification read voltages Vvfy1, Vvfy2, . . . , VvfyN. Whether the selected memory cells are programmed to a target state is detected by the verification read voltages Vvfy1, Vvfy2, . . . , VvfyN. Memory cells programmed to the target state is set to be program inhibited by the page buffer.

In operation S450, there is detected whether all selected memory cells are programmed. If so, a program method is ended. If not, the program method proceeds to operation S460, in which a program voltage increases by a step voltage ΔVp.

In operation S460, a program voltage is increased as compared with a previous loop. The program method proceeds to operation S430, in which the increased program voltage is applied to the selected memory cells. Operations S430 to S460 constitute a program loop, which is repeated until programming of the selected memory cells is completed.

By a program method according to an exemplary embodiment of the inventive concept, some threshold voltages of selected memory cells are programmed from a program state disposed at a negative voltage region to a program state disposed at another negative voltage region. Herein, operation S420 is selectively performed or is not performed.

Figure 54:
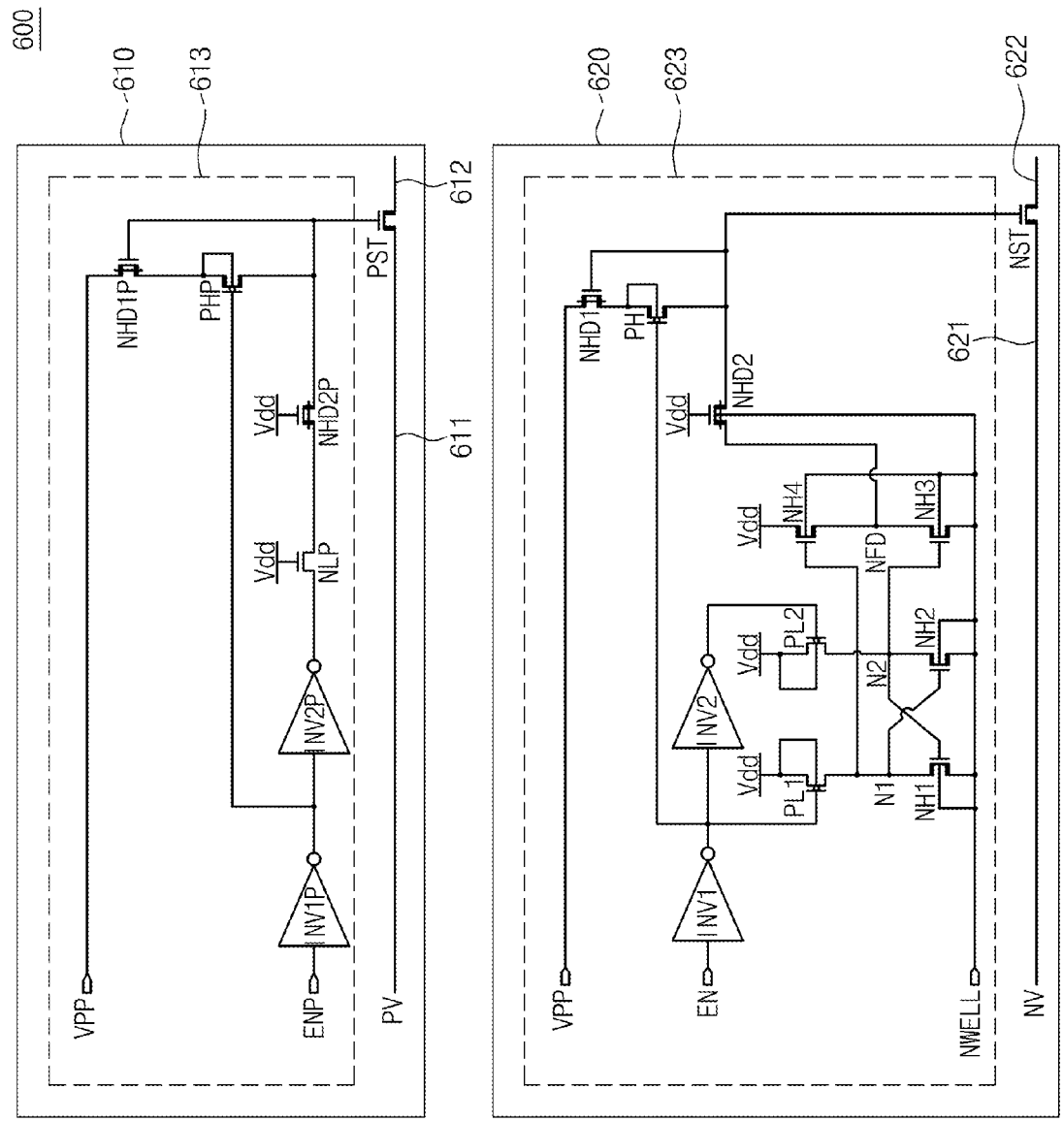
FIG. 54 is a diagram showing a nonvolatile memory device according to another exemplary embodiment of the inventive concept.

FIG. 54 is a diagram showing a nonvolatile memory device according to another exemplary embodiment of the inventive concept. Referring to FIG. 54, a nonvolatile memory device 600 includes a first voltage applying pass circuit 610 applying a positive voltage PV to a first line 612 and a second voltage applying pass circuit 620 applying a negative voltage NV to a second line 622. Herein, the first line 612 and the second line 612 are lines corresponding to word lines.

The first voltage applying pass circuit 610 includes a selection transistor PST and a positive voltage selection switch 613. The selection transistor PST is connected between a line supplied with the positive voltage PV and a line supplied with the positive voltage PV according to the control of the positive voltage selection switch 613. The positive voltage selection switch 613 decides supplying of any one of a high voltage VPP and a ground voltage to a gate of the selection transistor PST in response to an enable signal for a positive voltage ENP. The positive voltage selection switch 613 includes first and second inverters INV1P and INV2P, first and second depletion transistors NHD1P and NHD2P, a PMOS high voltage transistor PHP, and an NMOS low voltage transistor NLP.

The second voltage applying pass circuit 620 includes a selection transistor NST and a negative voltage selection switch 623. The selection transistor NST is connected between a line 621 supplied with a negative voltage NV and a line 612 supplied with the negative voltage NV according to the control of the negative voltage selection switch 623. The negative voltage selection switch 623 is configured the same as a switch 213 illustrated in FIG. 15. When the negative voltage NV is applied to the line 621, a well voltage NWELL applied to a well, in which the second voltage applying pass circuit 620 is formed, may be the negative voltage NV.

The nonvolatile memory device 600 in FIG. 54 includes one first voltage applying pass circuit 610 and one second voltage applying pass circuit 620. However, the inventive concept is not limited thereto. A nonvolatile memory device according to an exemplary embodiment of the inventive concept is implemented to include at least one first voltage applying pass circuit and at least one second voltage applying pass circuit.

A nonvolatile memory device 100 in FIG. 2 includes three voltages generators 121, 122, and 123. However, the inventive concept is not limited thereto.

Figure 55:
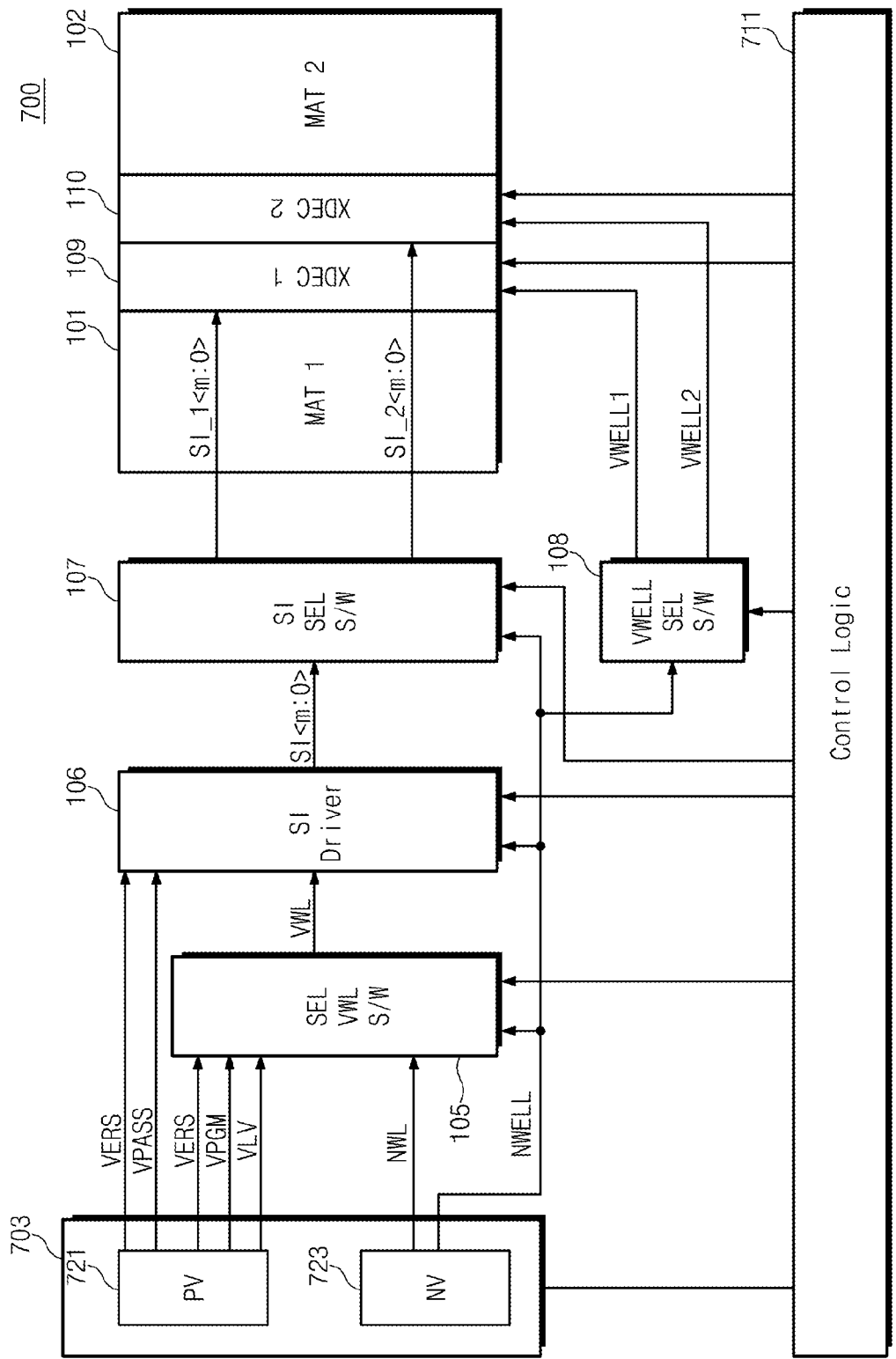
FIG. 55 is a diagram showing a nonvolatile memory device according to another exemplary embodiment of the inventive concept.

FIG. 55 is a diagram showing a nonvolatile memory device according to another exemplary embodiment of the inventive concept. Referring to FIG. 55, a nonvolatile memory device 700 has such a structure that a low voltage generator and a read verification voltage switch are removed, as compared with a nonvolatile memory device 100 in FIG. 2.

A voltage generator 703 includes a positive voltage generator 721 and a negative voltage generator 723. A word line voltage selecting switch circuit 705 receives a program voltage VPGM, an erase voltage VERS, a peri-voltage VLV, and a negative voltage NWL to select one of the input voltages. Control logic 711 controls an overall operation of the nonvolatile memory device 700.

Various Threshold Voltage Embodiments

Figure 56:
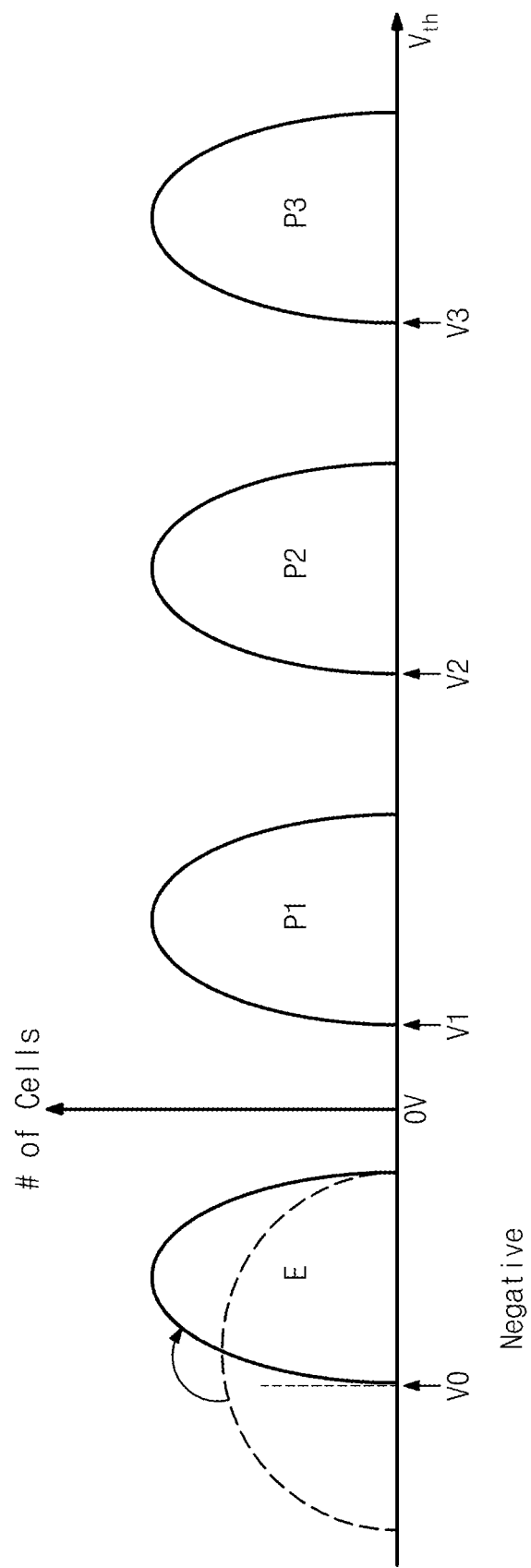
FIGS. 56 to 64 are diagrams showing threshold voltage distributions applicable to the inventive concept.

FIG. 56 is a diagram showing a threshold voltage distribution verifying an erase state. Referring to FIG. 56, a verification voltage V0 of an erase state E is a negative voltage, and remaining verification voltages V1, V2, and V3 are positive voltages. It is possible to make a distribution of memory cells of the erase state E become narrow by verifying the erase state E by a negative voltage. That is, widening of a threshold voltage distribution of an erase voltage due to the coupling after program execution is prevented using a verification voltage V0 of a negative voltage.

Figure 57:
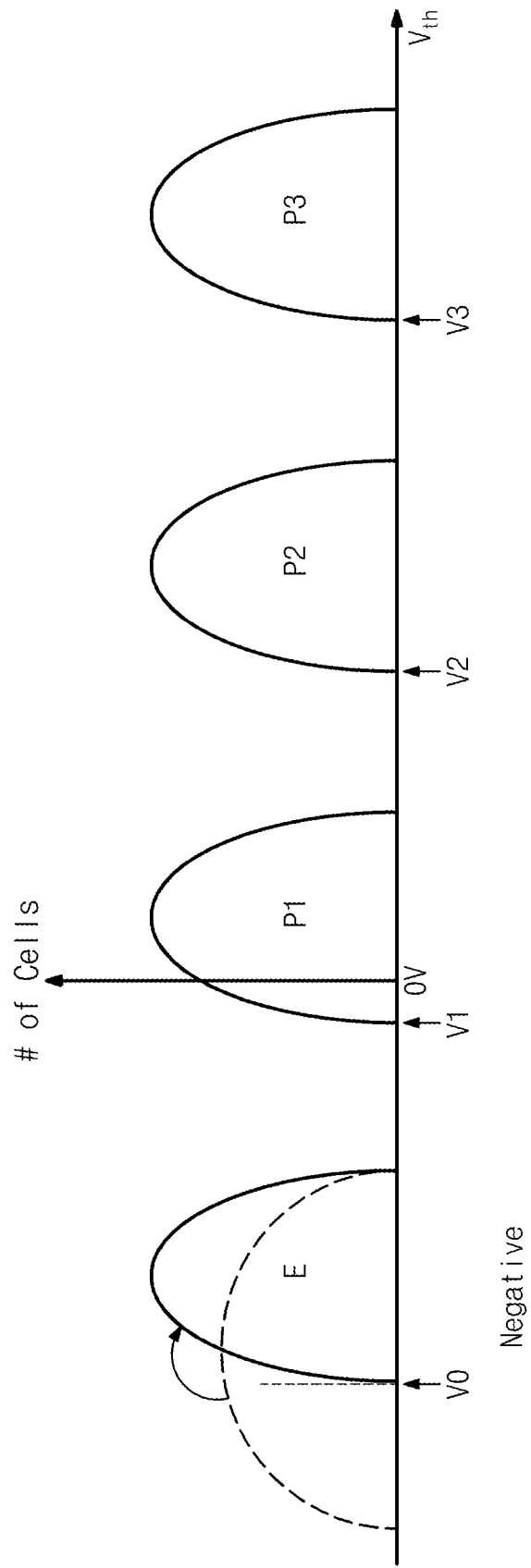

FIG. 57 is a diagram showing another embodiment of a threshold voltage distribution verifying an erase state. Referring to FIG. 57, a verification voltage V0 of an erase state E and a verification voltage V1 of a first program state P1 are negative voltages, and remaining verification voltages V2 and V3 are positive voltages. That is, not only the erase state E but also a part of the first program state P1 are disposed at a negative region, and a negative voltage is used as the verification voltages V0 and V1 of the erase state E and the first program state P1.

Figure 58:
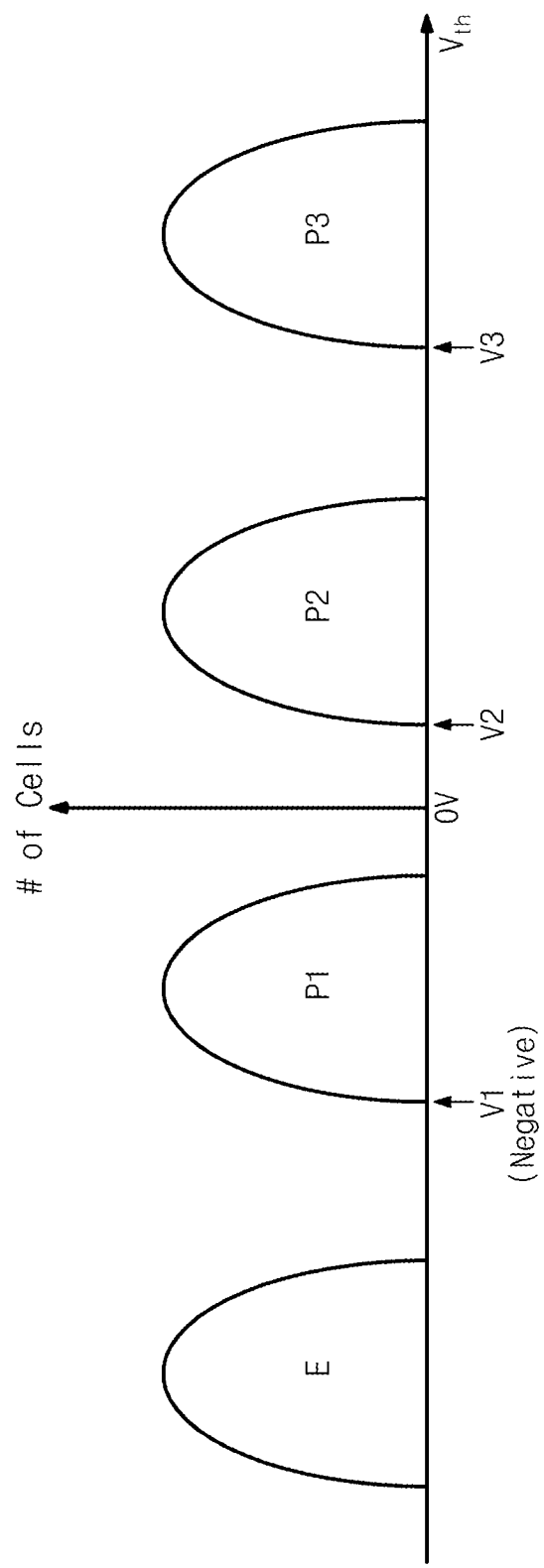

FIG. 58 is a diagram showing a threshold voltage distribution of a nonvolatile memory device according to still another exemplary embodiment of the inventive concept. Referring to FIG. 58, an erase state E and a first program state P1 are included in a negative voltage region, and second and third program states P2 and P3 are included in a positive voltage region. That is, distributions of the erase state E and the first program state P1 are formed to be symmetrical (relative to 0V) to those of the second and third program states P2 and P3.

Figure 59:
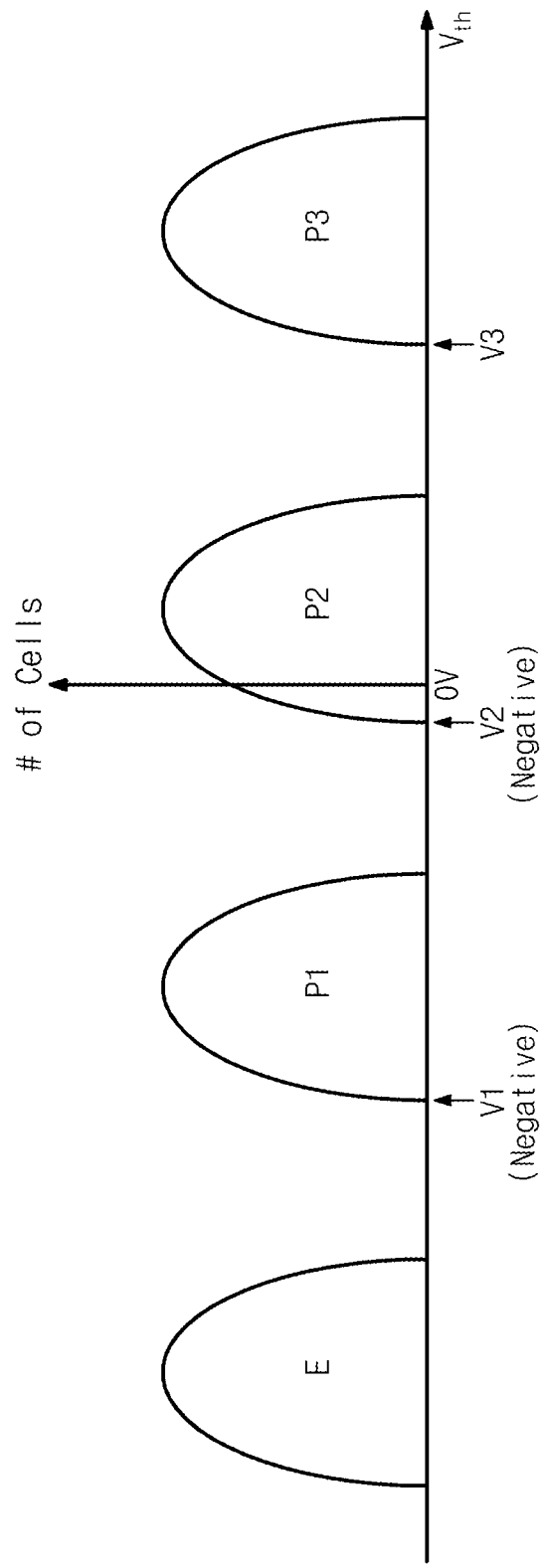

FIG. 59 is a diagram showing a threshold voltage distribution of a nonvolatile memory device according to still another exemplary embodiment of the inventive concept. Referring to FIG. 59, a part of a second program state P2 is included in a negative voltage region.

The inventive concept is applicable to a 3-bit multi-level cell nonvolatile memory device.

Figure 60:
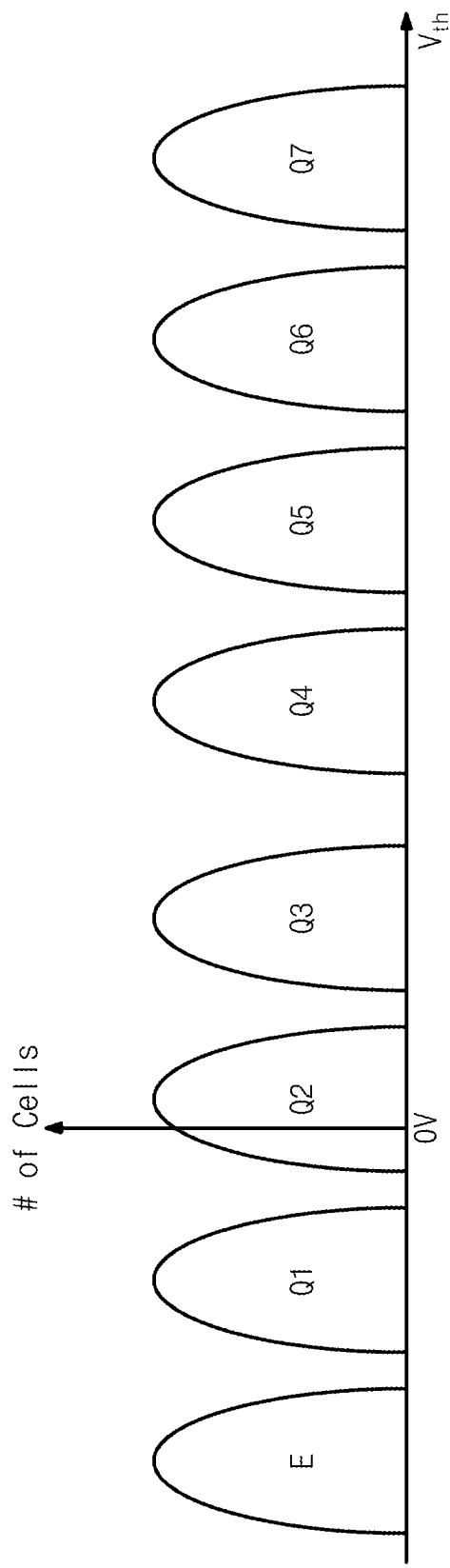

FIG. 60 is a diagram showing a threshold voltage distribution of a 3-bit multi-level cell nonvolatile memory device according to the first embodiment of the inventive concept. Referring to FIG. 60, a threshold voltage distribution includes an erase state E and seven program states Q1 to Q7, and a part of the second program state Q2 is included in a negative voltage region.

Figure 61:
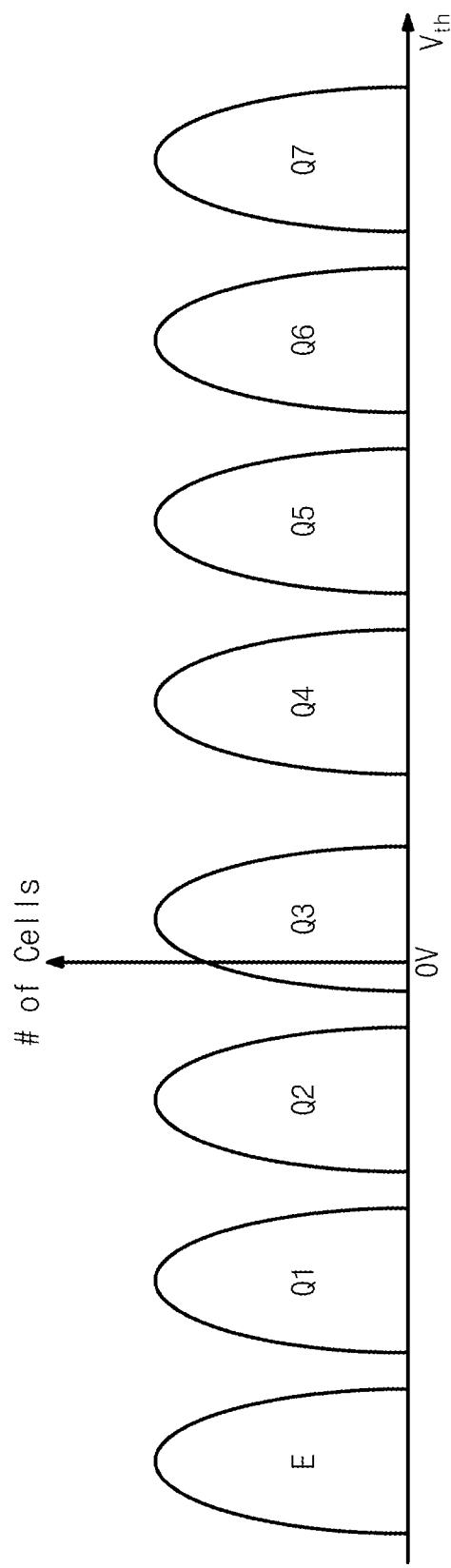

FIG. 61 is a diagram showing a threshold voltage distribution of a 3-bit multi-level cell nonvolatile memory device according to the second embodiment of the inventive concept. Referring to FIG. 61, a part of a third program state Q3 is included in a negative voltage region.

Figure 62:
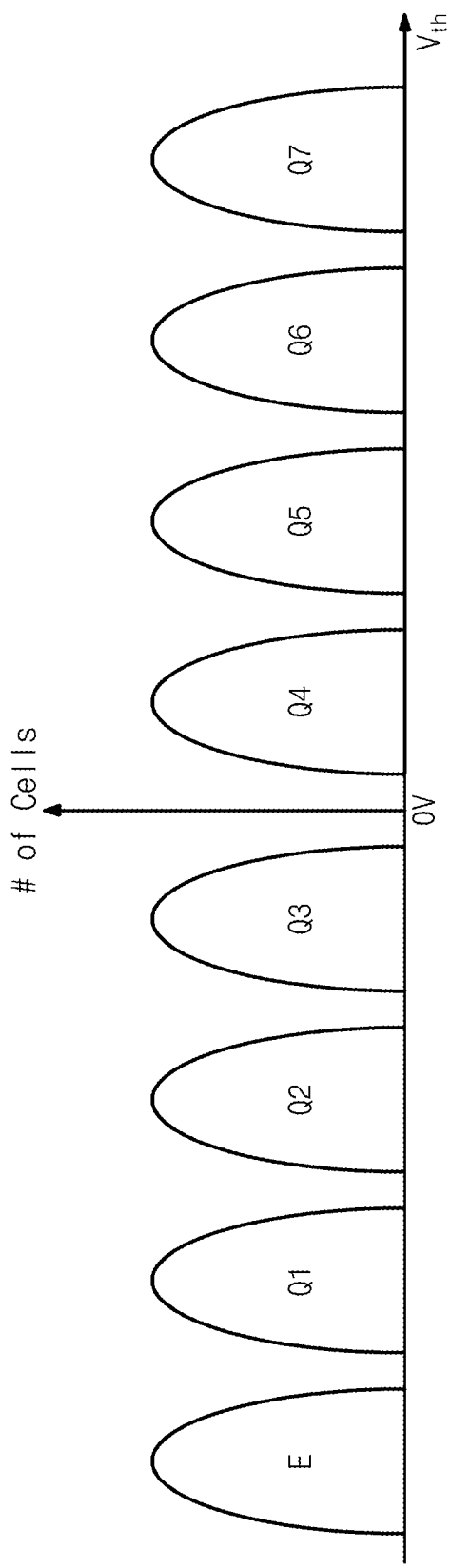

FIG. 62 is a diagram showing a threshold voltage distribution of a 3-bit multi-level cell nonvolatile memory device according to the third embodiment of the inventive concept. Referring to FIG. 62, an erase state E and a first to a third program state Q1 to Q3 are included in a negative voltage region, and a fourth to a seventh program state Q4 to Q7 are included in a positive voltage region.

The inventive concept is also applicable to a 4-bit multi-level cell nonvolatile memory device.

Figure 63:
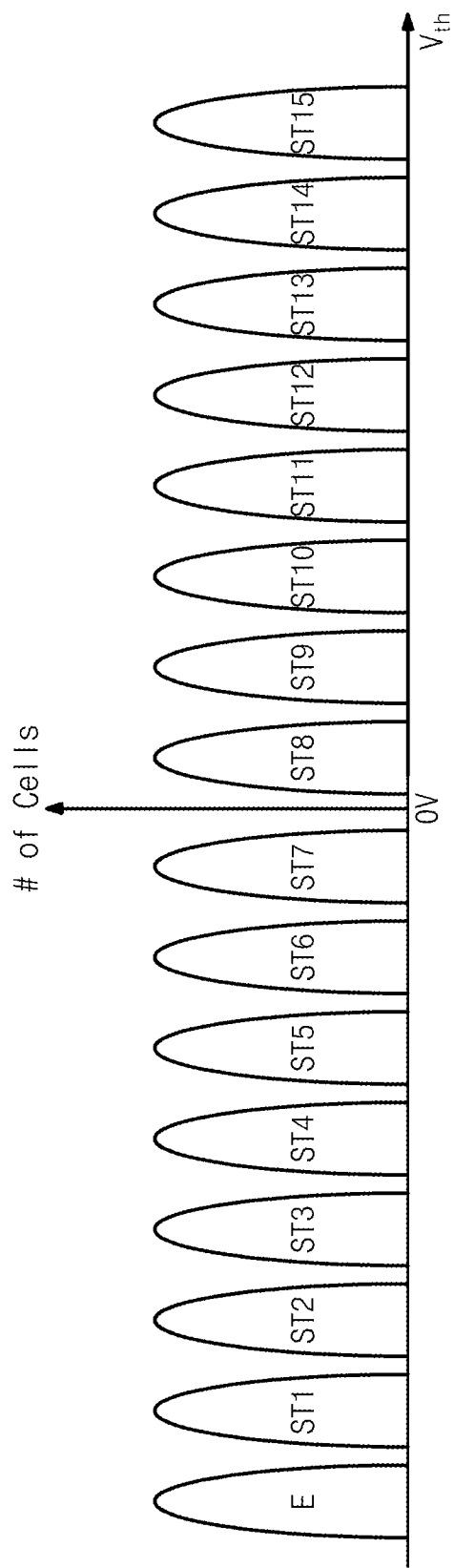

FIG. 63 is a diagram showing a threshold voltage distribution of a 3-bit multi-level cell nonvolatile memory device according to an exemplary embodiment of the inventive concept. Referring to FIG. 63, an erase state E and a first to a seventh program state ST1 to ST7 are included in a negative voltage region, and an eighth to a fifteenth program state ST8 to ST15 are included in a positive voltage region.

Figure 64:
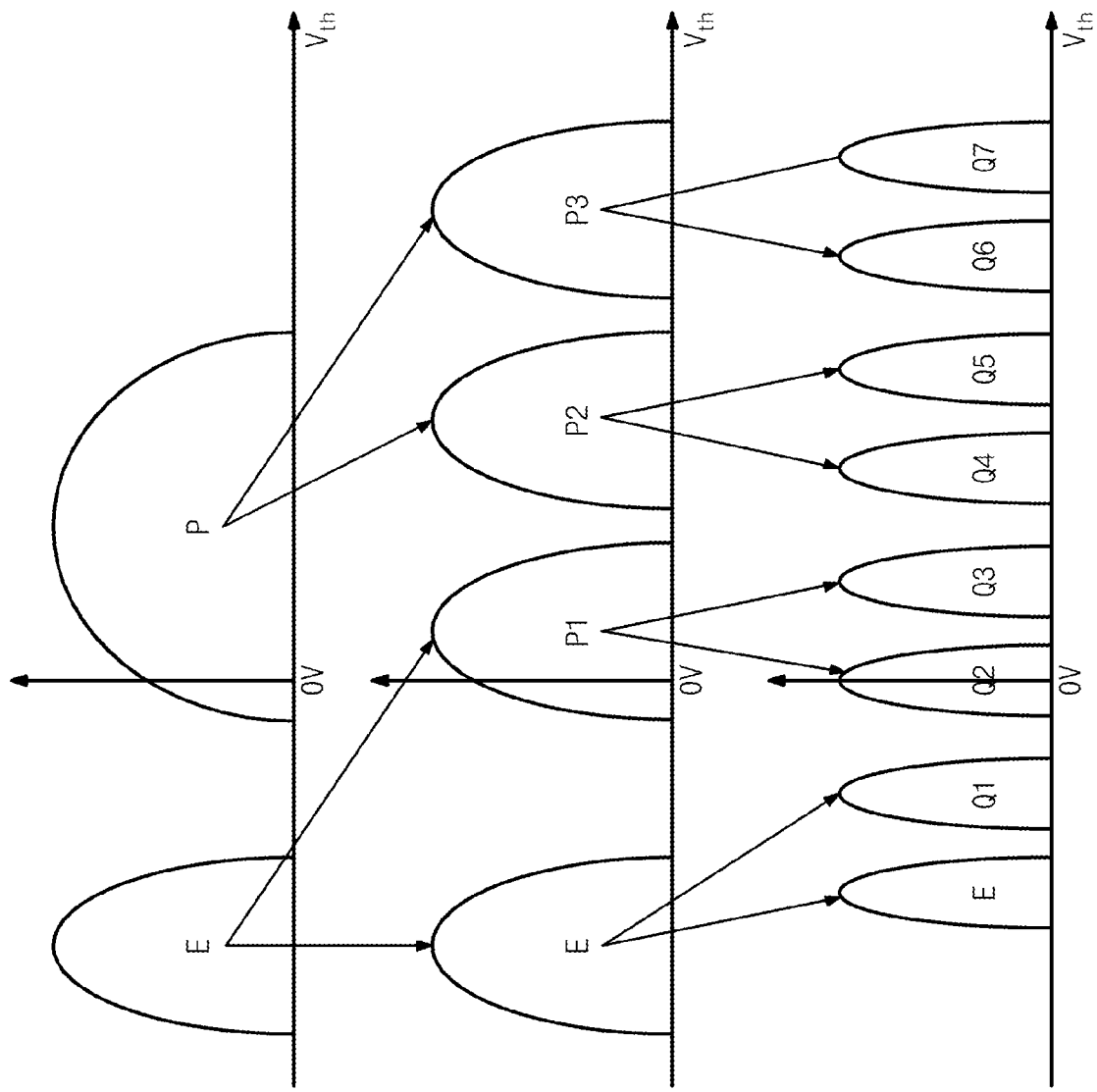

FIG. 64 is a diagram showing a program operation according to a threshold voltage distribution illustrated in FIG. 60. In the event that 3-bit data is stored in one memory cell, a lower bit, an intermediate bit, and an upper bit are defined as first page data, second page data, and third page data, respectively. Referring to FIG. 64, at a first page data program operation, a part of a program state P1 is included in a negative voltage region.

At a second page MSB program operation, an erase state E of the first page data program operation is programmed to an erase state E or a first program state P1, and a program state P thereof is programmed to a second program state P2 or a third program state P3.

At a third page data program operation, an erase state E of the second page data program operation is programmed to an erase state E or a first program state Q1, a first program state P1 thereof is programmed to a program state Q2 or a program state Q3, a second program state P2 thereof is programmed to a program state Q4 or a program state Q5, and a third program state P3 thereof is programmed to a program state Q6 or a program state Q7.

Various Applications

The inventive concept is applicable to a vertical-type nonvolatile memory device.

Figure 65:
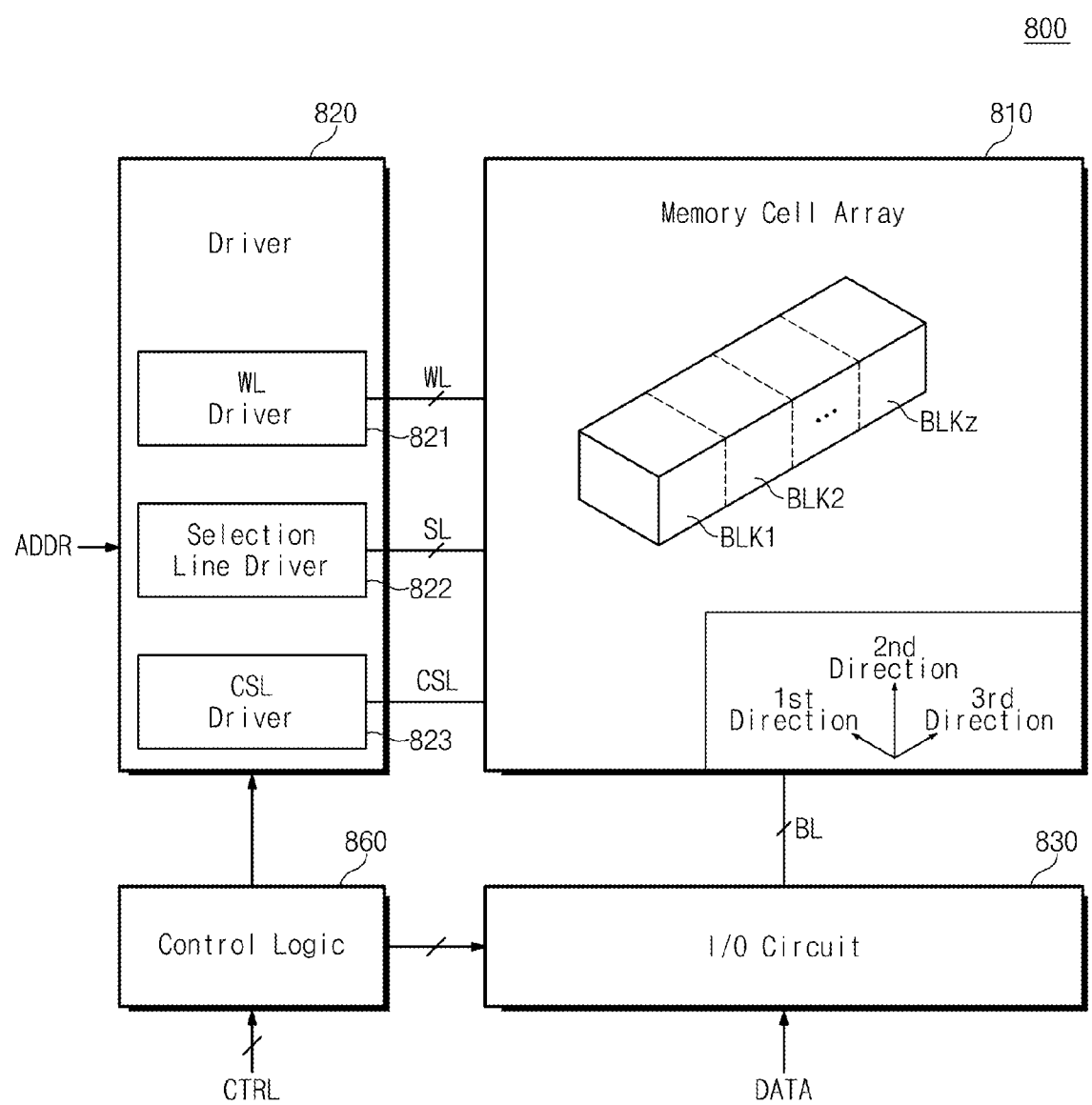
FIGS. 65 to 74 are diagrams showing devices applied to the inventive concept.

FIG. 65 is a diagram showing a vertical-type nonvolatile memory device according to an exemplary embodiment of the inventive concept. Referring to FIG. 65, a nonvolatile memory device 800 includes a memory cell array 810, a driver 820, an input/output circuit 830, and control logic 840.

The memory cell array 810 includes a plurality of memory blocks BLK1 to BLKh, each of which includes a plurality of memory cells. Each of the memory blocks BLK1 to BLKh has a vertical structure (or, a three-dimensional structure).

In this embodiment, each of the memory blocks BLK1 to BLKh includes structures extending along first to third directions. In this embodiment, further, each of the memory blocks BLK1 to BLKh includes a plurality of vertical strings NS extending along the second direction. In this embodiment, further, each of the memory blocks BLK1 to BLKh includes a plurality of vertical strings NS extending along the first and third directions.

Each of the vertical strings NS is connected to one bit line BL, at least one string selection line SSL, at least one ground selection line GSL, word lines WL, and a common source line CSL. That is, each of the memory blocks BLK1 to BLKh is connected to a plurality of bit lines BL, a plurality of string selection lines SSL, a plurality of ground selection lines GSL, a plurality of word lines WL, and a plurality of common source lines CSL.

The driver 820 is connected to the memory cell array 210 via a plurality of word lines WL. The driver 820 is configured to operate responsive to the control of the control logic 840. The driver 820 receives an address ADDR from an external device.

The driver 820 is configured to decode the input address ADDR. Using the decoded address, the driver 820 selects one of the plurality of word lines WL. The driver 820 is configured to apply voltages to selected and unselected word lines. In this embodiment, during a program operation, a read operation or an erase operation, the driver 820 supplies word lines WL with a program voltage related to the program operation, a read voltage related to the read operation, or an erase voltage related to the erase operation. In this embodiment, the driver 820 includes a word line driver 321 of selecting and operating word lines.

Further, the driver 820 is configured to select and operate a plurality of selection lines SL. In this embodiment, the driver 820 is configured to further select and operate a string selection line SSL and a ground selection line GSL. In this embodiment, the driver 820 includes a selection line driver 322 configured to operate selection lines.

Further, the driver 820 is configured to operate a common source line CSL. In this embodiment, the driver 820 includes a common source line driver 823 configured to operate a common source line CSL.

The input/output circuit 830 is connected to the memory cell array 810 via a plurality of bit lines BL. The input/output circuit 830 operates in response to the control of the control logic 840. The input/output circuit 830 is configured to select a plurality of bit lines BL.

In this embodiment, the input/output circuit 830 receives data from an external device to store it in the memory cell array 810. The input/output circuit 830 reads data from the memory cell array 810 to transfer it to the external device.

The input/output circuit 830, further, reads data from a first storage region of the memory cell array to store it in a second storage region thereof. In this embodiment, the input/output circuit 830 is configured to perform a copy-back operation.

In this embodiment, the input/output circuit 830 includes constituent elements such as a page buffer (or, a page register), a column selector circuit, a data buffer, and the like. In another embodiment, the input/output circuit 830 includes constituent elements such as a sense amplifier, a write driver, a column selector circuit, a data buffer, and the like.

The control logic 840 is configured to control an overall operation of the nonvolatile memory device 800. The control logic 840 operates responsive to control signals CTRL transferred from the external device.

Vertical-type semiconductor memory device are disclosed in U.S. Patent Publication Nos. 2009-0306583, 2010-0078701, 2010-0117141, 2010-0140685, 2010-02135527, 2010-0224929, 2010-0315875, 2010-0322000, 2011-0013458, and 2011-0018036, the entirety of which is incorporated by reference herein.

Figure 66:
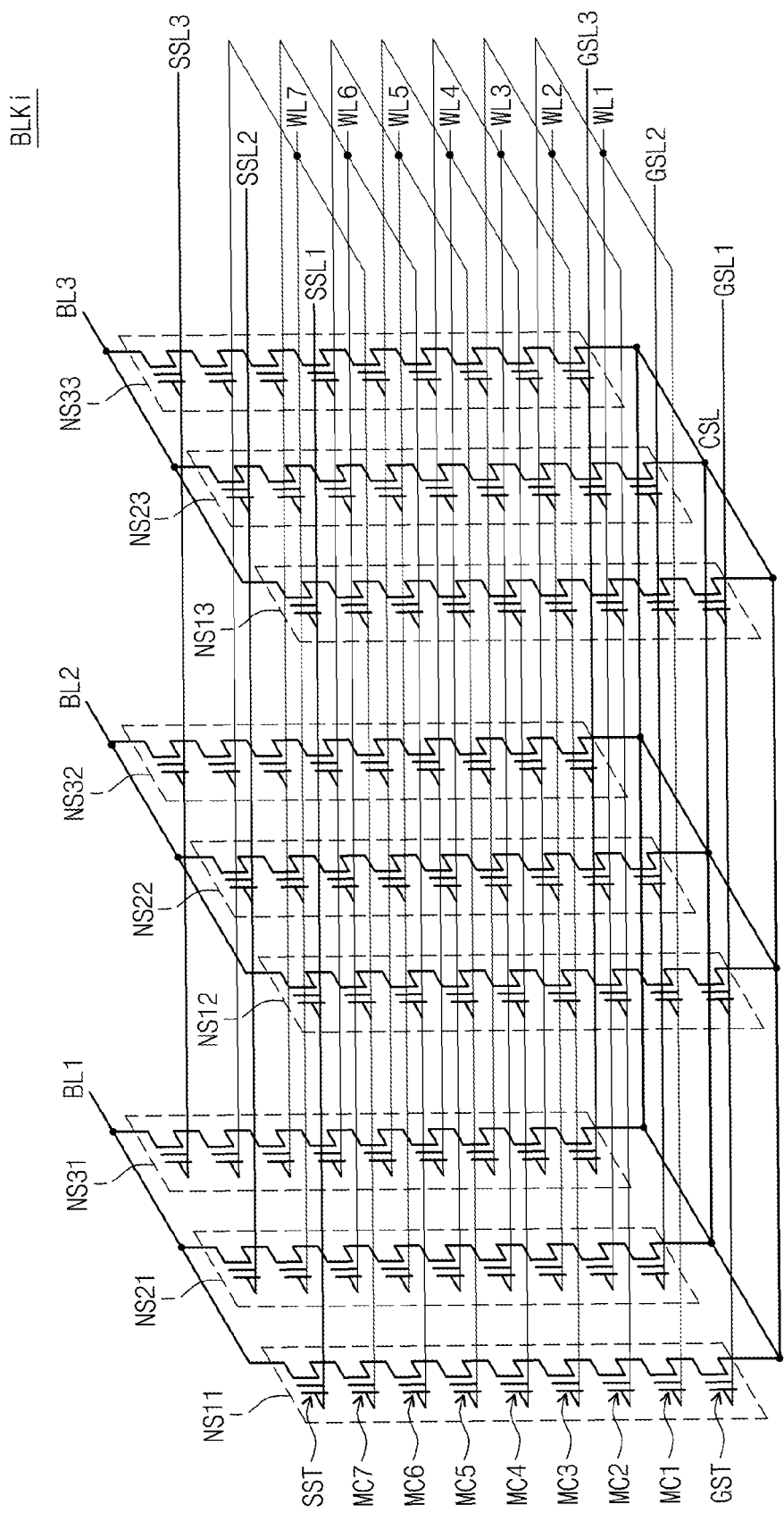

FIG. 66 is a circuit diagram showing an equivalent circuit of one memory block of memory blocks illustrated in FIG. 65. Referring to FIGS. 65 and 66, vertical strings NS11 to NS31 exist between a first bit line BL1 and a common source line CSL. The first bit line BL1 corresponds to a conductive material extending in a third direction. Vertical strings NS12 to NS32 exist between a second bit line BL2 and the common source line CSL. The second bit line BL2 corresponds to a conductive material extending in the third direction. Vertical strings NS13 to NS33 exist between a third bit line BL3 and the common source line CSL. The third bit line BL3 corresponds to a conductive material extending in the third direction.

A string selection transistor SST in each vertical string NS is connected to a corresponding bit line. A ground selection transistor GST in each vertical string NS is connected to a common source line CSL. Memory cells MC exist between the string selection transistor SST and the ground selection transistor GST in each vertical string NS.

Below, vertical strings NS are defined by a row unit and a column unit. Vertical strings NS connected in common to one bit line form a column. In this embodiment, vertical strings NS11 to NS31 connected in common to a first bit line BL1 corresponds to a first column. Vertical strings NS21 to NS23 connected in common to a second bit line BL2 corresponds to a second column. Vertical strings NS13 to NS33 connected in common to a third bit line BL3 corresponds to a third column.

Vertical strings NS connected with one string selection line SSL form one row. In this embodiment, vertical strings NS11 to NS13 connected with a first string selection line SSL1 form a first row. Vertical strings NS21 to NS23 connected with a second string selection line SSL2 form a second row. Vertical strings NS31 to NS33 connected with a third string selection line SSL3 form a third row.

In each vertical string NS, a height is defined. In this embodiment, in each vertical string, a height of a memory cell adjacent to a ground selection transistor GST is 1. In each vertical string NS, a height of a memory cell increases in inverse proportion to a distance from a string selection transistor SST. In each vertical string, a height of a memory cell adjacent to the string selection transistor SST is 7.

Vertical strings NS in the same row share a string selection line SSL. Vertical strings NS in different rows are connected with different string selection lines SSL. In vertical strings of the same row, memory cells of the same height share a word line. At the same height, word lines WL of vertical strings NS of different rows are connected in common. In this embodiment, word lines WL may be connected in common at a layer where conductive materials extending in a first direction are provided. In this embodiment, the conductive materials extending in the first direction may be connected with an upper layer via a contact. Conductive materials extending in the first direction at the upper layer may be connected in common.

Vertical strings NS in the same row share a ground selection line GSL. Vertical strings NS of different rows are connected with different ground selection lines GSL.

A common source line CSL is connected in common with vertical strings NS. In this embodiment, at an active region of a substrate, first to fourth doping regions are connected. In this embodiment, the first to fourth doping regions are connected with an upper layer via a contact. The first to fourth doping regions are connected in common at the upper layer.

As illustrated in FIG. 66, word lines WL of the same depth are connected in common. Accordingly, when a specific word line WL is selected, all vertical strings NS connected with the specific word line WL are selected. Vertical strings NS of different rows are connected with different string selection lines SSL. Accordingly, by selecting string selection lines SSL1 to SSL3, vertical strings of an unselected row among vertical strings NS connected with the same word line WL are separated from bit lines BL1 to BL3. That is, a row of vertical strings NS is selected by selecting string selection lines SSL1 to SSL3. Vertical strings NS of a selected row are selected by a column unit by selecting the bit lines BL1 to BL3.

A memory block BLKi is disclosed in detail in U.S. Patent Publication No. 2010/0315875, the entirety of which is incorporated by reference herein.

Figure 67:
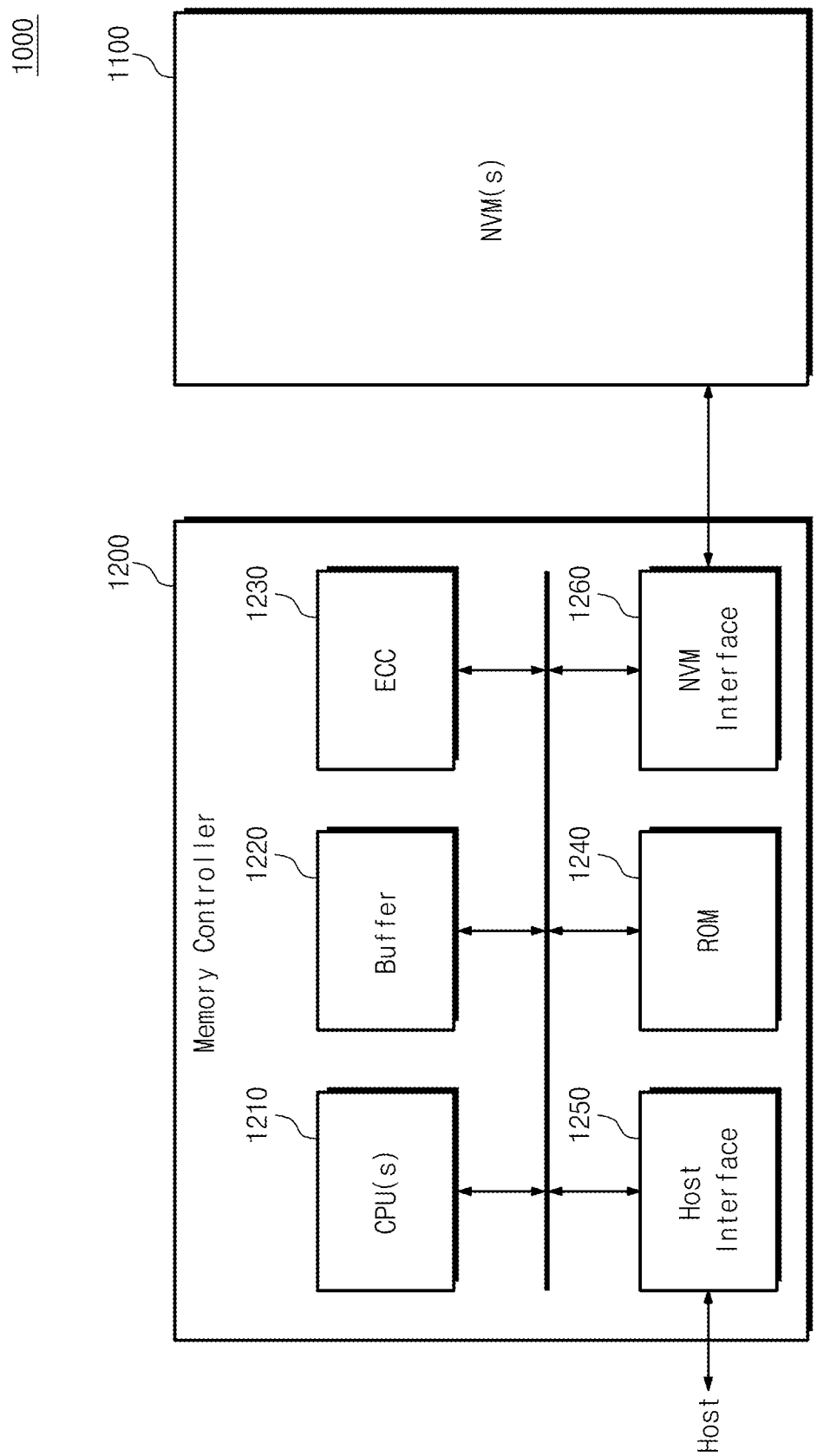

FIG. 67 is a diagram illustrating a memory system according to an exemplary embodiment of the inventive concept.

Referring to FIG. 67, a memory system 1000 includes at least one nonvolatile memory device 1100 and a memory controller 1200.

The nonvolatile memory device 1100 may be identical to one of a nonvolatile memory device 100 in FIG. 2, a nonvolatile memory device 400 in FIG. 36, a nonvolatile memory device 500 in FIG. 45, a nonvolatile memory device 600 in FIG. 54, a nonvolatile memory device 700 in FIG. 55, and a nonvolatile memory device 800 in FIG. 65. Although not illustrated, the nonvolatile memory device 1100 may be supplied with a high voltage higher than a power supply voltage from an external device.

The memory controller 1200 controls the nonvolatile memory device 1100 according to a request of an external device (e.g., a host). In this embodiment, the memory controller 1200 controls read/write/erase operations of the nonvolatile memory device 1100.

The memory controller 1200 provides an interface between the nonvolatile memory device 1100 and the host. The memory controller 1200 drives firmware for controlling the nonvolatile memory device 1100. The memory controller 1200 includes at least one Central Processing Unit (CPU) 1210, a buffer 1220, an Error Correction Circuit (ECC) 1230, a Read-Only Memory (ROM) 1240, a host interface 1250, and a memory interface 1260.

The CPU 1210 controls an overall operation of the memory controller 1200. The buffer 1220 is used as a working memory of the CPU 1210. Upon write request of the host, data received from the host is temporarily stored in the buffer 1220. Also, upon read request of the host, data read from the nonvolatile memory device 1100 is temporarily stored in the buffer 1220.

Upon the write request, the ECC 1230 uses an error correction code to decode data stored in the buffer 1220. In this case, the decoded data and the error correction code value are stored in the nonvolatile memory device 1100. Upon the read request, the ECC 1230 uses an error correction code value to restore data read from the nonvolatile memory device 1100. In this case, the error correction code value is included in the read data. The ROM 1240 stores data used to drive the memory controller 1200.

The host interface 1250 includes a protocol for data exchange between the host and the memory controller 1200. For example, the memory controller 1200 is configured to communicate with an external device (host) via one of various interface protocols such as Perfect Page New (PPN) protocols, Universal Serial Bus (USB) protocols, Multimedia Card (MMC) protocols, Peripheral Component Interconnection (PCI) protocols, PCI-Express (PCI-E) protocols, Advanced Technology Attachment (ATA) protocols, serial-ATA protocols, parallel-ATA protocols, Small Computer Small Interface (SCSI) protocols, Enhanced Small Disk Interface (ESDI) protocols, and Integrated Drive Electronics (IDE) protocols.

The memory interface 1260 interfaces between the nonvolatile memory device 1100 and the memory controller 1200.

The memory system 1000 according to an exemplary embodiment of the inventive concept includes a nonvolatile memory device 1100 which is configured such that a part of program states uses a negative voltage domain during a program operation. Accordingly, it is possible to improve the data reliability and lifetime.

Although not illustrated, the memory system according to an exemplary embodiment of the inventive concept further comprises a randomization circuit which randomizes data input from a host to store it in the nonvolatile memory device 1100 or de-randomizes randomized data stored in the nonvolatile memory device 1100 to output it to the host. The randomization circuit can be included in the nonvolatile memory device 1100 or the memory controller 1200. Further and detailed description of a randomization circuit is disclosed in U.S. Pat. No. 7,212,426 and U.S. Patent Publication Nos. 2009-0259803, 2010-0229001, 2010-0229007, and 2010-0259983, the entirety of which is incorporated by reference herein.

A memory system is disclosed in U.S. Patent Publication No. 2010-0082890, the entirety of which is incorporated by reference herein.

Figure 68:
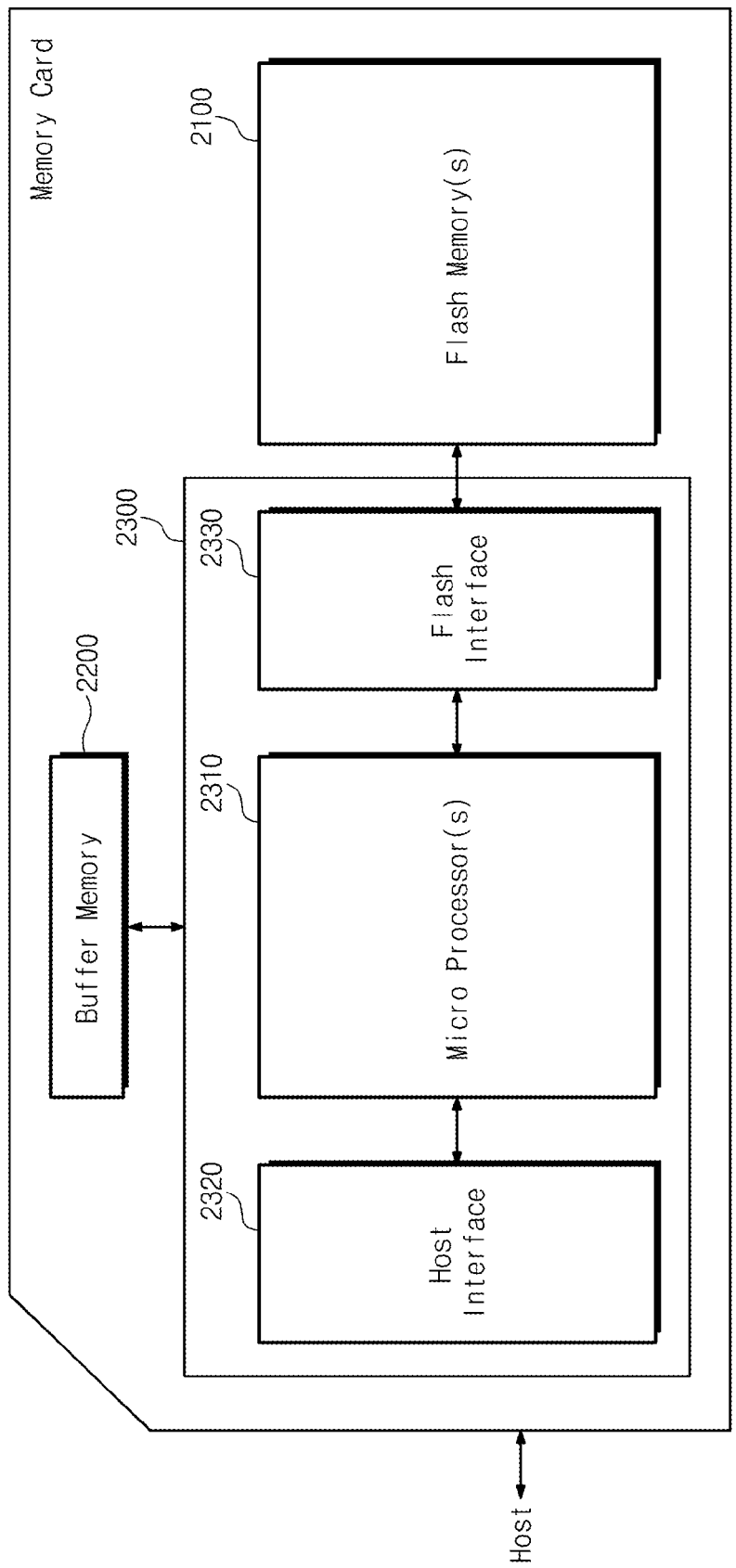

FIG. 68 is a block diagram of a memory card according to an exemplary embodiment of the inventive concept. Referring to FIG. 68, a memory card 2000 includes at least one flash memory 2100, a buffer memory 2200, and a memory controller 2300 for controlling the flash memory 2100 and the buffer memory 2200.

The flash memory device 2100 may be identical to one of a nonvolatile memory device 100 in FIG. 2, a nonvolatile memory device 400 in FIG. 36, a nonvolatile memory device 500 in FIG. 45, a nonvolatile memory device 600 in FIG. 54, a nonvolatile memory device 700 in FIG. 55, and a nonvolatile memory device 800 in FIG. 65.

The buffer memory device 2200 is used to temporarily store data generated during the operation of the memory card 2000. The buffer memory device 2200 may be implemented using a DRAM or an SRAM.

The memory controller 2300 is connected between a host and the flash memory 2100. The memory controller 2300 is configured to access the flash memory 2100 in response to a request from the host.

The memory controller 2300 includes at least one microprocessor 2310, a host interface 2320, and a flash interface 2330.

The microprocessor 2310 is configured to drive firmware. The host interface 2320 interfaces with the host via a card (e.g., MMC) protocol for data exchanges between the host and the memory interface 2330.

The memory card 2000 may be applicable to Multimedia Cards (MMCs), Security Digitals (SDs), miniSDs, memory sticks, smartmedia, and transflash cards.

A memory card 2000 according to an exemplary embodiment of the inventive concept increases a threshold voltage margin as at least one program state is included within a negative voltage region. Accordingly, the memory card 2000 according to an exemplary embodiment of the inventive concept has an excellent deterioration characteristic and improves the reliability of data.

A memory card is disclosed in U.S. Patent Publication No. 2010-0306583, the entirety of which is incorporated by reference herein.

Figure 69:
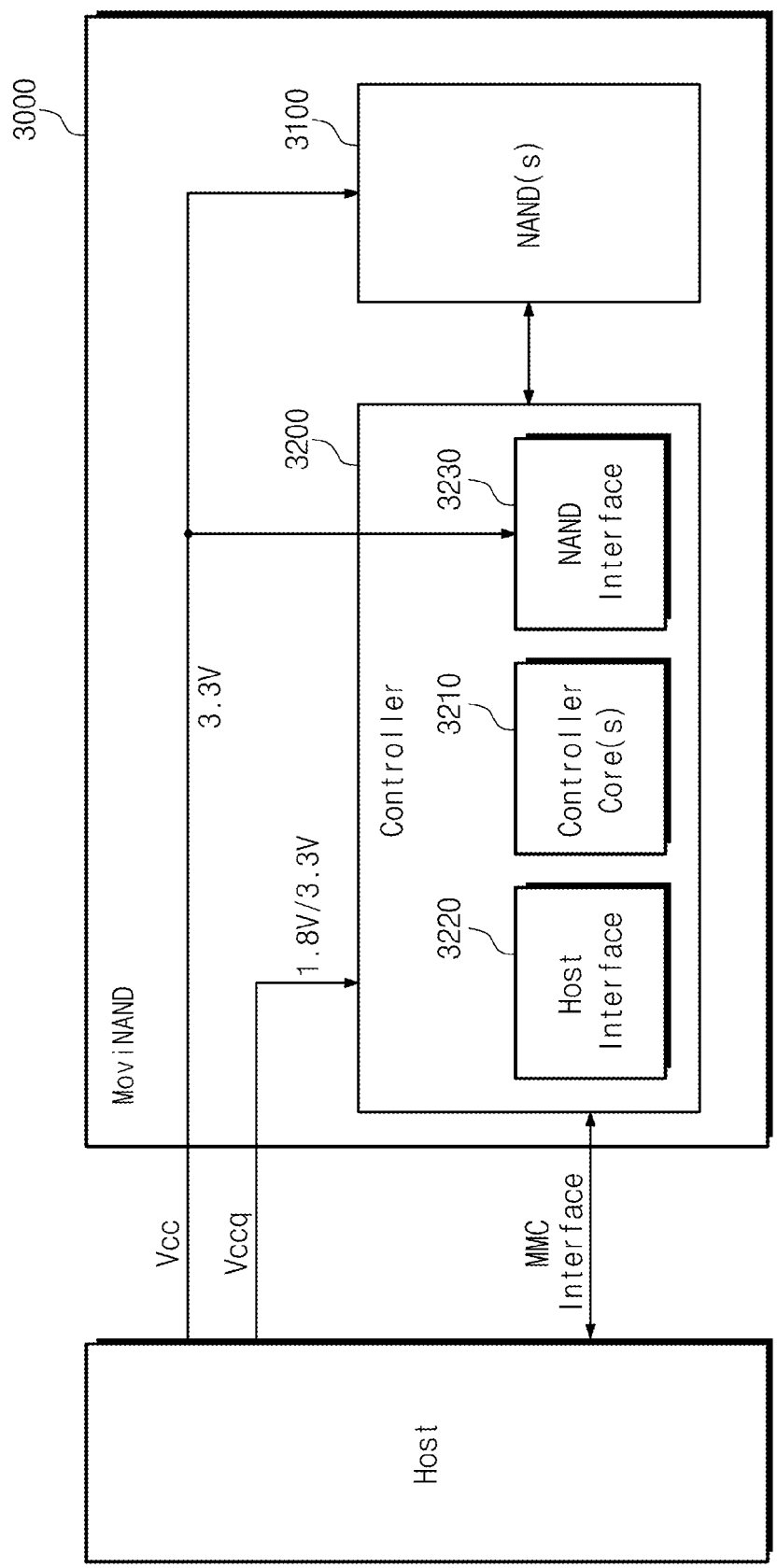

FIG. 69 is a block diagram of a moviNAND according to an exemplary embodiment of the inventive concept. Referring to FIG. 69, a moviNAND device 3000 includes at least one NAND flash memory device 3100 and a controller 3200. The moviNAND device 3000 supports MMC 4.4 (or, referred to as eMMC).

The NAND flash memory device 3100 may be identical to one of a nonvolatile memory device 100 in FIG. 2, a nonvolatile memory device 400 in FIG. 36, a nonvolatile memory device 500 in FIG. 45, a nonvolatile memory device 600 in FIG. 54, a nonvolatile memory device 700 in FIG. 55, and a nonvolatile memory device 800 in FIG. 65.

The controller 3200 includes at least one controller core 3210, a host interface 3220, and a NAND interface 3230. The controller core 3210 may control overall operations of the moviNAND device 3000. The host interface 3220 is configured to perform an MMC interface between the controller 3210 and a host. The NAND interface 3230 is configured to interface between the NAND flash memory device 3100 and the controller 3200.

The moviNAND device 3000 receives power supply voltages Vcc and Vccq from the host. Herein, the power supply voltage Vcc (about 3.3V) is supplied to the NAND flash memory device 3100 and the NAND interface 3230, while the power supply voltage Vccq (about 1.8V/3.3V) is supplied to the controller 3200.

The moviNAND 3000 according to an exemplary embodiment of the inventive concept increases the number of data bits capable of being stored by a limited technique by storing at least two data bits at a negative voltage region. This means that the moviNAND 300 according to an exemplary embodiment of the inventive concept is advantageous to store mass data. The moviNAND 3000 according to an exemplary embodiment of the inventive concept is applicable to small and low-power mobile products (e.g., a Galaxy S, iPhone, etc).

Meanwhile, the inventive concept may be applicable to a solid state drive (SSD).

Figure 70:
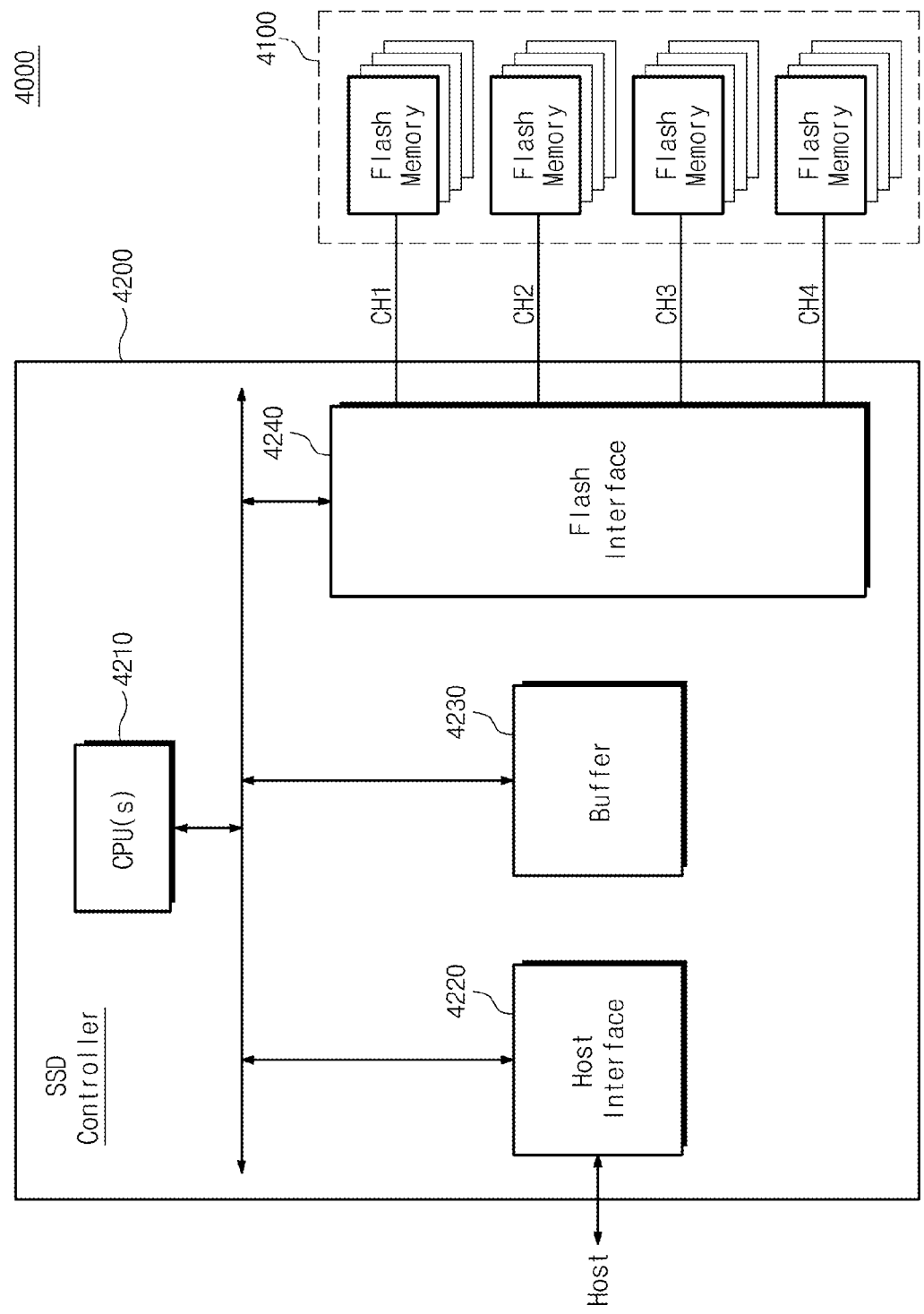

FIG. 70 is a block diagram of an SSD according to an exemplary embodiment of the inventive concept. Referring to FIG. 70, an SSD 4000 includes a plurality of flash memory devices 4100 and an SSD controller 4200.

The flash memory device 4100 may be identical to one of a nonvolatile memory device 100 in FIG. 2, a nonvolatile memory device 400 in FIG. 36, a nonvolatile memory device 500 in FIG. 45, a nonvolatile memory device 600 in FIG. 54, a nonvolatile memory device 700 in FIG. 55, and a nonvolatile memory device 800 in FIG. 65.

The SSD controller 4200 controls the plurality of flash memory devices 4100. The SSD controller 4200 includes a CPU 4210, a host interface 4220, a buffer 4230, and a flash interface 4240.

Under the control of the CPU 4210, the host interface 4220 may exchange data with a host through ATA protocol. The host interface 4220 may be one of a Serial Advanced Technology Attachment (SATA) interface, a Parallel Advanced Technology Attachment (PATA) interface, and an External SATA (ESATA) interface. Data to be received or transmitted from or to the host through the host interface 4220 is delivered through the cache buffer 4230 without passing through a CPU bus, under the control of the CPU 4210.

The buffer 4230 temporarily stores data transferred between an external device and the flash memory devices 4100. The buffer 4230 is also used to store programs to be executed by the CPU 4210. The buffer 4230 is regarded as a kind of buffer memory, and is implemented using an SRAM. The buffer 4230 in FIG. 70 is included within the SSD controller 4200. However, the inventive concept is not limited thereto. The cache buffer according to an exemplary embodiment of the inventive concept can be provided at an outside of the SSD controller 4200.

The flash interface 4240 is configured to interface between the SSD controller 4200 and the flash memory devices 4100 that are used as storage devices. The flash interface 4240 is configured to support NAND flash memories, One-NAND flash memories, multi-level flash memories, or single-level flash memories.

The SSD 4000 according to an exemplary embodiment of the inventive concept improves a threshold voltage margin by storing a program state at a negative voltage region. Accordingly, the SSD 4000 according to an exemplary embodiment of the inventive concept improves the reliability of stored data.

An SSD is disclosed in U.S. Patent Publication No. 2010-0082890, the entirety of which is incorporated by reference herein.

Figure 71:
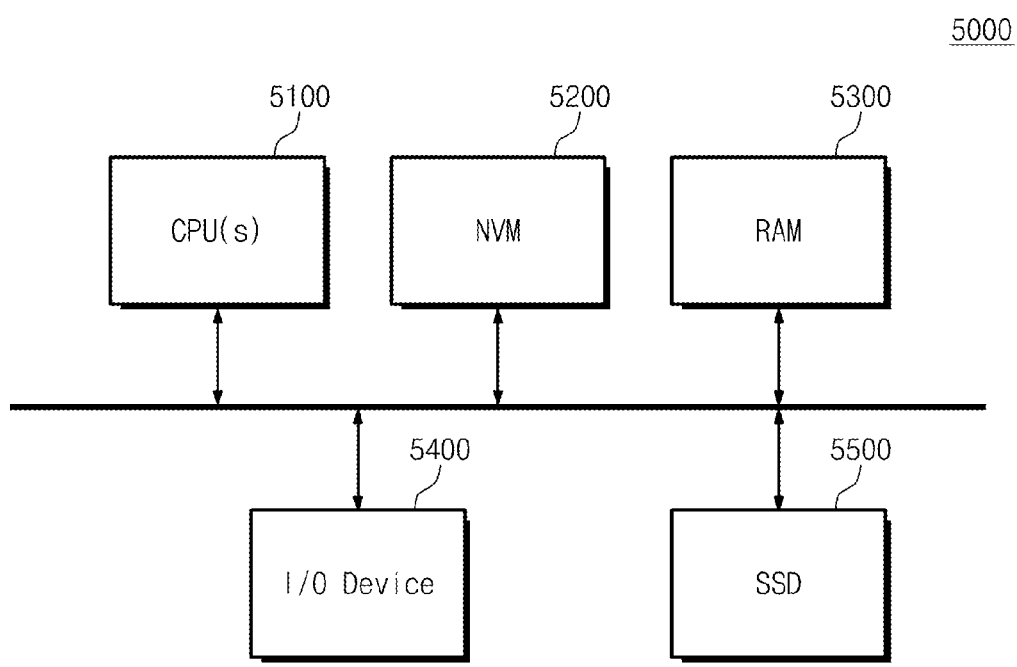

FIG. 71 is a block diagram of a computing system in FIG. 70 according to an exemplary embodiment of the inventive concept. Referring to FIG. 71, a computing system 5000 includes at least one CPU 5100, a ROM 5200, a RAM 5300, an input/output (I/O) device 5400, and an SSD 5500.

The CPU 5100 is connected to a system bus. The ROM 5200 stores data used to drive the computing system 5000. Herein, the data may include a start command sequence or a basic I/O system (BIOS) sequence. The RAM 5300 temporarily stores data generated during the execution of the CPU 5100.

The I/O device 5400 is connected to the system bus through an I/O device interface such as keyboards, pointing devices (e.g., mouse), monitors, modems, and the like.

The SSD 5500 may be a readable storage device and may be implemented in the same manner as the SSD 4000 of FIG. 70.

Figure 72:
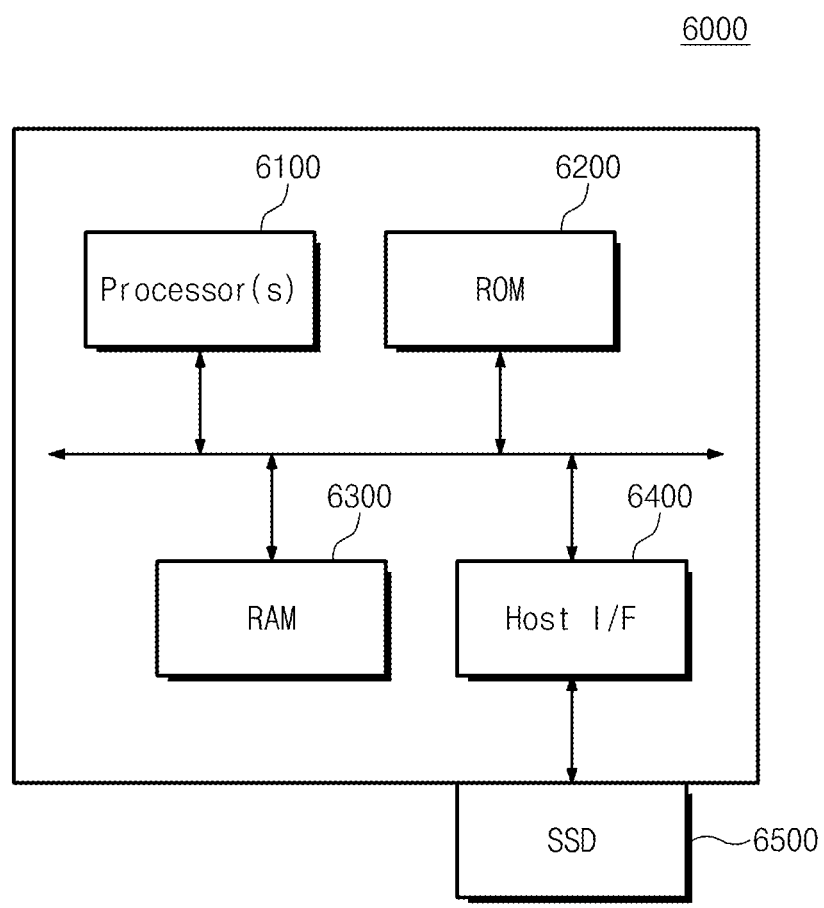

FIG. 72 is a block diagram of an electronic device according to an exemplary embodiment of the inventive concept. Referring to FIG. 72, an electronic device 6000 includes at least one processor 6100, a ROM 6200, a RAM 6300, a flash interface 6400, and an SSD 6500.

The processor 6100 accesses the RAM 6300 to execute firmware codes or other codes. Also, the processor 6100 accesses the ROM 6200 to execute fixed command sequences such as a start command sequence and a basic I/O system (BIOS) sequence. The flash interface 6400 is configured to interface between the electronic device 6000 and the SSD 6500.

The SSD 6500 is detachable from the electronic device 6000. The SSD 6500 is implemented in the same manner as the SSD 4000 of FIG. 70.

The electronic device 6000 may include cellular phones, personal digital assistants (PDAs), digital cameras, camcorders, portable audio players (e.g., MP3), and portable media players (PMPs).

Figure 73:
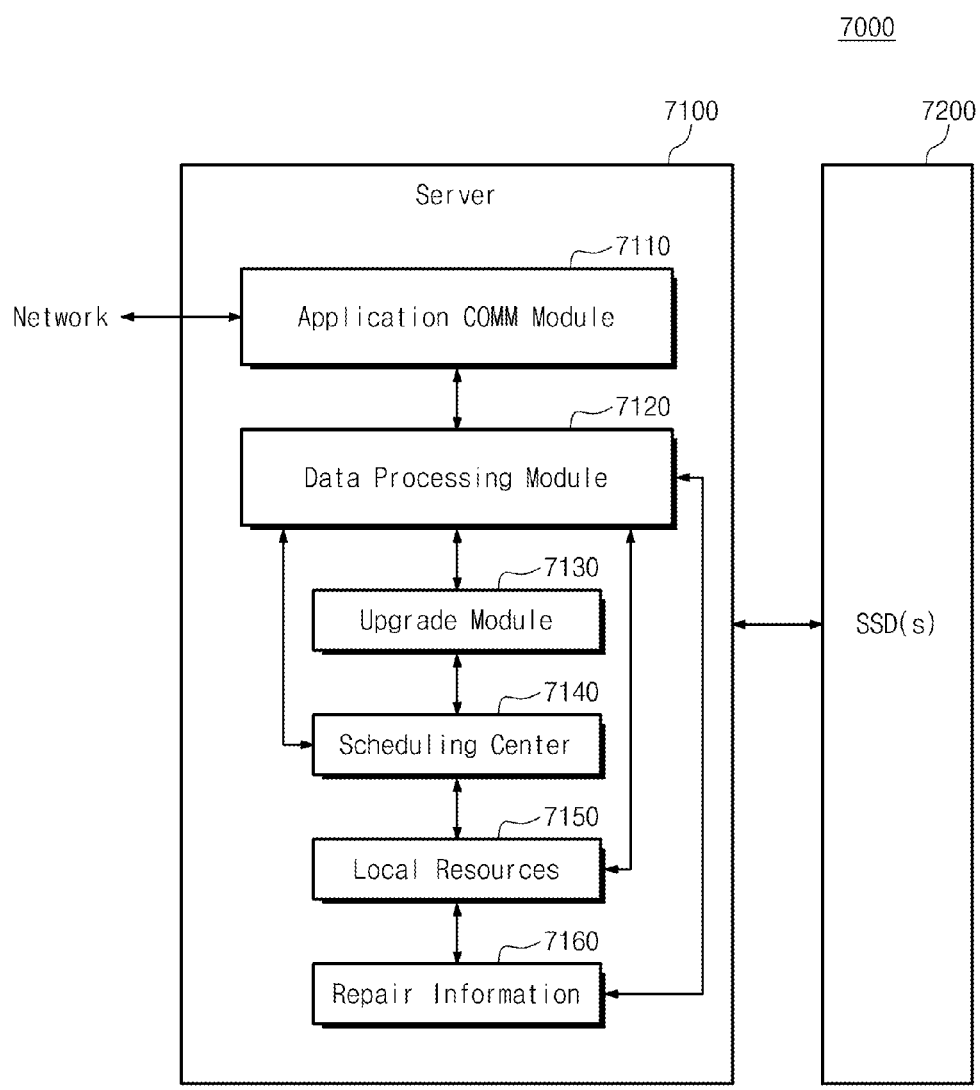

FIG. 73 is a block diagram of a server system including an SSD in FIG. 70 according to an exemplary embodiment of the inventive concept. Referring to FIG. 64, a server system 7000 includes a server 7100 and at least one SSD 7200 that stores data used to drive the server 7100. The SSD 7200 may be configured the same as an SSD 4000 of FIG. 70.

The server 7100 includes an application communication module 7110, a data processing module 7120, an upgrade module 7130, a scheduling center 7140, a local resource module 7150, and a repair information module 7160.

The application communication module 7110 is configured to communicate with a computing system connected to a network and the server 7100, or to allow the server 7100 to communicate with the SSD 7200. The application communication module 7110 may transmit data or information, provided through a user interface, to the data processing module 7120.

The data processing module 7120 may be linked to the local resource module 7150. Here, the local resource module 7150 may provide a list of repair shops/dealers/technical information to a user on the basis of information or data inputted to the server 7100.

The upgrade module 7130 interfaces with the data processing module 7120. Based on information or data received from the SSD 7200, the upgrade module 7130 may perform upgrades of a firmware, a reset code, a diagnosis system, or other information on electronic appliances.

The scheduling center 7140 provides real-time options to the user based on the information or data inputted to the server 7100.

The repair information module 7160 interfaces with the data processing module 7120. The repair information module 7160 is used to provide repair-related information (e.g., audio, video or document files) to the user. The data processing module 7120 may package information related to the information received from the SSD 7200. The packaged information may be transmitted to the SSD 7200 or may be displayed to the user.

A nonvolatile memory device according to an exemplary embodiment of the inventive concept is applicable to tablet products (e.g., Galaxy Tab, iPad, etc.).

Figure 74:
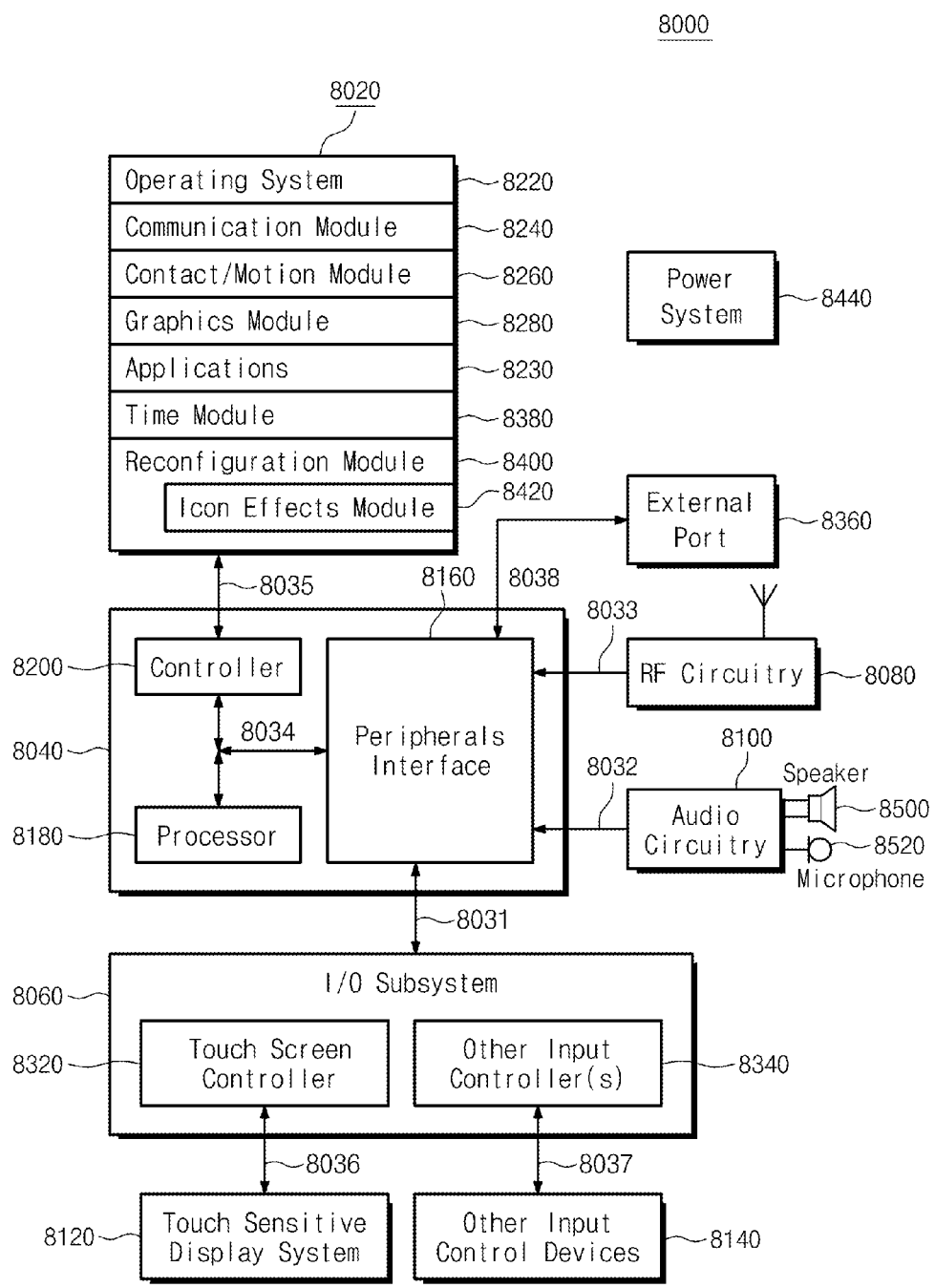

FIG. 74 is a diagram showing a handheld electronic device according to an exemplary embodiment of the inventive concept. Referring to FIG. 74, a handheld electronic device 8000 includes at least one computer-readable media 8020, a processing system 8040, an input/output sub-system 8060, a radio frequency circuit 8080, and an audio circuit 8100. Respective constituent elements can be interconnected by at least one communication bus or a signal line 8030. The handheld electronic device 8000 may be any handheld electronic device including a handheld computer, a tablet computer, a mobile phone, a media player, a PDA, or a combination of at least two elements thereof. Herein, the at least one computer-readable media 8020 includes one of a nonvolatile memory device 100 in FIG. 2, a nonvolatile memory device 400 in FIG. 36, a nonvolatile memory device 500 in FIG. 45, a nonvolatile memory device 600 in FIG. 54, a nonvolatile memory device 700 in FIG. 55, and a nonvolatile memory device 800 in FIG. 65.

Various elements in FIG. 74 includes at least one signal processing and/or application dedicated IC and is implemented by hardware, software, or a combination of the hardware and the software.

The radio frequency circuit 8080 transmits and receives information to and from at least one different device via a wireless link or network, and performs such a function with an antenna system, a radio frequency transmitting and receiving device, at least one amplifier, a tuner, at least one oscillator, a digital signal processor, a codec, a chipset, a memory, and the like. For example, the radio frequency circuit 8080 may include TDMA (time division multiple access), CDMA (code division multiple access), GSM (global system for mobile communication), EDGE (Enhanced Data GSM Environment), WCDMA (wideband code division multiple access), Wi-Fi (e.g., IEEE802.11a, IEEE802.11b, IEEE802.11g and/or IEEE802.11n), Bluetooth, Wi-MAX, VoIP (voice over Internet Protocol), e-mail protocol, instant messaging and/or short message service (SMS), any proper communication protocol, or un-developed communication protocol.

The radio frequency circuit 8080 and the audio circuit 8100 are connected to the processing system via the peripheral device 8160.

The interface 8160 includes various elements to establish and maintain communications between the peripheral device and the processing system 8040.

The audio circuit 8100 is connected to an audio speaker 8500 and a microphone 8250, and includes which processes an audio signal input from the interface 8160 to provide real-time communication between users. In this embodiment, the audio circuit 8100 includes a headphone jack (now shown).

Audio and data information (e.g., at audio recognition or voice command application) input from the radio frequency circuit 8080 and the audio circuit 8100 is sent to at least one processor 8180 via the peripheral interface 8160. The at least one processor 8180 processes various data formats on at least one application program 803 stored in a media 8020.

The term "data" includes a text, a graphic, a web page, a JAVA applet, widget, an e-mail, an instant message, a voice, a digital message or video, and an MP3, which can be used by at least application program 8300 (web browser, e-mail, etc) stored in a computer-readable media 8020.

In this embodiment, the handheld electronic device 8000 uploads and downloads various data (e.g., a file, a song, a digital image, a video, an e-mail, widget, an instant message, etc.) from an internet via a wireless network or an external port 8360.

The peripheral interface 8160 connects input and output peripheral devices with the processor 8180 and the computer-readable media 8020. The at least one processor 8180 communicates with the at least one computer-readable media 8020 via the controller 8200.

The computer-readable media 8020 is any device or media which is capable of storing codes and/or data used by the at least one processor 8180. The computer-readable media 8020 includes a cache, a main memory, and a secondary memory. However, the computer-readable media 8020 is not limited thereto. The computer-readable media 8020 may include various memory layers. Herein, the memory layers are implemented using RAM (e.g., SRAM, DRAM, DDRAM), ROM, flash, magnetic and/or optical storage device (e.g., a disk drive, a magnetic tape, compact disk (CD), and digital video disk (DVD)), or a combination thereof.

The computer-readable media 8020 includes a transfer media for sending a signal including information a computer command or data. For example, the transfer media includes an internet (or called World Wide Web), an intranet, a LAN (Local Area Network), a WLAN (Wide LAN), an SAN (Storage Area Network), a MAN (Metropolitan Area Network), and the like. However, the computer-readable media 8020 includes a communication network not limited thereto.

The at least one processor 8180 executes various software components stored in the computer-readable media 8020 to perform various functions for the device 8000. In this embodiment, the software components include an operating system 8220, a communication module 8240, a contact/motion module 8260, a graphic module 8280, at least one application 8300, a timer module 8380, and a reconfigurable module 8400.

The operating system 8220 (e.g., an embedded operating system such as Darwin, RTXC, LINUX, UNIX, OS X WINDOWS or VxWork) includes a driver for controlling and managing various processes, command sets, software components and/or typical system task. Such controlling and managing include memory managing, storage device controlling, power managing, etc. The operating system 8220 accelerates communications between various hardware and software components.

The communication module 8240 accelerates communications with another device via at least one external port 8360 or the RF circuit 8080, and includes various software components for processing data input from the RF circuit 8080 and/or the external port 8360. The external port 8360 (e.g., USB, FireWire™, etc.) is connected directly to another device or indirectly thereto via a network (an internet, a wireless LAN, etc.).

The graphic module 8280 includes various and well-known software for rendering, animating and displaying a graphic object on a display of a touch sensitive display system 8120. The term "graphic object" includes any object displayed to a user such as a text, a web page, an icon, a digital image, an animation, and the like, without limiting.

The at least one application 8300 includes any application installed at the handheld electronic device 8000, which includes a browser, a directory, a contact list, an e-mail, an instant messaging, a word processing, a keyboard emulation, a widget, a JAVA supporting application, an encryption, a digital copyright management, a voice recognition, a voice copy, a position judging function (e.g., applied by GSP), a music player (playing a record music stored in at least one file such as an MP3 or AAC file), and the like, without limitation.

In this embodiment, the handheld electronic device 8000 includes an MP3 player function. The handheld electronic device 8000 includes a 36-pin connector. In this embodiment, the handheld electronic device 8000 includes at least one optical sensor (not shown) (e.g., a CMOS or CCD image sensor) used upon imaging of an application.

The contact/motion module 8260 includes various software components for performing various tasks associated with the touch sensitive display system 8120.

The timer module 8380 is a software timer used for interface reconfiguration processing. The timer module 8380 is implemented by hardware.

A reconfigurable module 8400 includes an icon effect module (or, a command set). The icon effect module 8420 includes an animation for an icon during an interface reconfiguration mode. In this embodiment, the icon effect module 8420 is included in a graphic module 8280.

The I/O sub-system 8060 is connected with a touch sensitive display system 8120 and at least one physical control device 8140 (e.g., a push button, a switch, a dial, an LED, etc.) which control and perform various functions, for example, a power control, a speaker volume control, a ring tone loudness, a keyboard input, a scrolling, a hold, a menu, a screen lock, a communication clearing, and an ending. The touch sensitive display 8120 communicates with the processing system 8040 via the touch sensitive screen controller 8320, and includes various components for processing a user input (e.g., hardware scanning). The at least one input controller 8340 transmits and receives an electric signal to and from an input device or the control device 8140. The input/control device 8140 includes a physical button (e.g., a push button, a rocker button), a dial, a slider switch, a stick, and the like.

The touch sensitive display 8120 displays a visual output to a user at a GUI. The visual output includes a text, a graphic, and a combination thereof. A part of all of the visual output corresponds to a user interface object.

The touch sensitive display 8120 receives an input from a user based on a haptic and/or tactile contact. The touch sensitive display 8120 forms a touch sensitive view receiving a user input. The touch sensitive display 8120 and the touch screen controller 8320 detects a contact (and a contact move or release) on the touch sensitive display 8120, and converts the detected contact into a mutual action with a user interface object such as at least one soft key displayed on a touch screen upon a contact. In this embodiment, a contact point between the touch sensitive display 8120 and a user corresponds to at least one digit of a user. The touch sensitive display 8120 uses a LCD (liquid crystal display) or LPD (light emitting polymer display) technique. However, in another embodiment, the touch sensitive display 8120 can use another technique.

The touch sensitive display 8120 and the touch screen controller 8320 detects a contact, a move, or a release using a plurality of touch sensitive techniques such as capacitive, resistive, infrared, and surface sound wave techniques and other components for deciding a contact point with a proximity sensor array or a touch sensitive display 8120.

The touch sensitive display 8120 is similar to a multi-touch sensitive tablet, which is incorporated by reference herein. However, a touch screen displays a visual output from a handheld device, while a touch sensitive tablet does not apply a visual output. The touch sensitive display 8120 has a resolution over 100 dpi. In this embodiment, the touch sensitive display 8120 has a resolution of about 168 dpi. A user contacts with the touch sensitive display 8120 using a thing or an appendage such as a stylus, a pen, a finger, and the like.

In this embodiment, the handheld electronic device 8000 includes a touch pad (not shown) activating or inactivating a specific function other a touch screen. In this embodiment, unlike the touch screen, a touch pad is a touch sensitive region of a device which does not display a visual output. The touch pad is an expansion of a touch sensitive view separated from the touch sensitive display 8120 or a touch sensitive view where the touch sensitive display 8120 is formed.

The handheld electronic device 8000 further includes a power system 8440 supplying a power to various hardware elements. The power system 8440 includes a power managing system, at least one power (e.g., a battery, an AC power), a charging system, a power error detecting circuit, a power converter or inverter, a power state display (e.g., a light emitting diode), and other elements associated with typical power generation, management, and distribution at a handheld device.

In this embodiment, the peripheral interface 8160, the at least one processor 8180, and the memory controller 8200 is implemented in a single chip like the processing system 8040. In another embodiment, they are implemented by separate chips.

A handheld electronic device is in detail disclosed in U.S. Pat. No. 7,509,588, the entirety of which is incorporated by reference herein.

A memory system or a storage device according to the inventive concept may be mounted in various types of packages. Examples of the packages of the memory system or the storage device according to the inventive concept may include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A nonvolatile memory device comprising:
a voltage generator circuit including a high voltage generator configured to generate a high voltage and a negative voltage generator configured to generate a negative voltage and a well voltage; and
at least one circuit including at least one switch configured to output one of the high voltage and the well voltage in response to an enable signal for applying the negative voltage to a line corresponding to a word line supplied with the negative voltage,
wherein the high voltage generator and the negative voltage generator are configured to generate voltages in response to independent oscillation clocks, respectively,
wherein the high voltage generator comprises:
a reference voltage generator for a high voltage configured to generate a reference voltage for a high voltage;
an oscillator for a high voltage configured to generate a clock for a high voltage;
at least one charge pump configured to generate a target high voltage in response to a pump clock for a high voltage; and
at least one voltage detector configured to detect the target high voltage based on the reference voltage for a high voltage and the clock for a high voltage and to generate the pump clock corresponding to the detected target high voltage,
wherein the at least one voltage detector comprises:
a power supply part for a high voltage connected between a power supply terminal and a detection node for a high voltage supplied with the target high voltage and configured to supply a power supply voltage in response to a high voltage enable signal;
a voltage dividing part for a high voltage connected between the detection node for a high voltage and a comparison node for a high voltage and configured to voltage divide the target high voltage;
a current path forming part for a high voltage connected between the comparison node for a high voltage and a ground terminal and configured to form a current path in response to the high voltage enable signal;
a comparison part for a high voltage configured to compare the reference voltage for a high voltage and a voltage of the comparison node for a high voltage and to generate the pump clock for a high voltage corresponding to the comparison; and
a control part for a high voltage configured to receive the high voltage enable signal and to activate the power supply part and the current path forming part.

2. A nonvolatile memory device comprising:
a voltage generator circuit including a high voltage generator configured to generate a high voltage and a negative voltage generator configured to generate a negative voltage and a well voltage; and
at least one circuit including at least one switch configured to output one of the high voltage and the well voltage in response to an enable signal for applying the negative voltage to a line corresponding to a word line supplied with the negative voltage,
wherein the high voltage generator and the negative voltage generator are configured to generate voltages in response to independent oscillation clocks, respectively,
wherein the high voltage generator comprises:
a reference voltage generator for a high voltage configured to generate a reference voltage for a high voltage;
an oscillator for a high voltage configured to generate a clock for a high voltage;
at least one charge pump configured to generate a target high voltage in response to a pump clock for a high voltage; and
at least one voltage detector configured to detect the target high voltage based on the reference voltage for a high voltage and the clock for a high voltage and to generate the pump clock corresponding to the detected target high voltage,
wherein the voltage generator circuit further comprises a low voltage generator which includes:
a power supply part configured to supply a pump voltage for a peri-voltage according to a comparison result between a voltage of a comparison node for a low voltage and a reference voltage for a low voltage;
a voltage dividing part for a low voltage connected between the comparison node for a low voltage and an output node for a low voltage outputting the peri-voltage and configured to voltage divide the pump voltage for a peri-voltage;
a bias part connected between the comparison node for a low voltage and the ground terminal; and
a comparison part for a low voltage configured to compare a voltage of the comparison node for a low voltage and the reference voltage for a low voltage.

3. A nonvolatile memory device comprising:
a voltage generator circuit including a high voltage generator configured to generate a high voltage and a negative voltage generator configured to generate a negative voltage and a well voltage; and
at least one circuit including at least one switch configured to output one of the high voltage and the well voltage in response to an enable signal for applying the negative voltage to a line corresponding to a word line supplied with the negative voltage,
wherein the high voltage generator and the negative voltage generator are configured to generate voltages in response to independent oscillation clocks, respectively, and
wherein the negative voltage generator comprises:
a direct current voltage generator configured to generate a direct current voltage;
a reference voltage generator configured to generate a reference voltage;
an oscillator configured to generate an oscillation clock;
a charge pump configured to generate the negative voltage in response to a pump clock;
a voltage detector configured to detect the negative voltage based on the direct current voltage, the reference voltage, and the oscillation clock and to generate the pump clock corresponding thereto; and
a word line negative voltage generator configured to receive thee direct current voltage, the reference voltage, and the oscillation clock and to generate a negative word line voltage corresponding to the negative voltage.

4. A nonvolatile memory device comprising:
a voltage generator circuit including a high voltage generator configured to generate a high voltage and a negative voltage generator configured to generate a negative voltage and a well voltage; and
at least one circuit including at least one switch configured to output one of the high voltage and the well voltage in response to an enable signal for applying the negative voltage to a line corresponding to a word line supplied with the negative voltage,
wherein the high voltage generator and the negative voltage generator are configured to generate voltages in response to independent oscillation clocks, respectively, and
wherein the voltage generator circuit further comprises a low voltage generator, and wherein the at least one circuit comprises:
a read verification voltage selecting switch circuit configured to select one of a peri-voltage generated by the low voltage generator and a negative voltage generated by the negative voltage generator as a read verification voltage.

5. The nonvolatile memory device of claim 4, wherein the high voltage generator comprises:
a reference voltage generator for a high voltage configured to generate a reference voltage for a high voltage;
an oscillator for a high voltage configured to generate a clock for a high voltage;
at least one charge pump configured to generate a target high voltage in response to a pump clock for a high voltage; and
at least one voltage detector configured to detect the target high voltage based on the reference voltage for a high voltage and the clock for a high voltage and to generate the pump clock corresponding to the detected target high voltage.

6. The nonvolatile memory device of claim 4, wherein the at least one circuit further comprises:
a word line voltage selecting switch circuit configured to select one of a program voltage generated by the high voltage generator and the read verification voltage selected by the read verification selecting switch circuit as a word line voltage of a selected word line.

7. The nonvolatile memory device of claim 6, wherein the nonvolatile memory device performs a 2-step verification operation during a program operation.

8. The nonvolatile memory device of claim 6, further comprising:
at least one selection line driver circuit configured to provide a corresponding selection line with one of a read pass voltage or a pass voltage output from the high voltage generator and the word line voltage selected by the word line voltage selecting switch circuit.

9. The nonvolatile memory device of claim 8, further comprising a first row decoder and a second row decoder, the first row decoder formed at a first well and driving corresponding word lines with voltages applied to first selection lines, and the second row decoder formed at a second well and driving corresponding word lines with voltages applied to second selection lines.

10. The nonvolatile memory device of claim 9, wherein the at least one switch circuit comprises a selection line selecting switch circuit configured to select whether a plurality of selection lines of the selection line driver is connected to the first selection lines or the second selection lines.

11. The nonvolatile memory device of claim 9, wherein the at least one switch circuit comprises a well voltage selecting switch circuit configured to select whether the well voltage is applied to the first well or the second well.

12. A nonvolatile memory device comprising:
a voltage generator circuit including a high voltage generator configured to generate a high voltage and a negative voltage generator configured to generate a negative voltage and a well voltage; and
at least one circuit including at least one switch configured to output one of the high voltage and the well voltage in response to an enable signal for applying the negative voltage to a line corresponding to a word line supplied with the negative voltage,
wherein the high voltage generator and the negative voltage generator are configured to generate voltages in response to independent oscillation clocks, respectively, and
wherein the nonvolatile memory device has a threshold voltage distribution for storing 2-bit data, the threshold voltage distribution including one erase state and three program states, and at least one of the program states being verified by a negative voltage.

13. The nonvolatile memory device of claim 12, wherein a lower threshold voltage limit of the erase state is −4V.

14. A row decoder comprising:
a block word line;
a pull-up circuit configured to apply a high voltage to the block word line in response to a voltage transfer enable signal;
a pull-down circuit configured to be shut off from the block word line in response to the voltage transfer enable signal, and to apply a well voltage to the block word line in response to an inverted voltage transfer enable signal which is inverted relative to the voltage transfer enable signal; and
a voltage transfer circuit configured to connect a plurality of selection lines with a plurality of word lines based on a voltage of the block word line,
wherein each of the pull-up circuit and the pull-down circuit is formed of at least one n-type active region formed within a p-type well and the p-type well is included within a deep n-type well.

15. The row decoder of claim 14, wherein the pull-down circuit comprises:
a depletion transistor connected between the block word line and a blocking node and having a gate connected with a power supply terminal; and
a level shifter connected at the blocking node and a well voltage terminal supplied with the well voltage and configured to apply a voltage of the power supply terminal to the blocking node in response to the voltage transfer enable signal and to apply the well voltage to the block node in response to the inverted version voltage transfer enable signal,
wherein when a negative voltage is applied to a word line, the well voltage is the negative voltage.

16. The row decoder of claim 15, wherein the level shifter comprises:
at least one PMOS transistor configured to apply a voltage of the power supply terminal to the blocking node in response to the voltage transfer enable signal; and
at least one NMOS transistor configured to apply a voltage of the well voltage terminal to the blocking node in response to the voltage transfer enable signal,
wherein wells of the depletion transistor and the at least one NMOS transistor are connected with the well voltage terminal.

17. The row decoder of claim 16, wherein the at least one NMOS transistor is a high voltage transistor.

18. The row decoder of claim 16, wherein the at least one NMOS transistor is a low voltage transistor.

19. The row decoder of claim 16, wherein the at least one PMOS transistor is a high voltage transistor, and the at least one NMOS transistor is a high voltage transistor.

20. A nonvolatile memory device comprising:
at least one first voltage applying pass circuit configured to apply a positive voltage to a first line; and
at least one second voltage applying pass circuit configured to apply a negative voltage to a second line,
wherein when the negative voltage is applied to the second line, the negative voltage is applied to a well in which the at least one second voltage applying pass circuit is formed,
wherein the at least one second voltage applying pass circuit comprises:
a selection transistor connected between a line supplied with the negative voltage and the second line; and
a selection switch configured to apply a high voltage or a well voltage to a gate of the selection transistor in response to an enable signal,
wherein when the negative voltage is applied to the second line, the well voltage is the negative voltage.

21. The nonvolatile memory device of claim 20, wherein the selection switch comprises:
a pull-up circuit configured to apply the high voltage to the gate of the selection transistor in response to the enable signal; and
a pull-down circuit configured to be shut off from the gate of the selection transistor in response to the enable signal and to apply the well voltage to the gate of the selection transistor in response to an inverted enable signal which is inverted relative to the enable signal.

22. The nonvolatile memory device of claim 21, wherein the pull-down circuit comprises:
a depletion transistor connected between the gate of the selection transistor and a blocking node and having a gate connected with a power supply node; and
a level shifter connected between a well voltage terminal supplied with the well voltage and the blocking node, and configured to apply a voltage of the power supply terminal to the blocking node in response to the enable signal and to apply the well voltage to the blocking node in response to the enable signal.

23. A memory system comprising:
a nonvolatile memory device; and
a memory controller configured to control the nonvolatile memory device,
wherein the nonvolatile memory device comprises:
a negative voltage generator configured to generator a negative voltage; and
at least one row decoder,
wherein the at least one row decoder comprises a pull-up circuit configured to apply a high voltage to a block word line in response to a voltage transfer enable signal, and a pull-down circuit configured to be shut off from the block word line in response to the voltage transfer enable signal and to apply a well voltage to the block word line in response to an inverted voltage transfer enable signal which is inverted relative to the voltage transfer enable signal, and
wherein each of the pull-up circuit and the pull-down circuit is formed of at least one n-type active region formed within a p-type well and the p-type well is included within a deep n-type well, and
wherein when the negative voltage is supplied to at least one word line, the well voltage is the negative voltage.

* * * * *